(12) United States Patent
Taniguchi et al.

(10) Patent No.: US 11,614,688 B2
(45) Date of Patent: *Mar. 28, 2023

(54) RESIST COMPOSITION AND PATTERNING PROCESS

(71) Applicant: SHIN-ETSU CHEMICAL CO., LTD., Tokyo (JP)

(72) Inventors: Ryosuke Taniguchi, Joetsu (JP); Satoshi Watanabe, Joetsu (JP); Takayuki Fujiwara, Joetsu (JP); Naoya Inoue, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 351 days.

This patent is subject to a terminal disclaimer.

(21) Appl. No.: 16/799,129

(22) Filed: Feb. 24, 2020

(65) Prior Publication Data

US 2020/0301275 A1   Sep. 24, 2020

(30) Foreign Application Priority Data

Mar. 22, 2019   (JP) ............................. JP2019-54552

(51) Int. Cl.
*G03F 7/038* (2006.01)
*G03F 7/004* (2006.01)
(Continued)

(52) U.S. Cl.
CPC .......... *G03F 7/0382* (2013.01); *C08F 212/24* (2020.02); *C08F 220/281* (2020.02); *G03F 7/0045* (2013.01); *G03F 7/0046* (2013.01); *G03F 7/162* (2013.01); *G03F 7/168* (2013.01); *G03F 7/2004* (2013.01);
(Continued)

(58) Field of Classification Search
CPC .... G03F 7/0382; G03F 7/0045; G03F 7/0046; G03F 7/2004
See application file for complete search history.

(56) References Cited

U.S. PATENT DOCUMENTS

| | | |
|---|---|---|
| 2008/0118860 A1 | 5/2008 | Harada et al. |
| 2008/0153030 A1 | 6/2008 | Kobayashi et al. |
| 2008/0241736 A1 | 10/2008 | Kobayashi et al. |
| 2013/0209922 A1 | 8/2013 | Masunaga et al. |
| 2017/0369616 A1 | 12/2017 | Hatakeyama et al. |
| 2018/0180998 A1 | 6/2018 | Kotake et al. |

(Continued)

FOREIGN PATENT DOCUMENTS

| | | | |
|---|---|---|---|
| JP | 2004-115630 A | 4/2004 | |
| JP | 3790649 B2 | 6/2006 | |

(Continued)

OTHER PUBLICATIONS

Oct. 19, 2021 Office Action issued in Korean Patent Application No. 10-2020-0034399.

*Primary Examiner* — Daborah Chacko-Davis
(74) *Attorney, Agent, or Firm* — Oliff PLC

(57) ABSTRACT

A chemically-amplified negative resist composition includes: (A) an acid generator containing an onium salt (s) shown by the following formula(e) (A-1) and/or (A-2); and (B) a base polymer containing repeating units shown by the following formulae (B1) and (B2). Thus, the present invention provides: a chemically-amplified negative resist composition which provides a pattern with high sensitivity, low LWR and CDU, and favorable profile; and a resist patterning process using the composition.

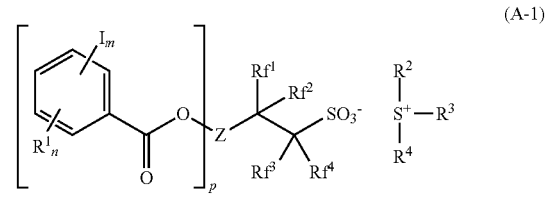

(A-1)

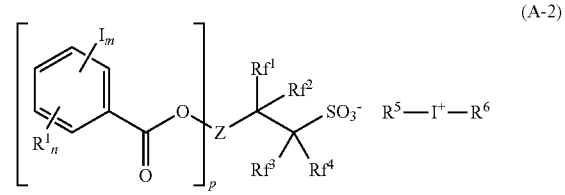

(A-2)

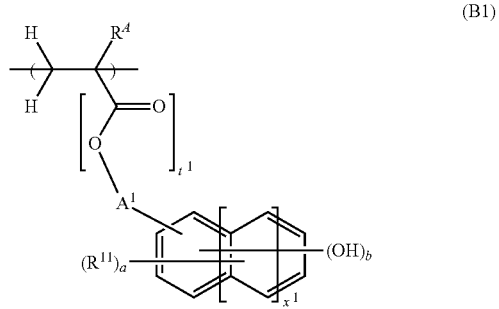

(B1)

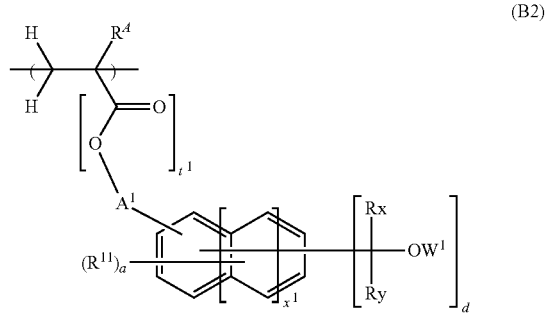

(B2)

20 Claims, 1 Drawing Sheet

(51) Int. Cl.
  *C08F 212/14*   (2006.01)
  *C08F 220/28*   (2006.01)
  *G03F 7/32*   (2006.01)
  *G03F 7/16*   (2006.01)
  *G03F 7/20*   (2006.01)
  *G03F 7/38*   (2006.01)

(52) U.S. Cl.
  CPC ............ *G03F 7/2037* (2013.01); *G03F 7/322* (2013.01); *G03F 7/38* (2013.01)

(56)  References Cited

U.S. PATENT DOCUMENTS

2018/0335696 A1    11/2018   Hatakeyama et al.
2020/0301274 A1*    9/2020   Taniguchi ............... C08L 45/00

FOREIGN PATENT DOCUMENTS

| | | |
|---|---|---|
| JP | 2008-111103 A | 5/2008 |
| JP | 2008-158339 A | 7/2008 |
| JP | 2008-239918 A | 10/2008 |
| JP | 2013-164588 A | 8/2013 |
| JP | 2018-197853 A | 12/2018 |
| KR | 10-2018-0002022 A | 1/2018 |
| KR | 10-2018-0077073 A | 7/2018 |

\* cited by examiner

[FIG. 1]
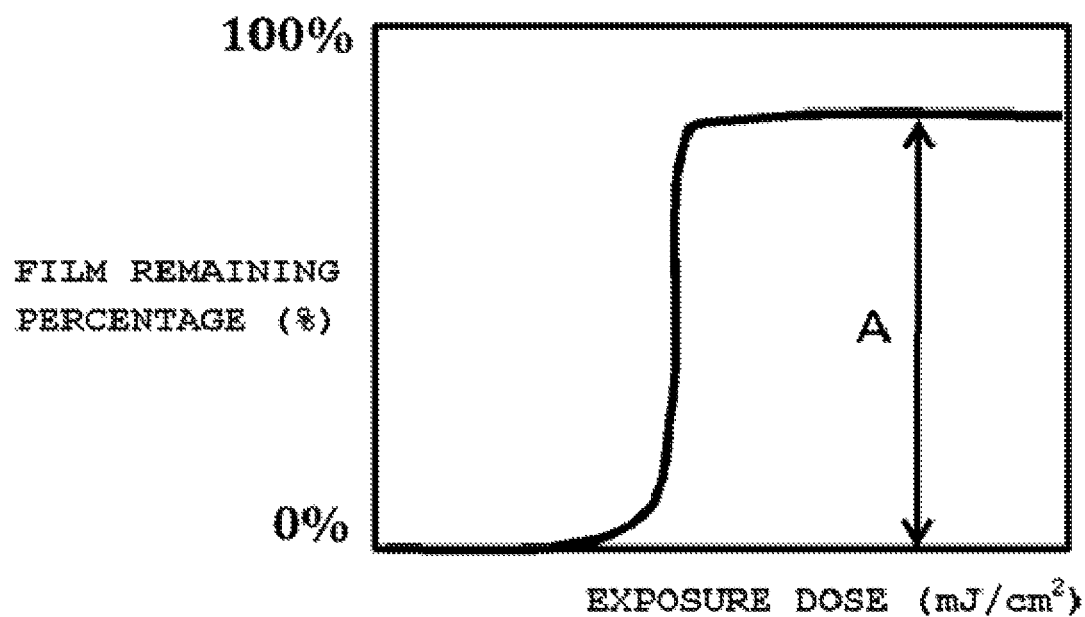

RESIST COMPOSITION AND PATTERNING PROCESS

TECHNICAL FIELD

The present invention relates to a chemically-amplified negative resist composition and a resist patterning process using the composition.

BACKGROUND ART

As LSIs advance toward higher integration and higher processing speed, miniaturization of pattern rule is progressing rapidly. Especially, the expansion of flash memory market and the increase in memory capacity lead this miniaturization. As a cutting-edge technology for miniaturization, 65-nm node devices have been mass-produced by ArF lithography, and mass-production of next-generation 45-nm node by ArF immersion lithography is under preparation. For next-generation 32-nm node, there is immersion lithography with a super high NA lens using a combination of a liquid having a higher refractive index than water, a high refractive index lens, and a high refractive index resist material. Recently, to obtain finer patterns, studies have been conducted of resist materials for light with short wavelength such as electron beam (EB) and extreme ultraviolet ray (EUV).

As pattern size is reduced, the edge roughness (or line width roughness: LWR) of line patterns and the critical dimension uniformity (CDU) of hole patterns and dot patterns are regarded as important properties. It is pointed out that these properties are possibly influenced by localization and agglomeration of a base polymer and an acid generator and by the acid diffusion. Further, as thinner resist films are formed, the LWR and CDU tend to increase. The film thickness reduction due to the progress in miniaturization causes LWR and CDU degradations, resulting in serious problems.

Regarding EUV resist, high sensitivity, high resolution and low LWR have to be achieved at the same time. Shortening the acid diffusion distance reduces not only LWR but also sensitivity. For example, decreasing the post exposure bake (PEB) temperature reduces LWR, but results in lower sensitivity. When a quencher is added in a larger amount, LWR is reduced, but the sensitivity is lowered, too. It is necessary to overcome the tradeoff relation between sensitivity and LWR (Patent Document 1).

Meanwhile, resist compositions used in photolithography include: positive type in which an exposed portion is dissolved to form a pattern; and negative type in which an exposed portion is left to form a pattern. Among these, one which is easy to use is selected depending on a required resist pattern. When a dot pattern is to be formed, if alkali development is employed on a positive resist composition, a bright mask needs to be used. In this case, there is such a disadvantage that a large area is irradiated with high-energy electron beam or EUV light, degrading the mask. For this reason, a dark mask with small exposure area is used. In this case, a negative resist whose exposed portion is insolubilized with respect to an alkaline developer is essential (Patent Document 2).

Meanwhile, in a negative resist to which an alkaline developer is applied, an acid is generated from an exposed portion, and a base polymer is insolubilized by the action of this acid. The acid generated from the exposed portion has such a high affinity to an alkaline developer that the exposed portion is dissolved during development, causing top loss in the pattern and thereby LWR and CDU degradation problems. Moreover, the acid diffusion is not sufficiently controlled. Due to the acid diffusion from the exposed portion to an unexposed portion, the insolubilization becomes insufficient. This results in problems that the durability to alkali development is not enough and hence a profile with top loss is similarly formed, and that an unexposed portion, which should be dissolved originally, remains as scum due to lowered solubility in alkali.

CITATION LIST

Patent Literature

Patent Document 1: Japanese Unexamined Patent Application Publication No. 2018-197853
Patent Document 2: Japanese Unexamined Patent Application Publication No. 2013-164588

SUMMARY OF INVENTION

Technical Problem

Hence, there have been demands for the development of, among chemically-amplified resists that use an acid as a catalyst, a negative type resist capable of exhibiting high sensitivity, low LWR of a line-and-space pattern (L/S pattern), and low CDU of a dot pattern, and capable of forming a favorable shape with little top loss.

The present invention has been made in view of the above-described circumstances. An object of the present invention is to provide: a chemically-amplified negative resist composition which provides a pattern with high sensitivity, low LWR and CDU, and favorable profile; and a resist patterning process using the composition.

Solution to Problem

To achieve the above object, the present invention provides a chemically-amplified negative resist composition comprising:
(A) an acid generator containing an onium salt (s) shown by the following formula(e) (A-1) and/or (A-2); and
(B) a base polymer containing repeating units shown by the following formulae (B1) and (B2),

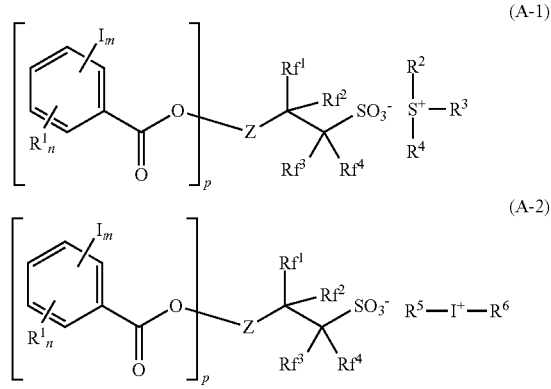

wherein $R^1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, —NR$^7$—C(=O)—R$^8$, or —NR$^7$—C(=O)—O—R$^8$; R$^7$ represents a hydrogen atom or a linear, branched, or cyclic alkyl group having 1 to 6 carbon atoms optionally containing a halogen atom, a hydroxy group, an alkoxy group, an acyl group, or an acyloxy group; R$^8$ represents a linear, branched, or cyclic alkyl group having 1 to 16 carbon atoms or alkenyl group having 2 to 16 carbon atoms, an aryl group having 6 to 12 carbon atoms, or an aralkyl group having 7 to 12 carbon atoms, and optionally contains a halogen atom, a hydroxy group, an alkoxy group, an acyl group, or an acyloxy group; Z represents a single bond or a divalent linking group having 1 to 20 carbon atoms when "p" is 1, or a trivalent or tetravalent linking group having 1 to 20 carbon atoms when "p" is 2 or 3, the linking groups optionally containing an oxygen atom, a sulfur atom, or a nitrogen atom; Rf$^1$ to Rf$^4$ each independently represent a hydrogen atom, a fluorine atom, or a trifluoromethyl group, at least one of Rf$^1$ to Rf$^4$ is a fluorine atom or a trifluoromethyl group, and Rf$^1$ and Rf$^2$ optionally bond with each other to form a carbonyl group; R$^2$, R$^3$, R$^4$, R$^5$ and R$^6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, and carbon atoms of these groups are optionally interposed by an ether group, an ester group, a carbonyl group, a carbonate group, or a sulfonic acid ester group; R$^2$ and R$^3$ optionally bond with each other to form a ring with a sulfur atom bonded to R$^2$ and R$^3$; "m" represents an integer of 1 to 5; "n" represents an integer of 0 to 3; and "p" represents an integer of 1 to 3,

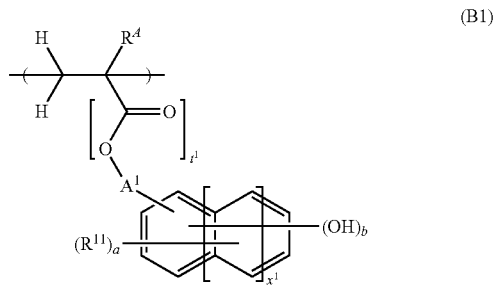

(B1)

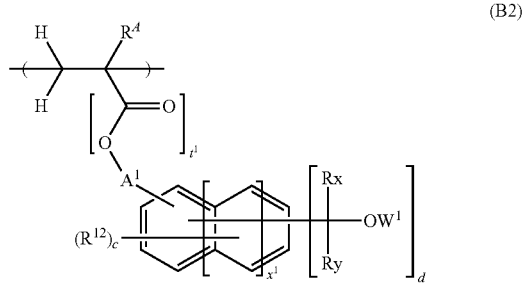

(B2)

wherein R$^A$ represents a hydrogen atom, a fluorine atom, a methyl group, or a trifluoromethyl group; R$^{11}$ and R$^{12}$ each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted; A$^1$ represents a single bond or a linear, branched, or cyclic alkylene group having 1 to 10 carbon atoms and optionally having an ether bond interposed in a carbon-carbon bond; W$^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond; Rx and Ry each independently represent a hydrogen atom, an alkyl group having 1 to 15 carbon atoms optionally substituted with a hydroxy group or an alkoxy group, or a monovalent aromatic group optionally having a substituent, given that not both of Rx and Ry are hydrogen atoms simultaneously, and Rx and Ry optionally bond with each other to form a ring with a carbon atom bonded to Rx and Ry; t$^1$ represents 0 or 1; x$^1$ represents an integer of 0 to 2; "a" represents an integer satisfying 0≤a≤5+2x$^1$−b; "c" represents an integer satisfying 0≤c≤5+2x$^1$−d; and "b" and "d" each represent an integer of 1 to 3.

The inventive chemically-amplified negative resist composition makes it possible to provide a chemically-amplified negative resist composition which provides a pattern with high sensitivity, low LWR and CDU, and favorable profile.

Moreover, the present invention provides the chemically-amplified negative resist composition, wherein the base polymer further contains at least one repeating unit selected from a repeating unit shown by the following formula (B3) and a repeating unit shown by the following formula (B4):

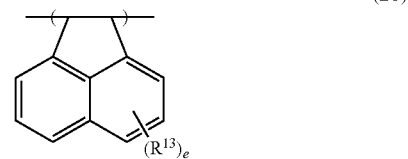

(B3)

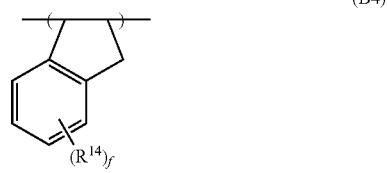

(B4)

wherein R$^{13}$ and R$^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted; and "e" and "f" each independently represent an integer of 0 to 4.

Such a chemically-amplified negative resist composition demonstrates not only the etching durability attributable to the aromatic ring, but also an effect of improving the durability to electron beam irradiation in etching and pattern inspection because the cyclic structure is added to the main chain.

In the present invention, the base polymer preferably contains a repeating unit shown by the following formula (B5) and a repeating unit shown by the following formula (B6):

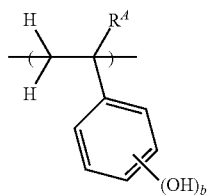

(B5)

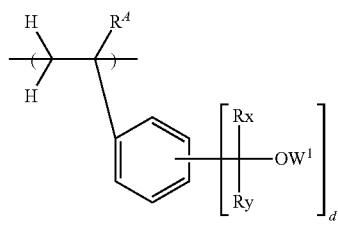

(B6)

wherein $R^A$, Rx, Ry, $W^1$, "b", and "d" are as defined above.

In such a chemically-amplified negative resist composition, the repeating unit B5 acts to further improve the etching durability and also improve the adhesion to a substrate and the solubility to an alkaline developer. In addition, the repeating unit B6 acts to enable the negative reaction (insolubilization) to more efficiently progress. Accordingly, the resolution can be further improved.

The chemically-amplified negative resist composition can further comprise (C) a crosslinking agent.

With the inventive chemically-amplified negative resist composition, the dissolution rate of an exposed portion is further reduced, so that a pattern with particularly low LWR and CDU and favorable profile can be obtained.

Moreover, the present invention provides a resist patterning process using the above-described chemically-amplified negative resist composition, comprising steps of:

forming a resist film by using the inventive chemically-amplified negative resist composition on a substrate to be processed;

irradiating the resist film with a high energy beam to form a pattern; and developing the resist film by using an alkaline developer.

The inventive resist patterning process makes it possible to form a resist pattern with high sensitivity, low LWR and CDU, and favorable profile.

In this event, the high energy beam is preferably an electron beam or an extreme ultraviolet ray with a wavelength of 3 to 15 nm.

The inventive resist composition is suitable for fine patterning particularly with electron beam (EB) and extreme ultraviolet ray (EUV) among high energy beams, and can form a resist pattern having lower LWR and CDU and favorable profile.

Advantageous Effects of Invention

The base polymer constituting the inventive chemically-amplified negative resist composition is high in dissolution contrast and excellent in ability to insolubilize its exposed portion. Meanwhile, the sulfonium salt or iodonium salt of iodinated benzoyloxy group-containing fluorinated sulfonic acid (fluorosulfonic acid) has high molecular weight due to iodine, so that it is characterized in that the acid diffusion is small. Further, since iodine considerably absorbs EUV at a wavelength of 13.5 nm, secondary electrons are generated from iodine during exposure, and high sensitivity is achieved. These make it possible to construct a resist with high sensitivity, low LWR, and low CDU. Furthermore, iodine atoms lower the solubility to an alkaline developer, so that a negative pattern formed using the inventive negative resist composition is less dissolved in an alkaline developer than negative patterns formed using conventional negative resist compositions are. Accordingly, a pattern with little top loss and favorable profile can be formed.

BRIEF DESCRIPTION OF DRAWING

FIG. 1 is a graph showing a relation between exposure dose and film remaining percentage.

DESCRIPTION OF EMBODIMENTS

The present inventors have earnestly studied to achieve the above object and consequently found that when an acid generator containing a sulfonium salt or iodonium salt of a certain iodinated benzoyloxy group-containing fluorinated sulfonic acid is combined with a specific base polymer, it is possible to obtain a negative resist composition which exhibits high sensitivity, little top loss, and low LWR and CDU. This finding has led to the completion of the present invention.

Specifically, the present invention is a chemically-amplified negative resist composition comprising:

(A) an acid generator containing an onium salt(s) shown by (A-1) and/or (A-2) to be described below, and (B) a base polymer containing repeating units shown by (B1) and (B2) to be described below.

Hereinafter, the present invention will be described in detail, but the present invention is not limited thereto.

[Chemically-Amplified Negative Resist Composition]

The inventive chemically-amplified negative resist composition is characterized by including essential components of:

(A) an acid generator containing a sulfonium salt or iodonium salt of an iodinated benzoyloxy group-containing fluorinated sulfonic acid shown by the following formula(e) (A-1) and/or (A-2); and (B) a base polymer containing repeating units shown by the following formulae (B1) and (B2). Further, the inventive chemically-amplified negative resist composition can contain, as necessary, optional components such as a crosslinking agent, a quencher, an organic solvent, and a surfactant, other than the essential components. Hereinbelow, these components will be described in detail.

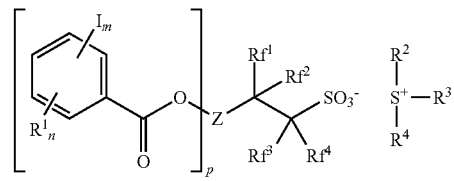

(A-1)

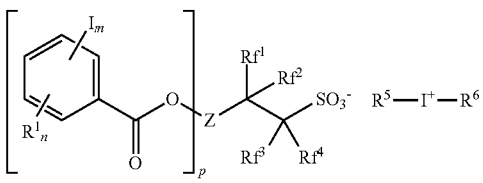
(A-2)

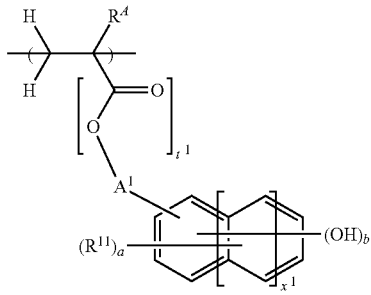
(B1)

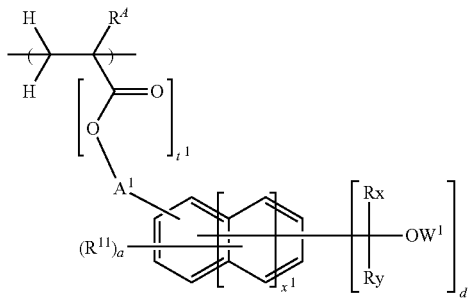
(B2)

[(A) Sulfonium Salt and Iodonium Salt of Iodinated Benzoyloxy Group-Containing Fluorinated Sulfonic Acid]

The component (A) is an acid generator containing an onium salt(s) (a sulfonium salt and/or iodonium salt of an iodinated benzoyloxy group-containing fluorinated sulfonic acid) shown by the following formula(e) (A-1) and/or (A-2).

The component (A) may be one or both of the onium salt shown by the formula (A-1) and the onium salt shown by the formula (A-2):

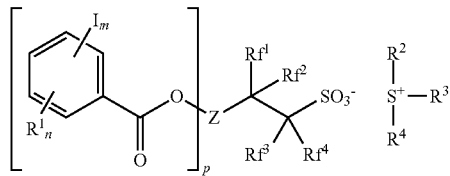
(A-1)

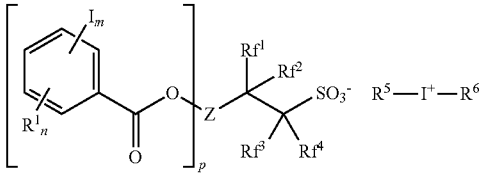
(A-2)

where $R^1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, $-NR^7-C(=O)-R^8$, or $-NR^7-C(=O)-O-R^8$; $R^7$ represents a hydrogen atom or a linear, branched, or cyclic alkyl group having 1 to 6 carbon atoms optionally containing a halogen atom, a hydroxy group, an alkoxy group, an acyl group, or an acyloxy group; $R^8$ represents a linear, branched, or cyclic alkyl group having 1 to 16 carbon atoms or alkenyl group having 2 to 16 carbon atoms, an aryl group having 6 to 12 carbon atoms, or an aralkyl group having 7 to 12 carbon atoms, and optionally contains a halogen atom, a hydroxy group, an alkoxy group, an acyl group, or an acyloxy group; Z represents a single bond or a divalent linking group having 1 to 20 carbon atoms when "p" is 1, or a trivalent or tetravalent linking group having 1 to 20 carbon atoms when "p" is 2 or 3, the linking groups optionally containing an oxygen atom, a sulfur atom, or a nitrogen atom; $Rf^1$ to $Rf^4$ each independently represent a hydrogen atom, a fluorine atom, or a trifluoromethyl group, at least one of $Rf^1$ to $Rf^4$ is a fluorine atom or a trifluoromethyl group, and $Rf^1$ and $Rf^2$ optionally bond with each other to form a carbonyl group; $R^2$, $R^3$, $R^4$, $R^5$ and $R^6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, and carbon atoms of these groups are optionally interposed by an ether group, an ester group, a carbonyl group, a carbonate group, or a sulfonic acid ester group; $R^2$ and $R^3$ optionally bond with each other to form a ring with a sulfur atom bonded to $R^2$ and $R^3$; "m" represents an integer of 1 to 5; "n" represents an integer of 0 to 3; and "p" represents an integer of 1 to 3.

In the above formulae, $R^1$ is any of: a hydrogen atom, a fluorine atom, a chlorine atom, a bromine atom, a hydroxy group, an amino group; a linear, branched, or cyclic alkyl group having 1 to 20 carbon atoms optionally containing a fluorine atom, a chlorine atom, a bromine atom, a hydroxy group, an amino group, or an alkoxy group; an alkoxy group having 1 to 20 carbon atoms; an acyloxy group having 2 to 20 carbon atoms; $-NR^7-C(=O)-R^8$; and $-NR^7-C(=O)-O-R^8$. Here, $R^7$ is a hydrogen atom, or a linear, branched, or cyclic alkyl group having 1 to 6 carbon atoms optionally containing a halogen atom, a hydroxy group, an alkoxy group, an acyl group, or an acyloxy group. $R^8$ is a linear, branched, or cyclic alkyl group having 1 to 16 carbon atoms or alkenyl group having 2 to 16 carbon atoms, an aryl group having 6 to 12 carbon atoms, or an aralkyl group having 7 to 12 carbon atoms, and may contain a halogen atom, a hydroxy group, an alkoxy group, an acyl group, or an acyloxy group.

Preferable examples of hydrocarbon portions of the alkyl group, the alkoxy group, and the acyloxy group at $R^1$ include a methyl group, an ethyl group, a propyl group, an isopropyl group, an n-butyl group, a sec-butyl group, a tert-butyl group, an n-pentyl group, a tert-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, an adamantyl group, and the like.

Preferable examples of hydrocarbon portions of the alkyl group, the alkoxy group, the acyl group, and the acyloxy group at $R^7$ and hydrocarbon portions of the alkyl group, the alkoxy group, the acyl group, and the acyloxy group at $R^8$ include the aforementioned hydrocarbon groups having corresponding carbon atoms.

Preferable examples of the alkenyl group, the aryl group, and the aralkyl group at $R^8$ include a vinyl group, an allyl group, a butenyl group, a phenyl group, a naphthyl group, an anthracenyl group, a benzyl group, a phenethyl group, a phenylpropyl group, a diphenylmethyl group, a tolyl group, a xylyl group, and the like.

Z is a single bond or a divalent linking group having 1 to 20 carbon atoms when "p" is 1, or a trivalent or tetravalent linking group having 1 to 20 carbon atoms when "p" is 2 or 3. The linking groups may contain an oxygen atom, a sulfur atom, or a nitrogen atom.

Examples of the linking group represented by Z include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic divalent hydrocarbon groups such as a cyclopentanediyl group, a cyclohexanediyl group, a norbornanediyl group, and an adamantanediyl group; unsaturated cyclic divalent hydrocarbon groups such as a phenylene group and a naphthylene group; and the like. Some of hydrogen atoms of these groups may be substituted with an alkyl group such as a methyl group, an ethyl group, a propyl group, an n-butyl group, or a tert-butyl group. The groups may have some of hydrogen atoms substituted with a group containing a heteroatom such as an oxygen atom, a sulfur atom, a nitrogen atom, or a halogen atom. Alternatively, the groups may have some of carbon atoms substituted with a group containing a heteroatom such as an oxygen atom, a sulfur atom, or a nitrogen atom. As a result, the linking group represented by Z may contain a hydroxy group, a cyano group, a carbonyl group, an ether group, an ester group, a sulfonic acid ester group, a carbonate group, a lactone ring, a sultone ring, carboxylic anhydride, a haloalkyl group, or the like.

$Rf^1$ to $Rf^4$ are each independently a hydrogen atom, a fluorine atom, or a trifluoromethyl group, but at least one of $Rf^1$ to $Rf^4$ is a fluorine atom or a trifluoromethyl group, and $Rf^1$ and $Rf^2$ may be unified with the carbon atom bonded thereto to form a carbonyl group.

$R^2$, $R^3$, $R^4$, $R^5$ and $R^6$ are each independently a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms. These groups may have some or all of hydrogen atoms substituted with a hydroxy group, a carboxyl group, a halogen atom, a cyano group, an amide group, a nitro group, a sultone group, a sulfone group, or a sulfonium salt-containing group, and may have carbon atoms interposed by an ether group, an ester group, a carbonyl group, a carbonate group, or a sulfonic acid ester group. Additionally, $R^2$ and $R^3$ may bond with each other to form a ring with a sulfur atom bonded to $R^2$ and $R^3$.

Examples of hydrocarbon portions of the alkyl group, the oxoalkyl group, the alkenyl group, the oxoalkenyl group, the aryl group, the aralkyl group, and the aryloxoalkyl group at $R^2$, $R^3$, $R^4$, $R^5$ and $R^6$ include those aforementioned for $R^1$ and $R^8$.

"m" is an integer of 1 to 5. "n" is an integer of 0 to 3. "p" is an integer of 1 to 3.

Preferably, "m" is an integer of 1 to 3, "n" is an integer of 0 to 2, and "p" is an integer of 1 or 2.

The onium salt (sulfonium salt or iodonium salt of iodinated benzoyloxy group-containing fluorinated sulfonic acid) shown by the formula (A-1) or (A-2) has high molecular weight due to iodine, and hence has a characteristic of small acid diffusion. Further, since iodine greatly absorbs EUV with a wavelength of 13.5 nm, secondary electrons are generated from iodine during exposure, thereby leading to high sensitivity. Furthermore, iodine atoms lower the solubility to an alkaline developer.

Since the component (A) (acid generator) contains an onium salt having the characteristics as described above, the use of the inventive chemically-amplified negative resist composition enables construction of a resist having high sensitivity, low LWR, and low CDU. Further, the negative pattern formed using the inventive negative resist composition is less dissolved in an alkaline developer than negative patterns formed using conventional negative resist compositions are. Consequently, a favorable pattern profile with little top loss can be formed.

Note that the component (A) (acid generator) may be either or both of the onium salt shown by the formula (A-1) and the onium salt shown by the formula (A-2).

Examples of anion moieties of the sulfonium salt shown by the formula (A-1) and the iodonium salt shown by the formula (A-2) include ones shown below, but are not limited thereto.

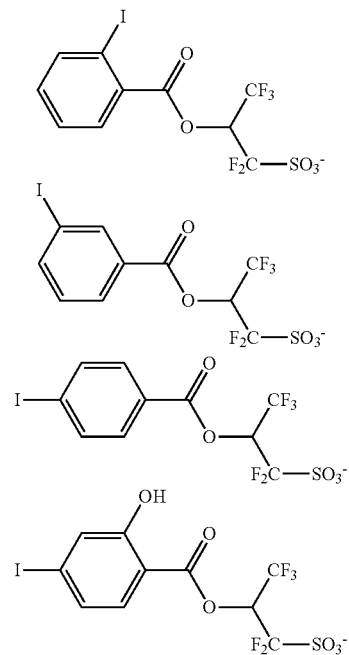

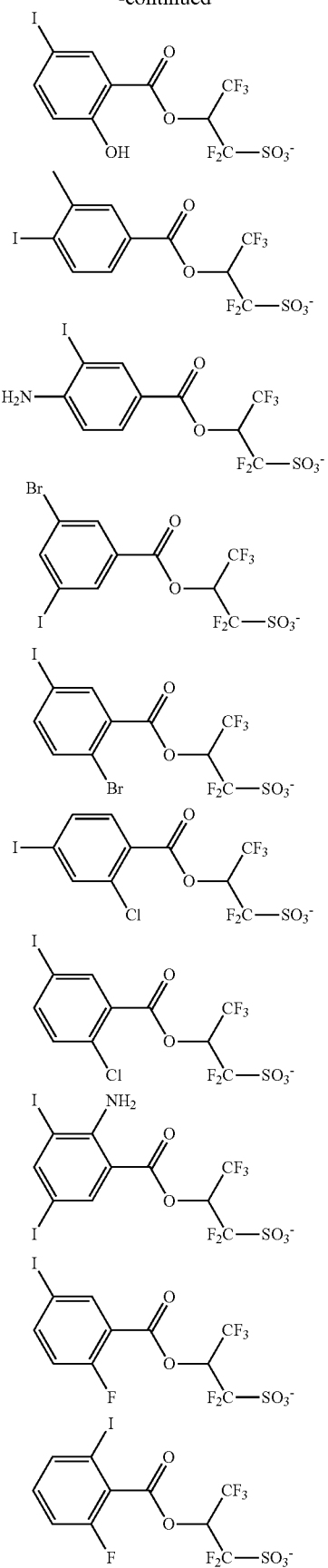
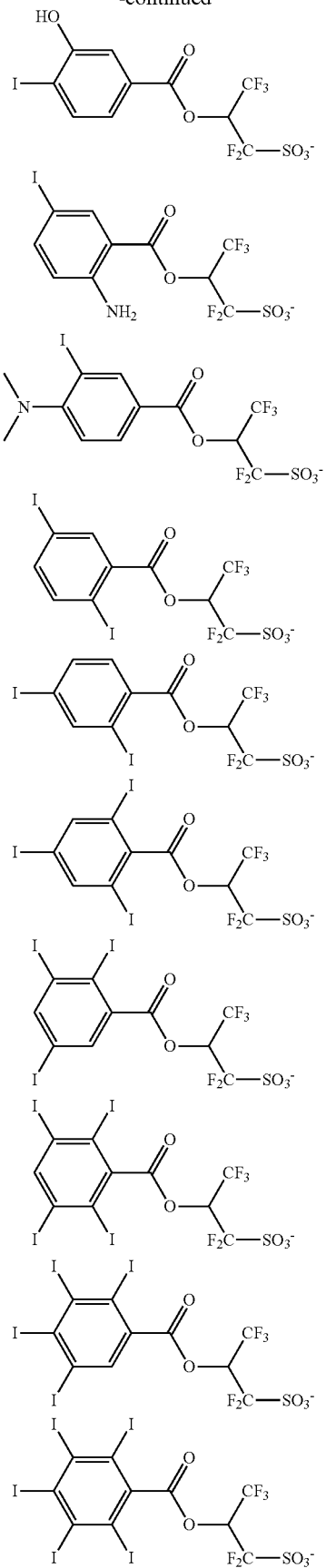

-continued
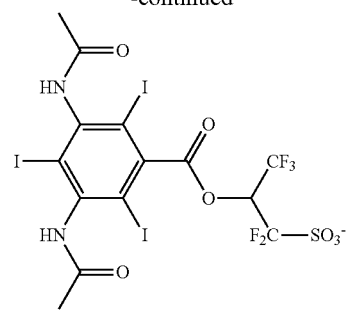
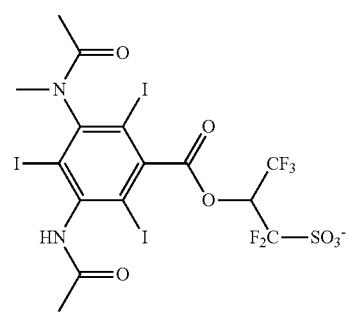
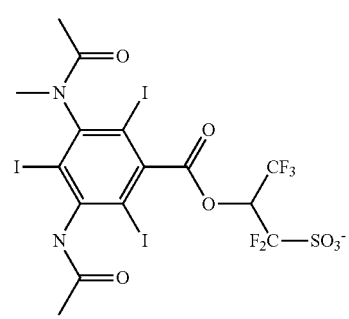
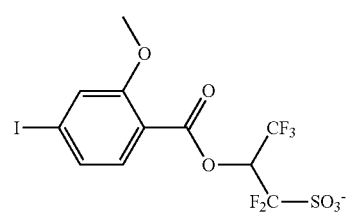
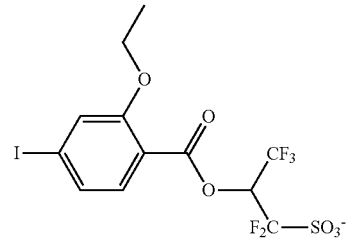
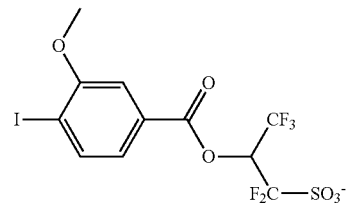
-continued
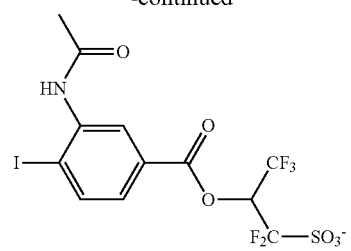
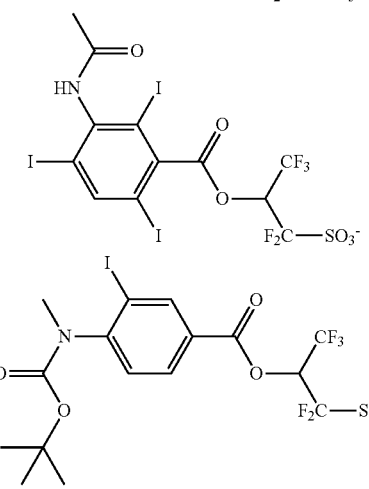
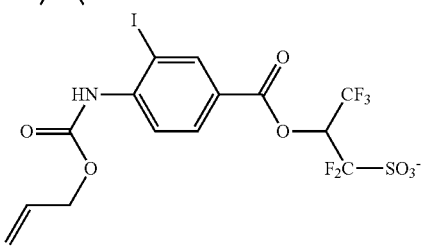
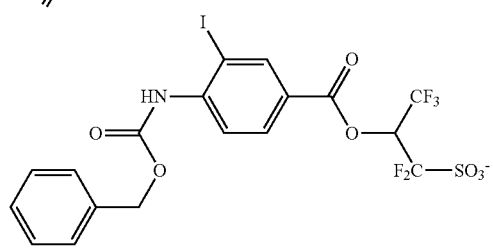
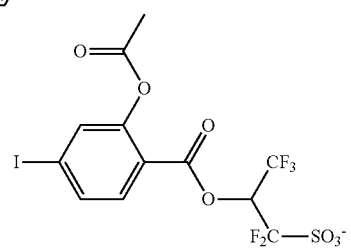
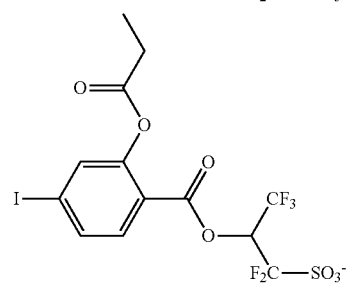

-continued
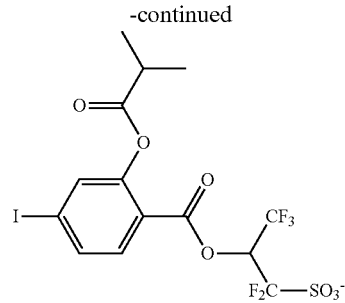
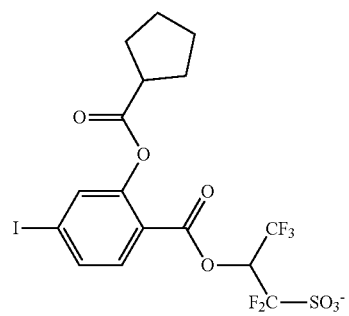
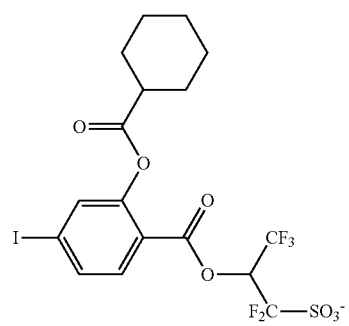
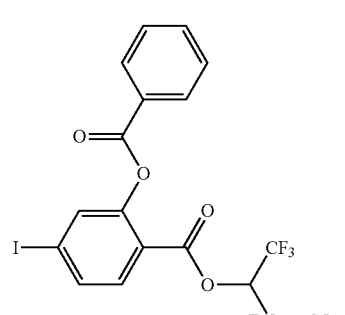
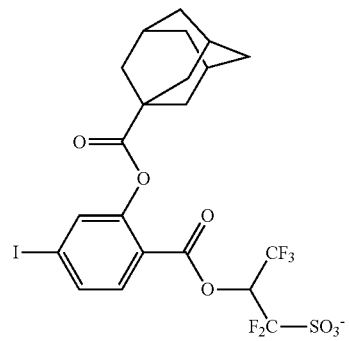
-continued
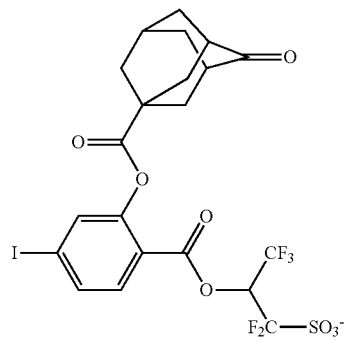
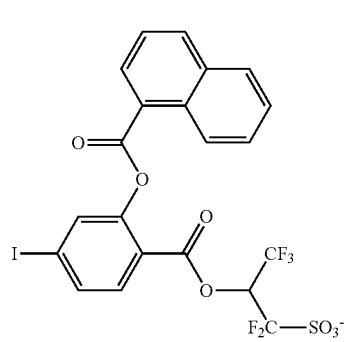
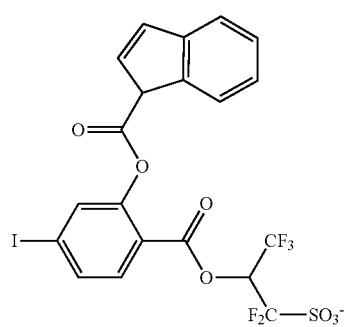
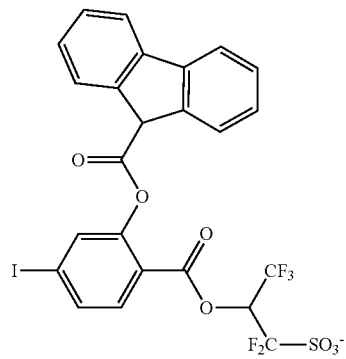
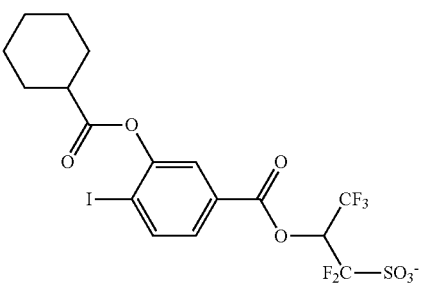

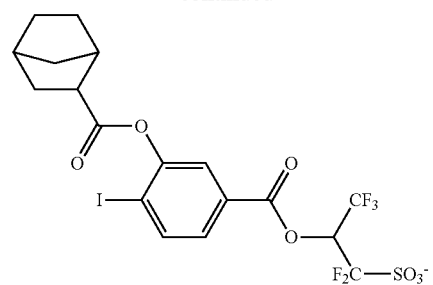
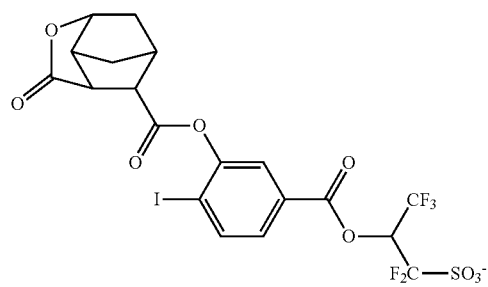
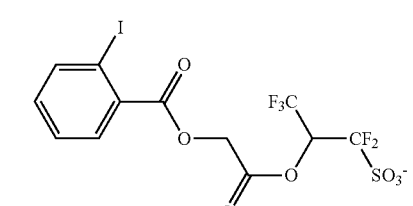
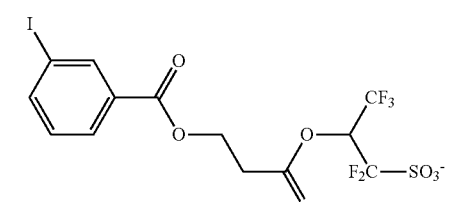
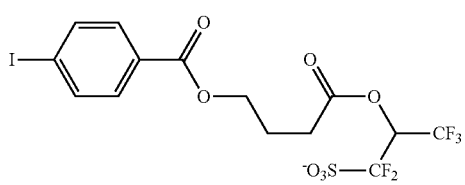
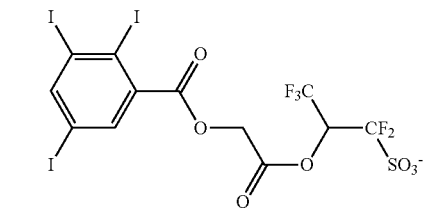
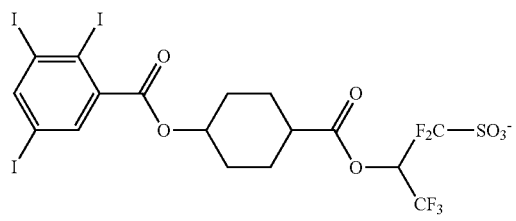
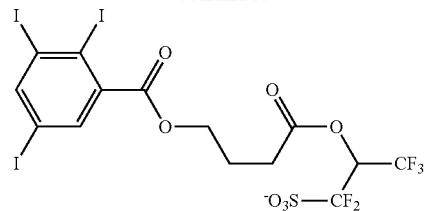
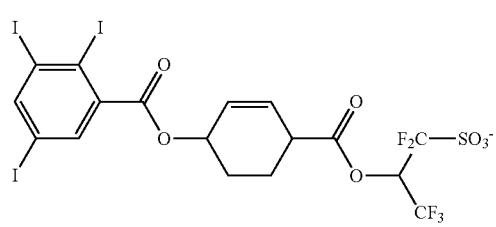
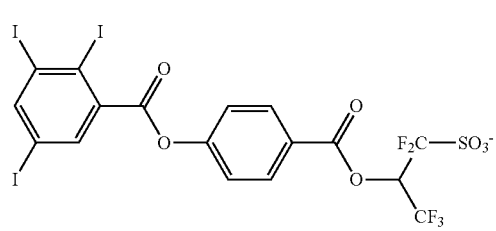
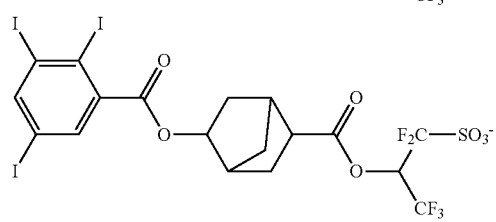
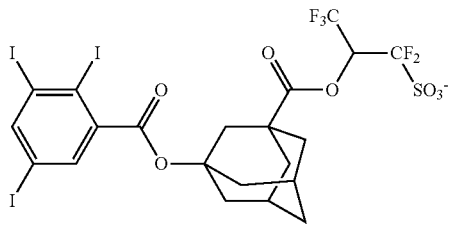
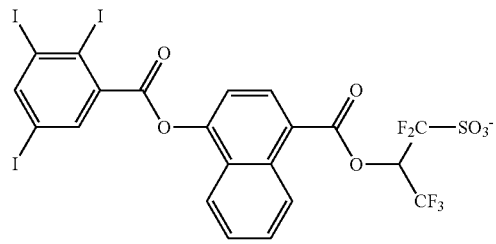
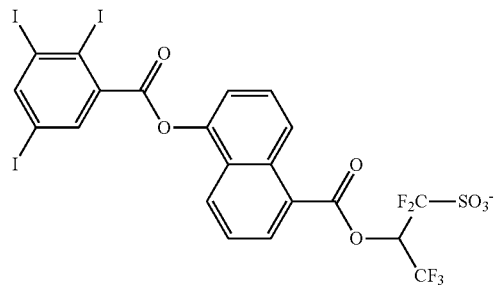

-continued
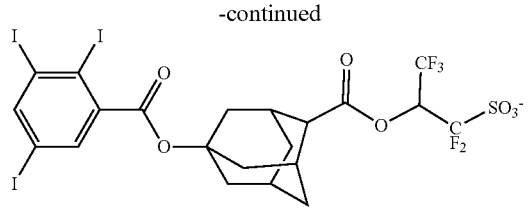
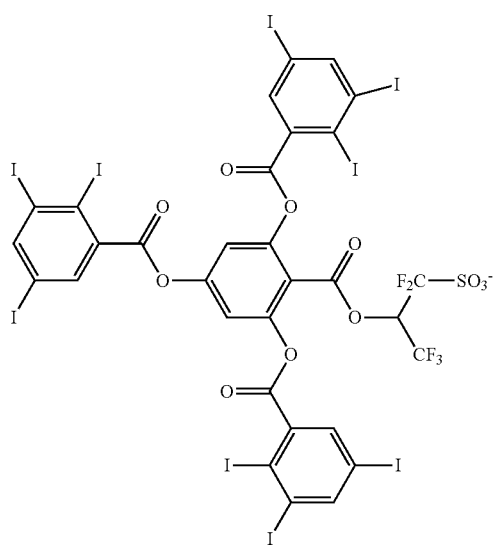
-continued
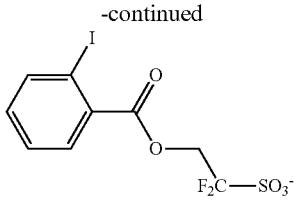
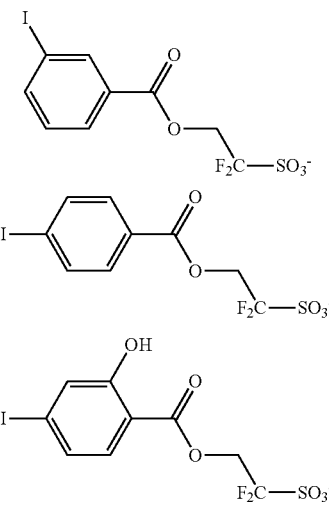
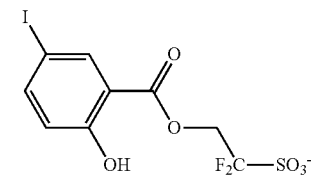
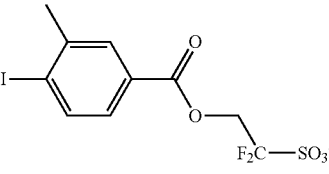
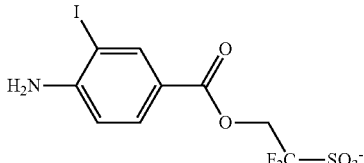
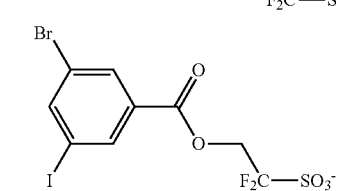
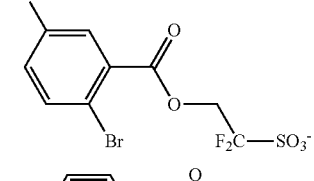
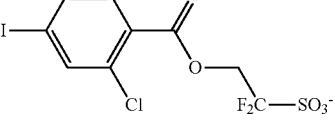

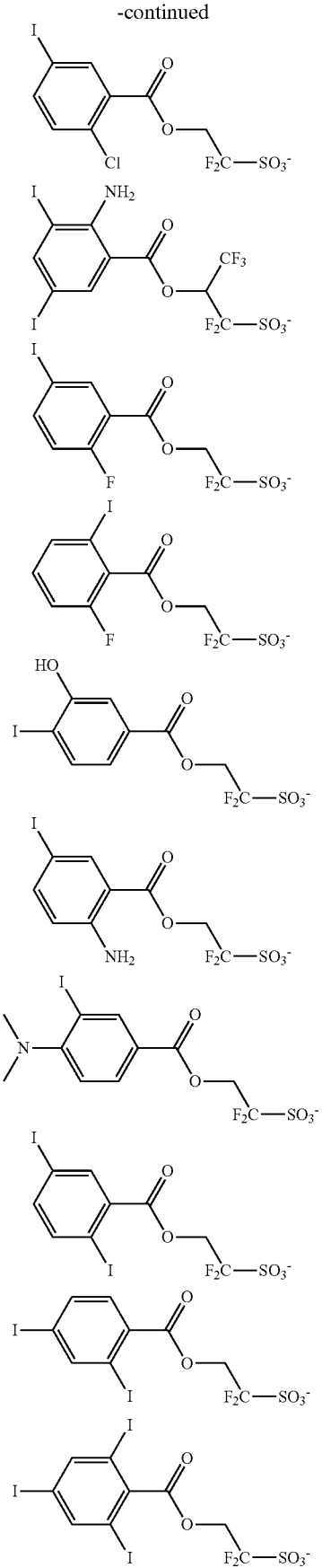
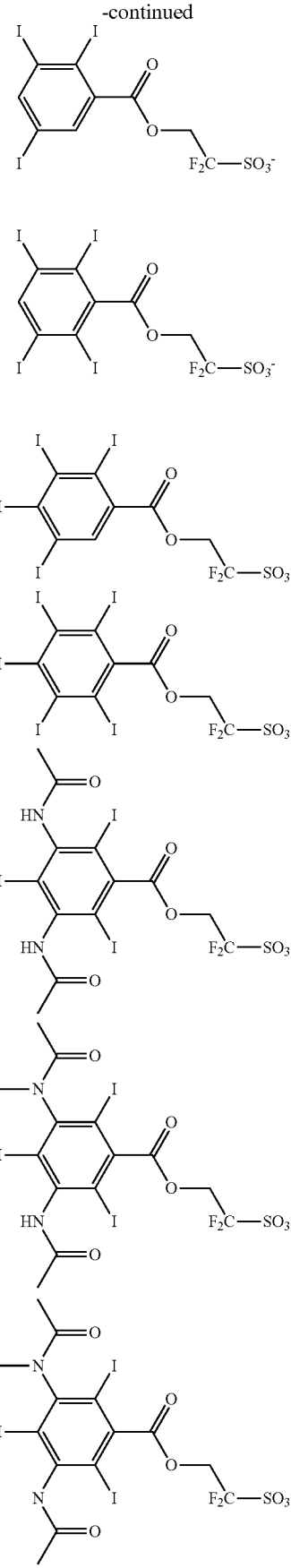

-continued
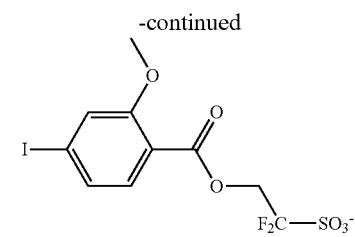
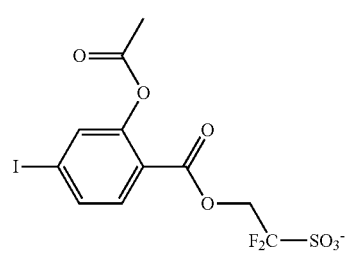
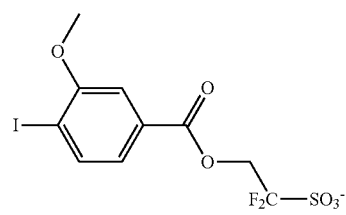
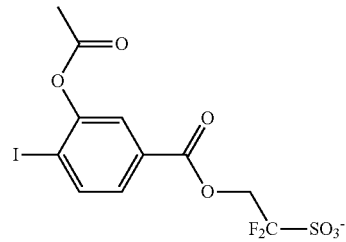
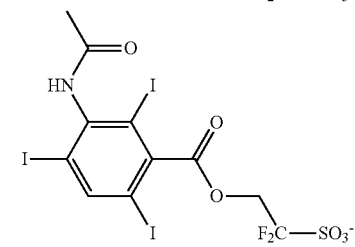
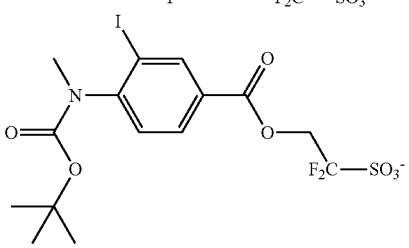
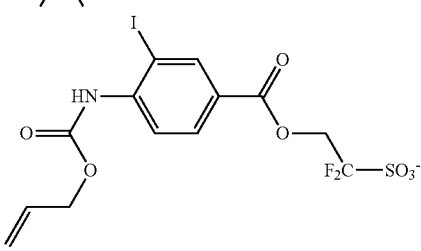
-continued
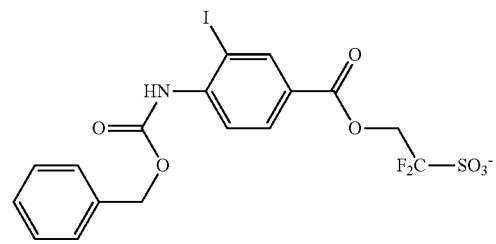
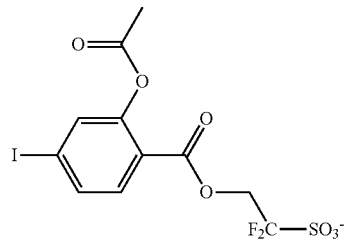
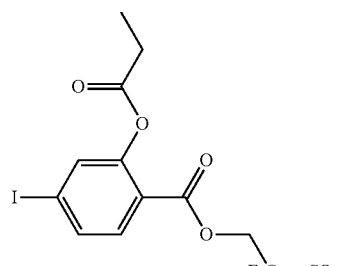
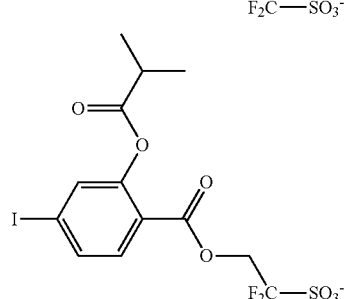
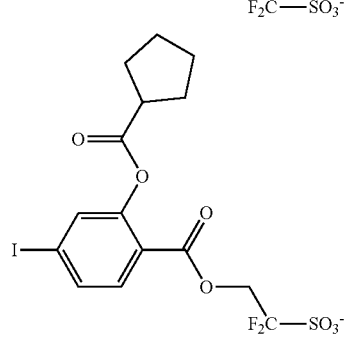
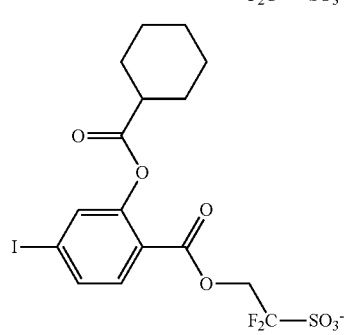

25
-continued
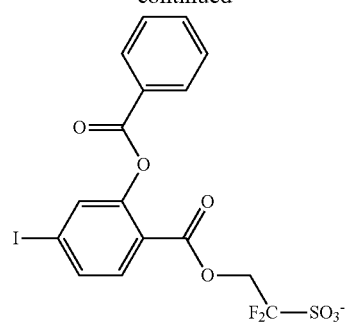
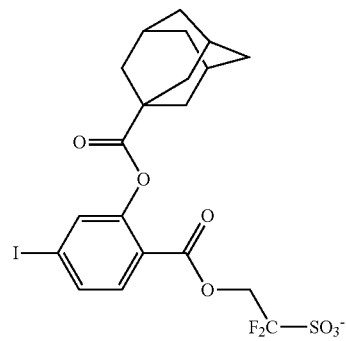
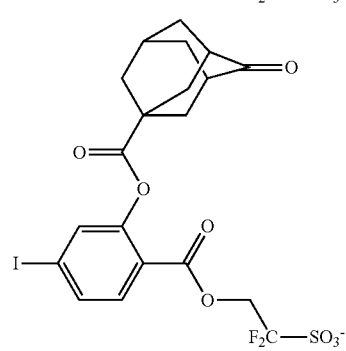
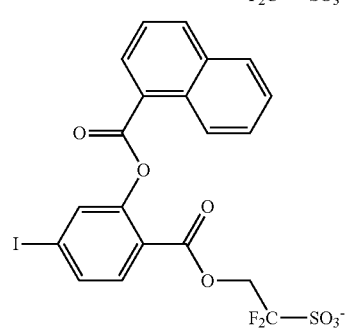
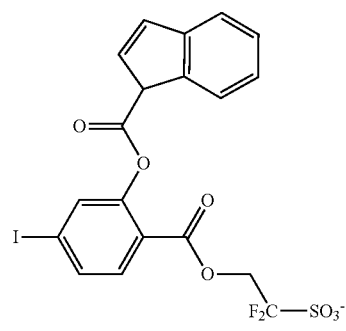
26
-continued
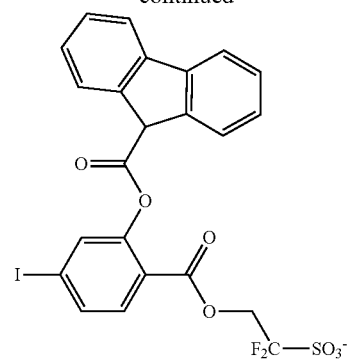
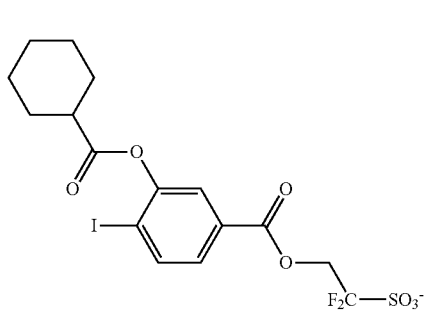
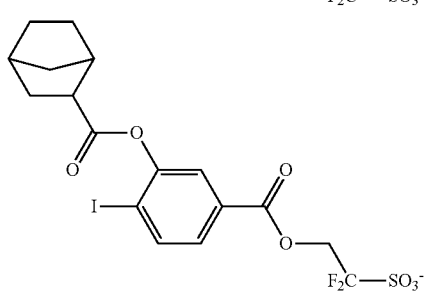
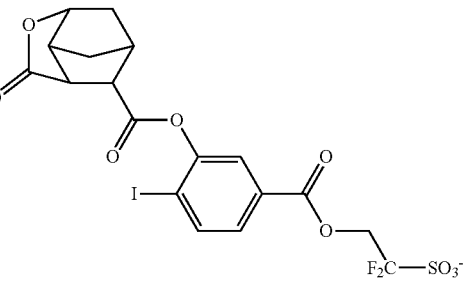
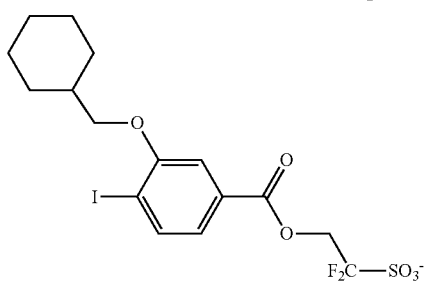
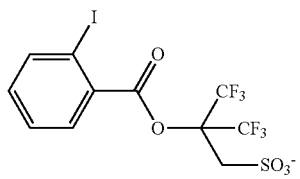

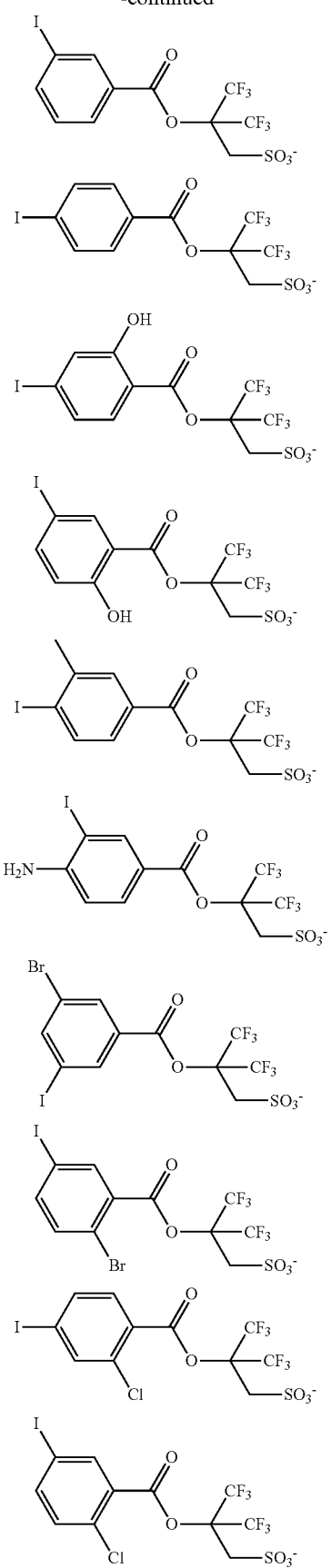
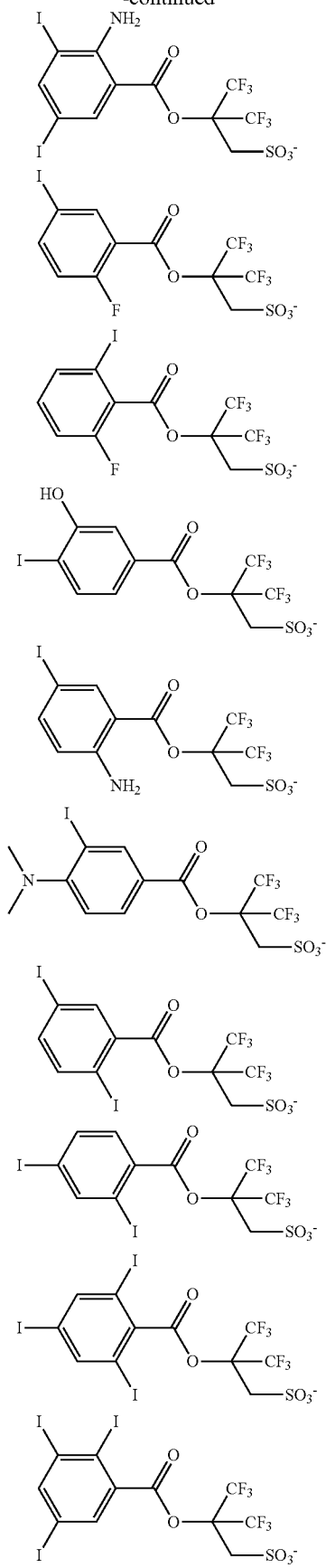

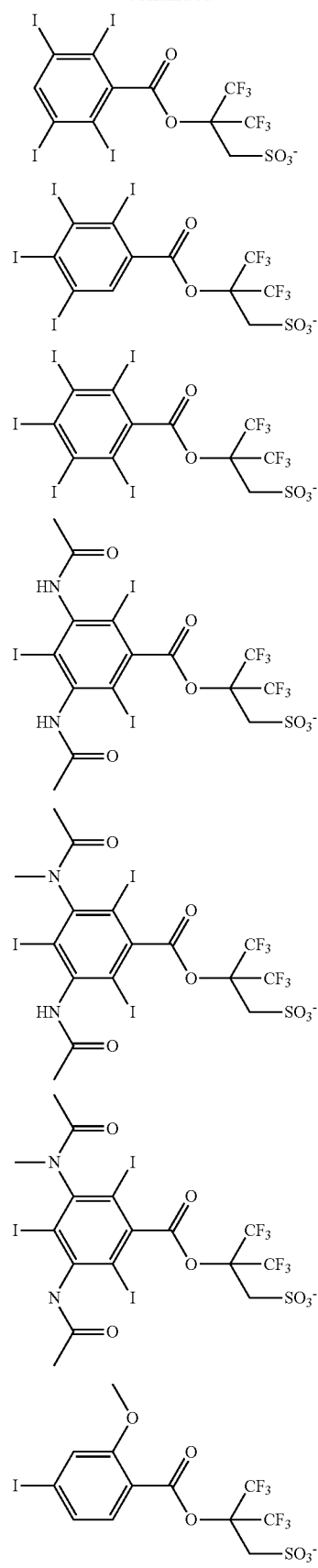
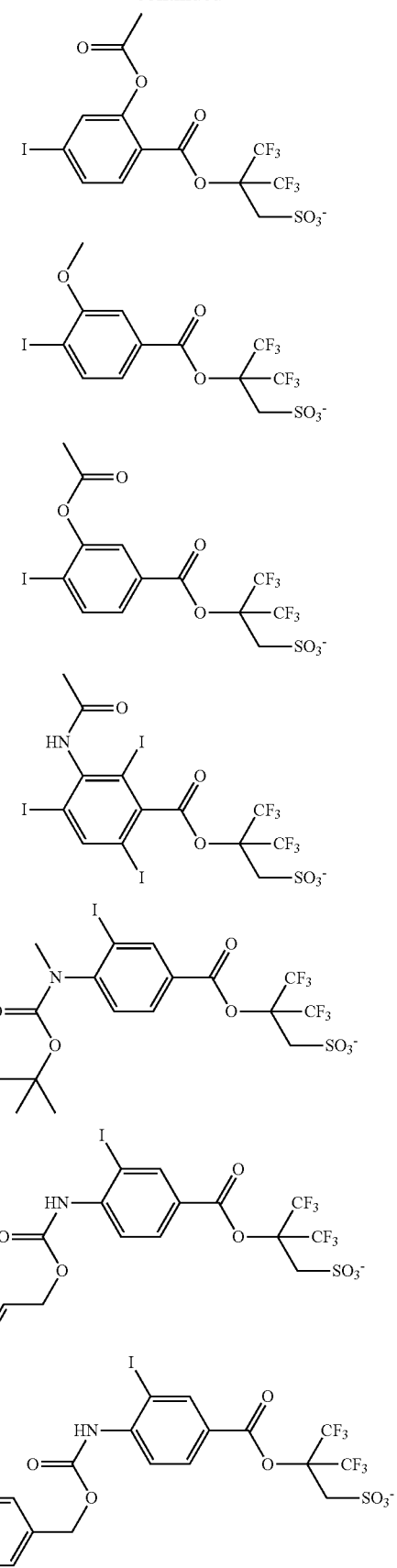

-continued
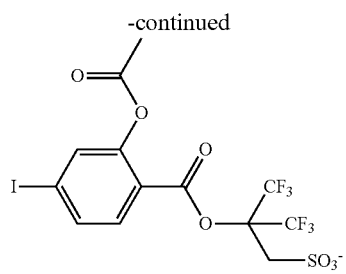
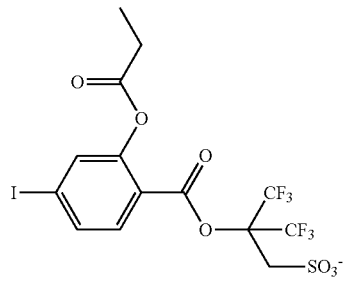
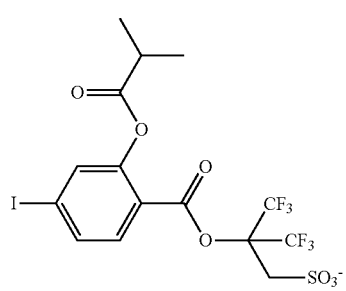
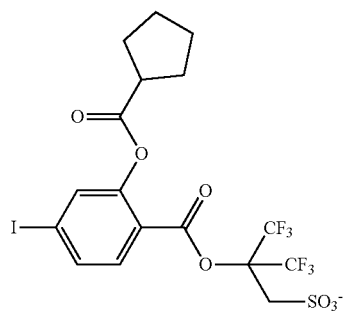
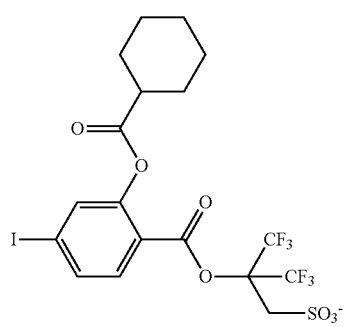
-continued
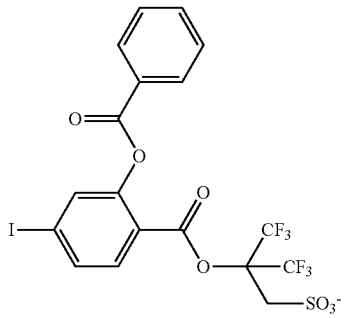
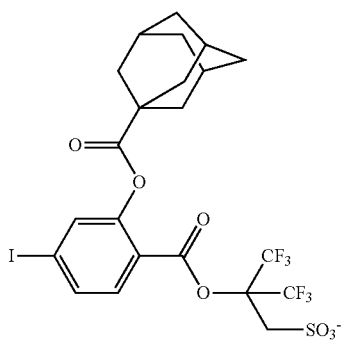
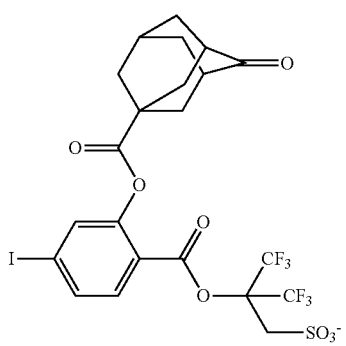
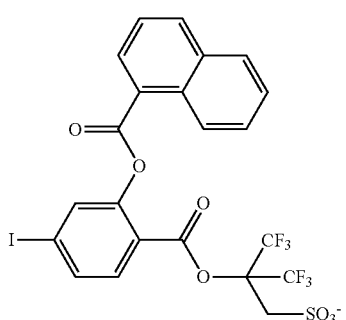
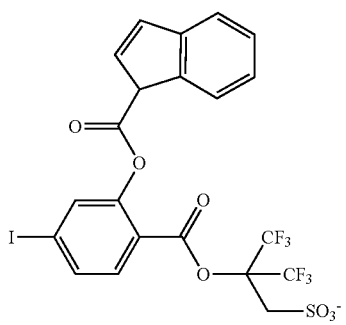

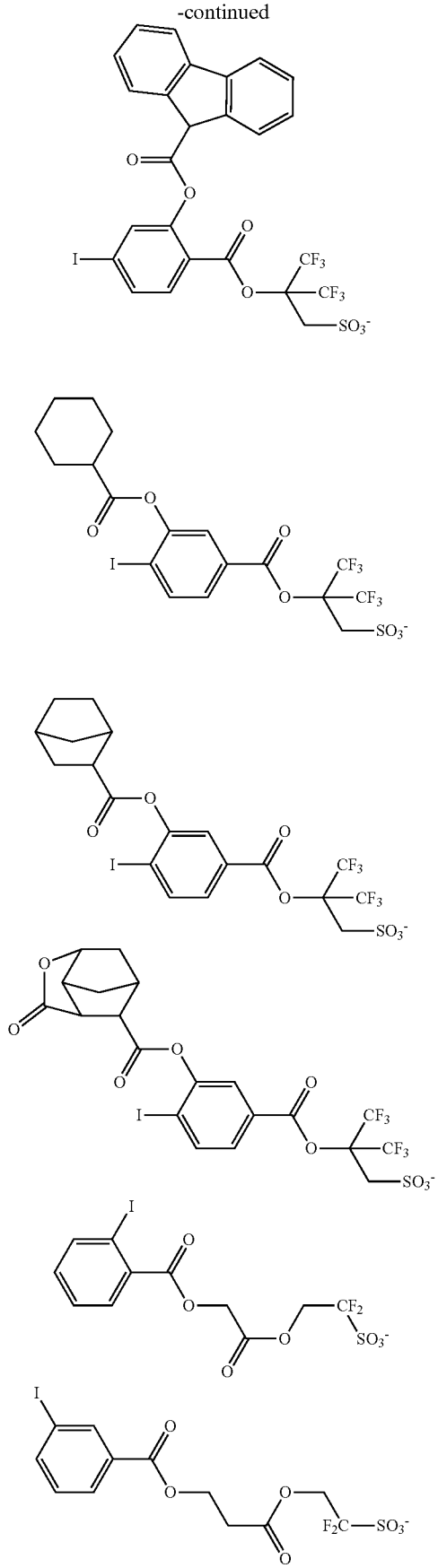

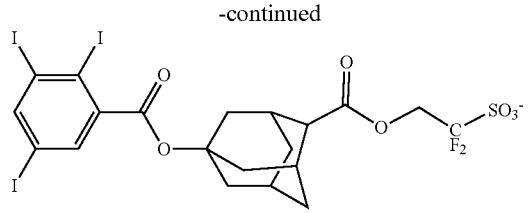
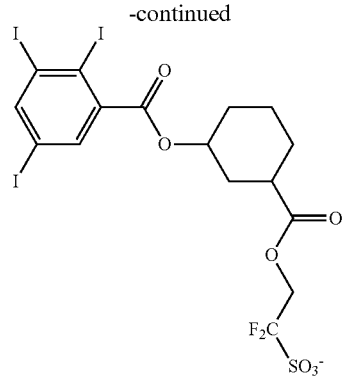
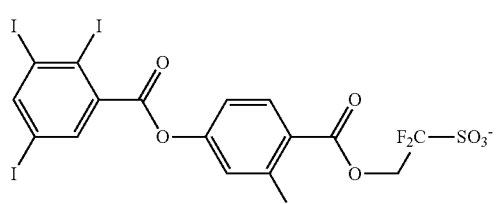
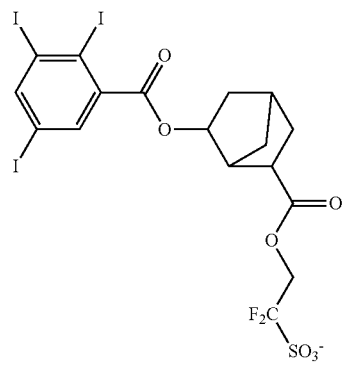
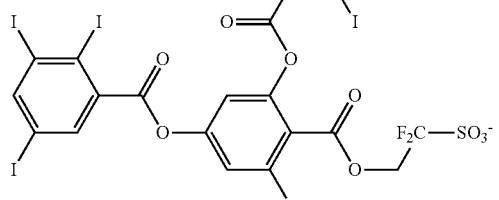
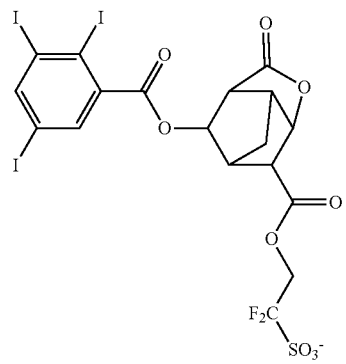
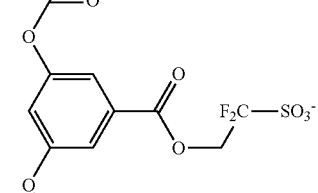
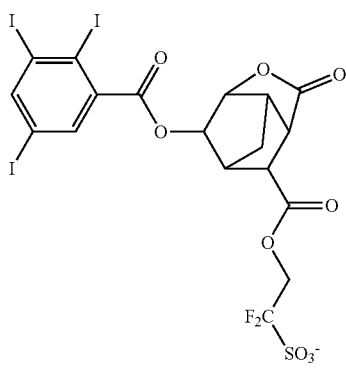

37
-continued
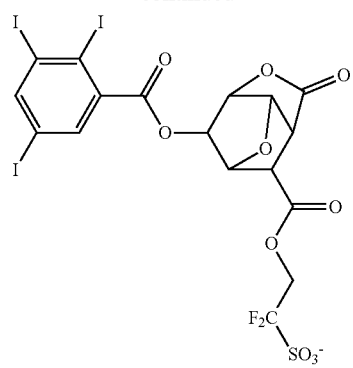
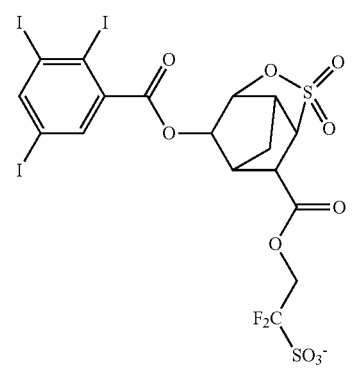
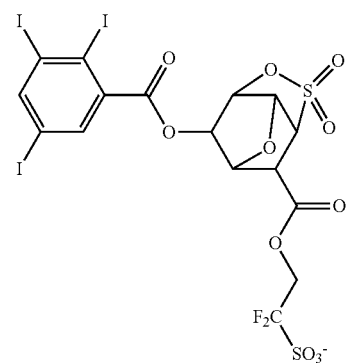
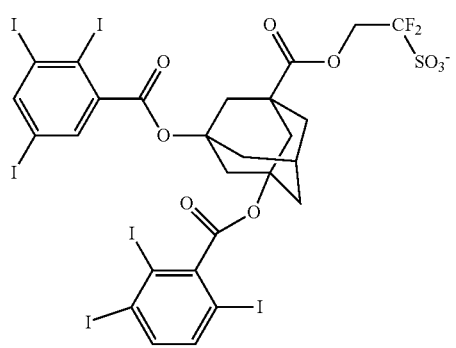
38
-continued
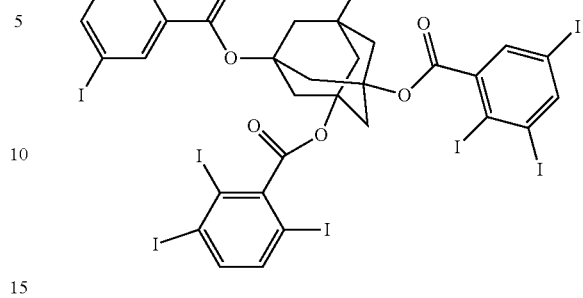
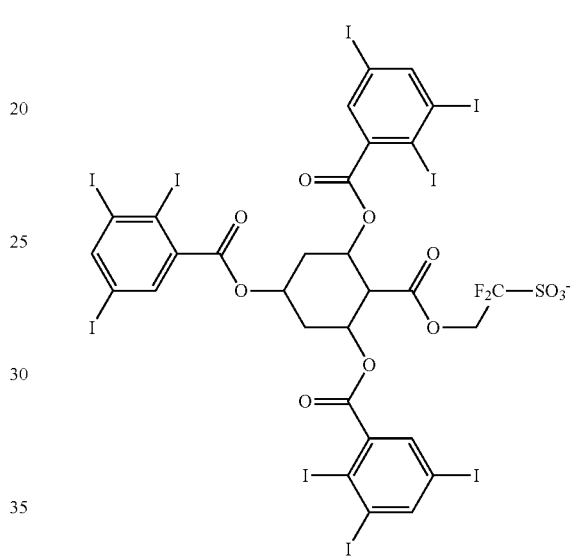
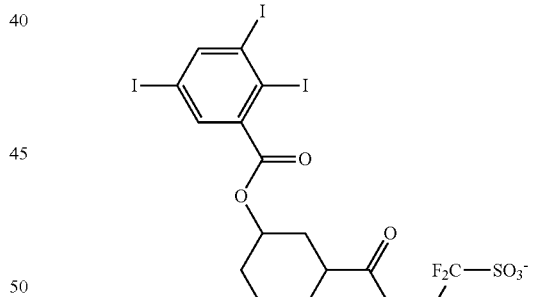
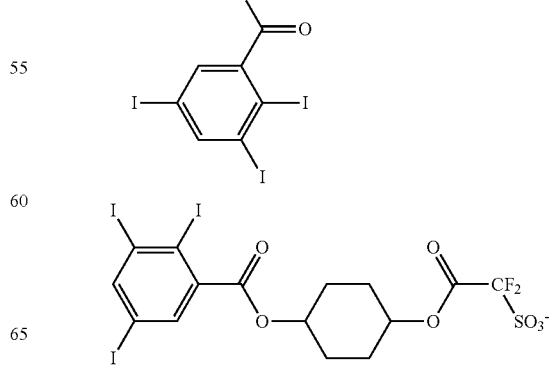

-continued
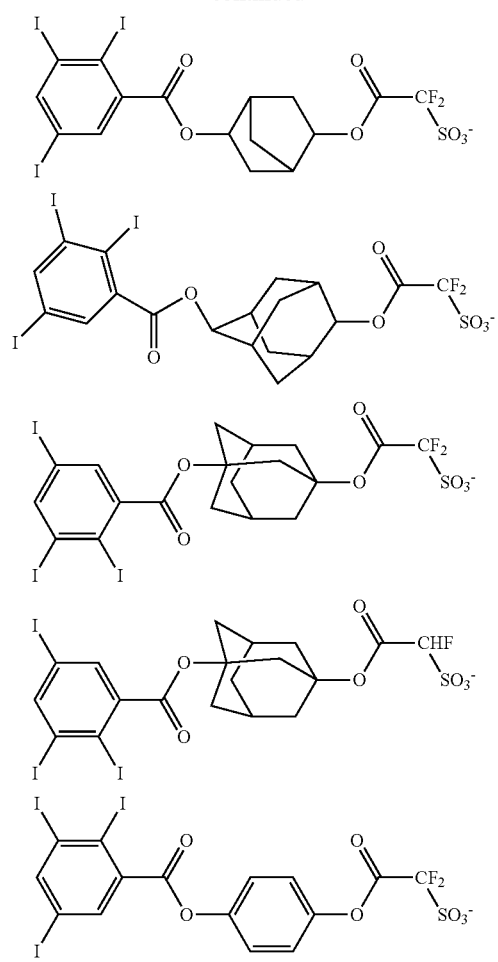
Examples of the cation moiety of the sulfonium salt shown by the formula (A-1) include ones shown below, but are not limited thereto.
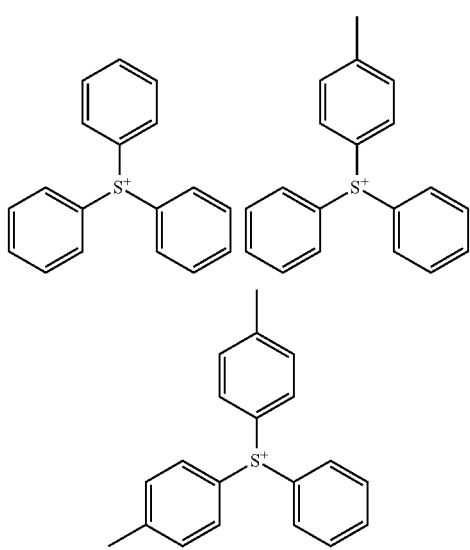
-continued
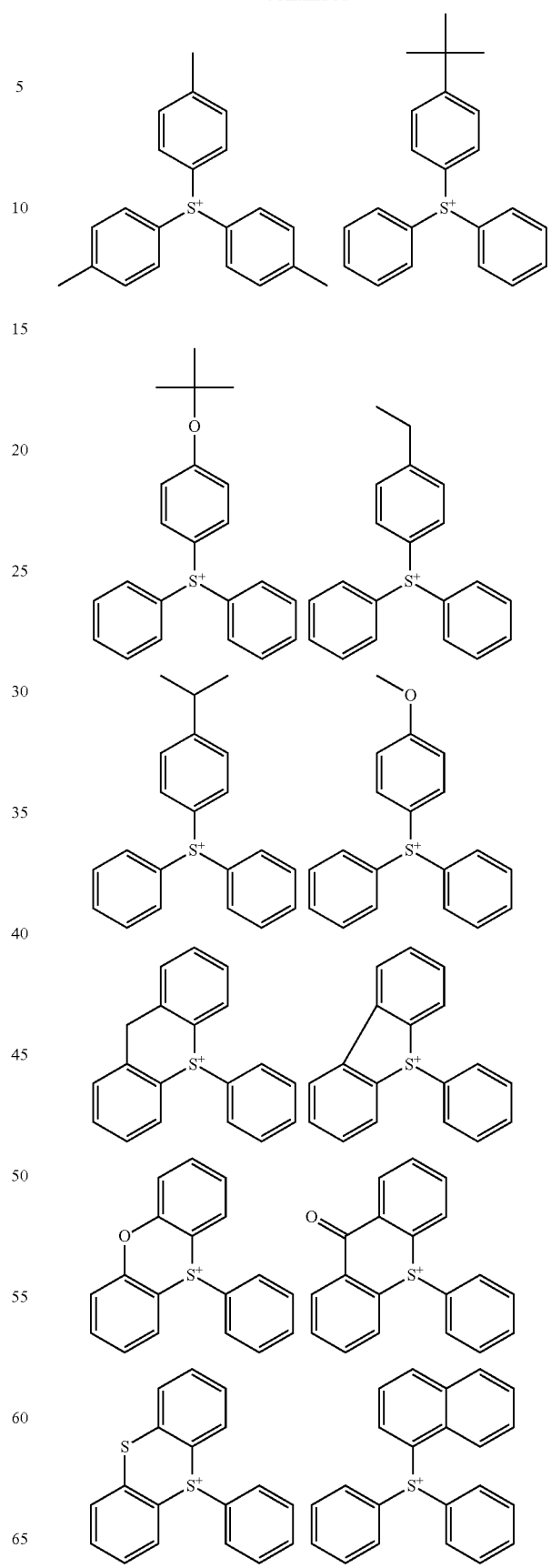

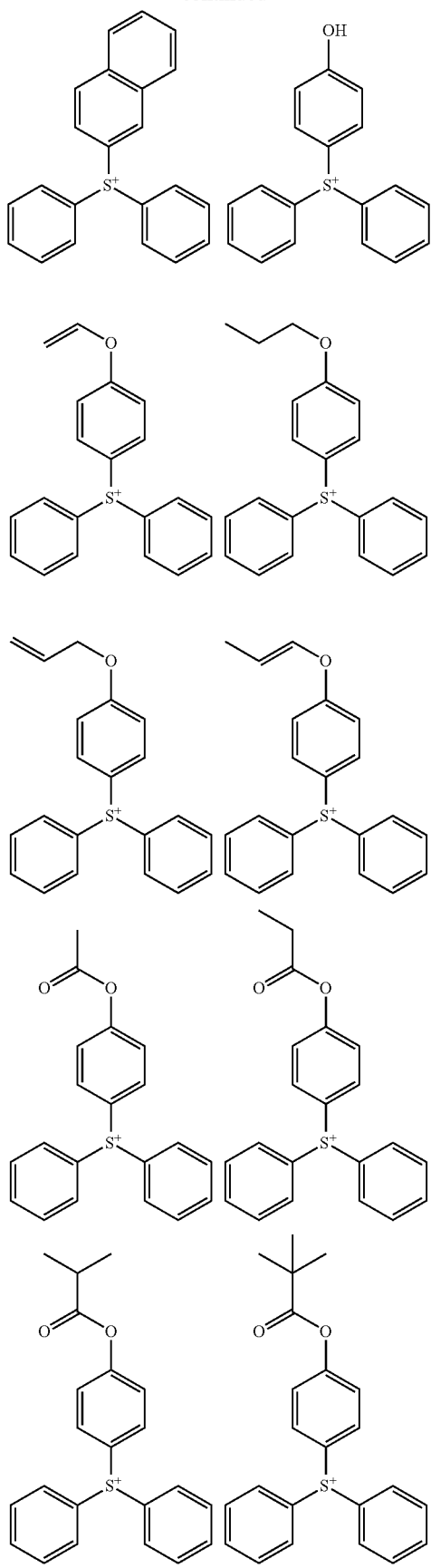
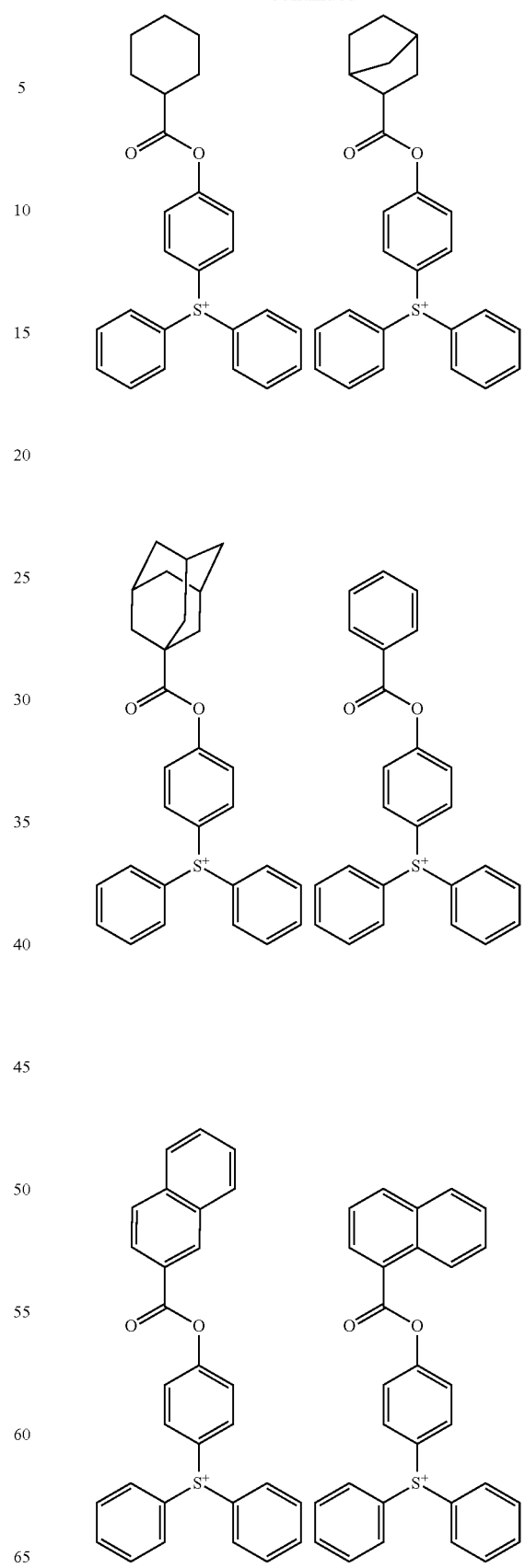

43
-continued
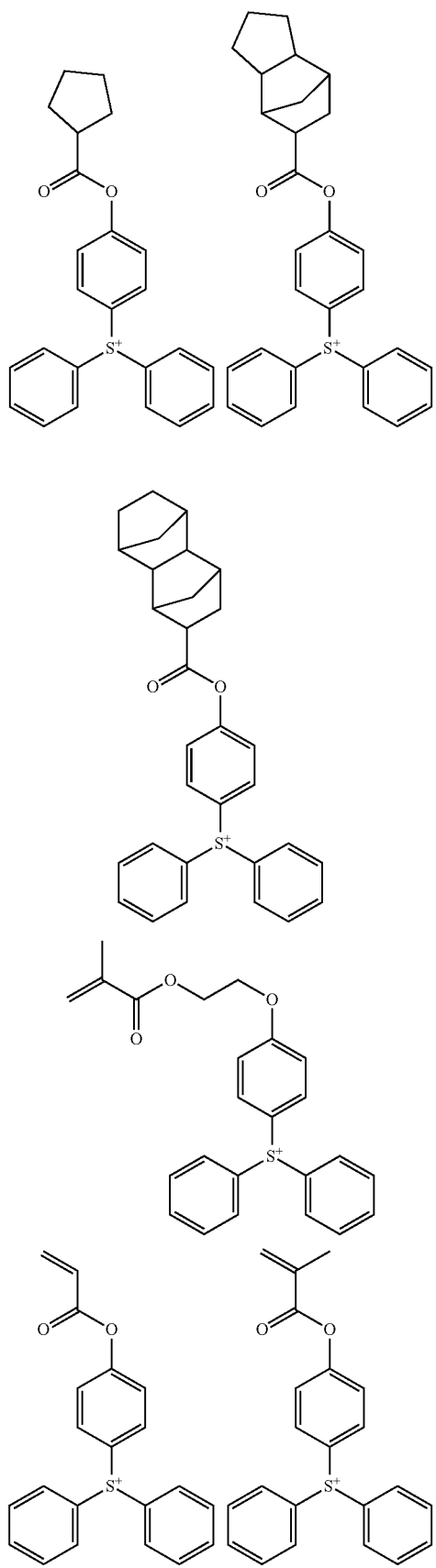
44
-continued
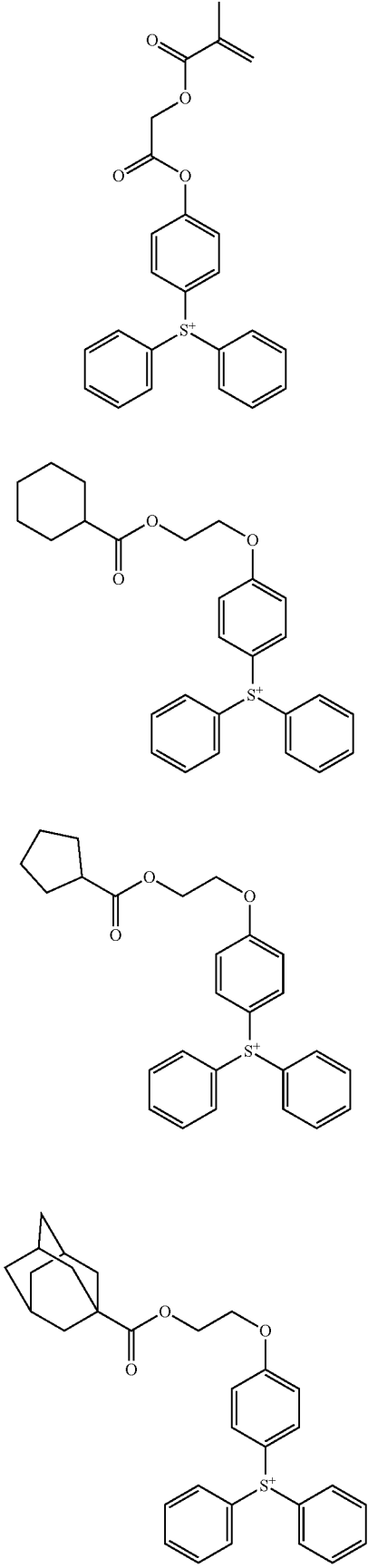

45
-continued
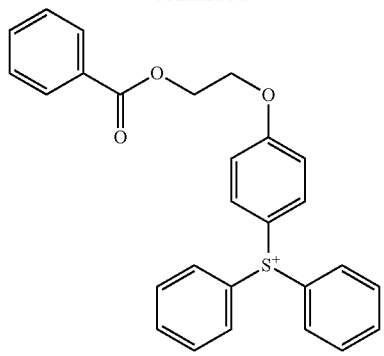
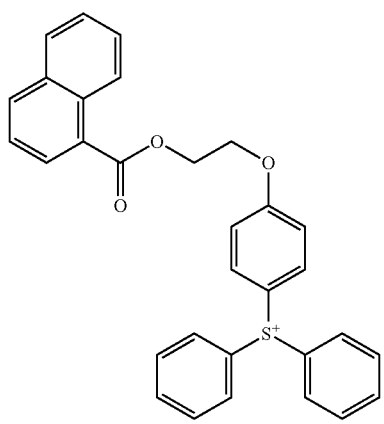
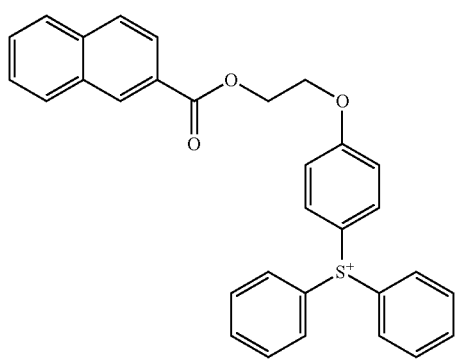
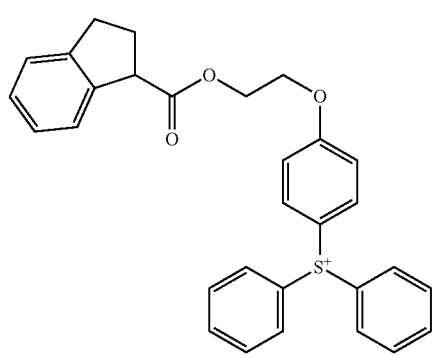
46
-continued
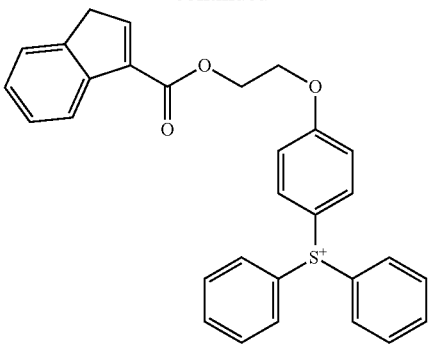
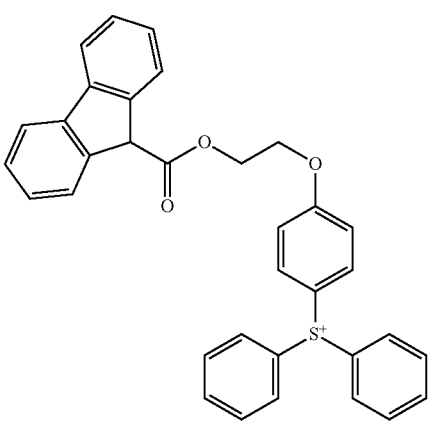
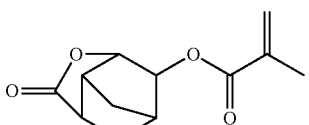
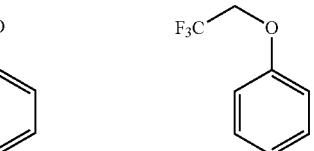
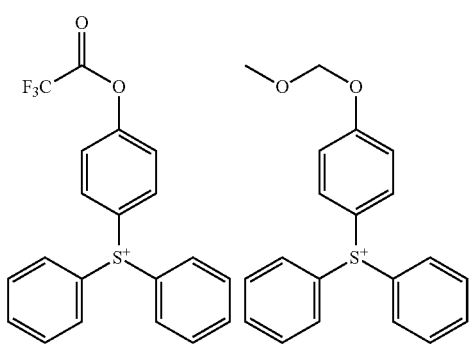

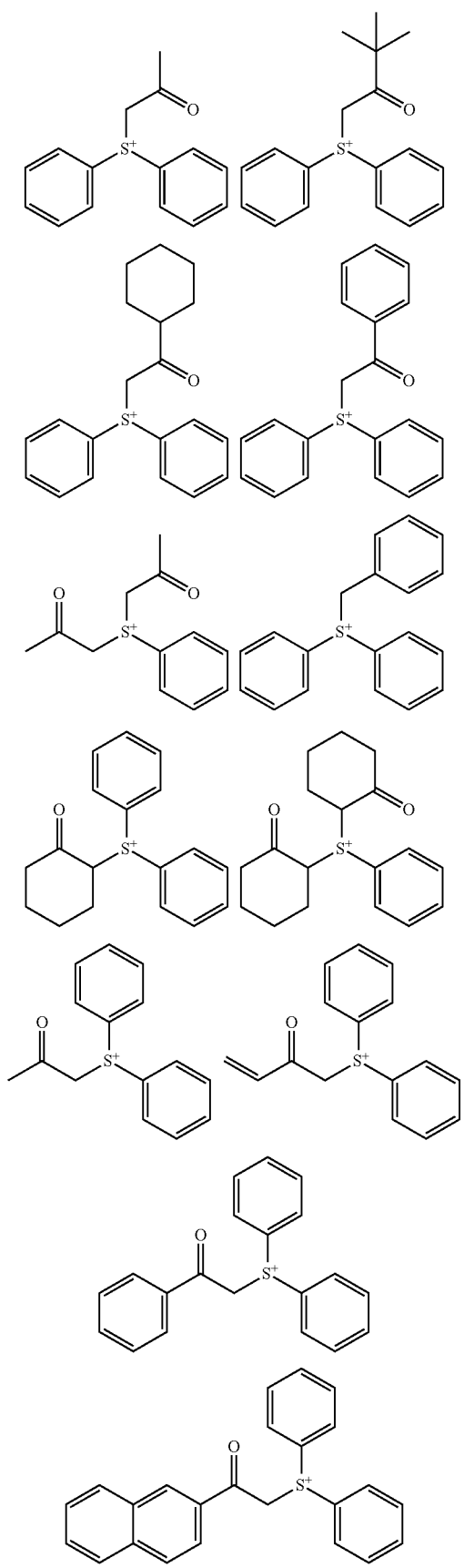
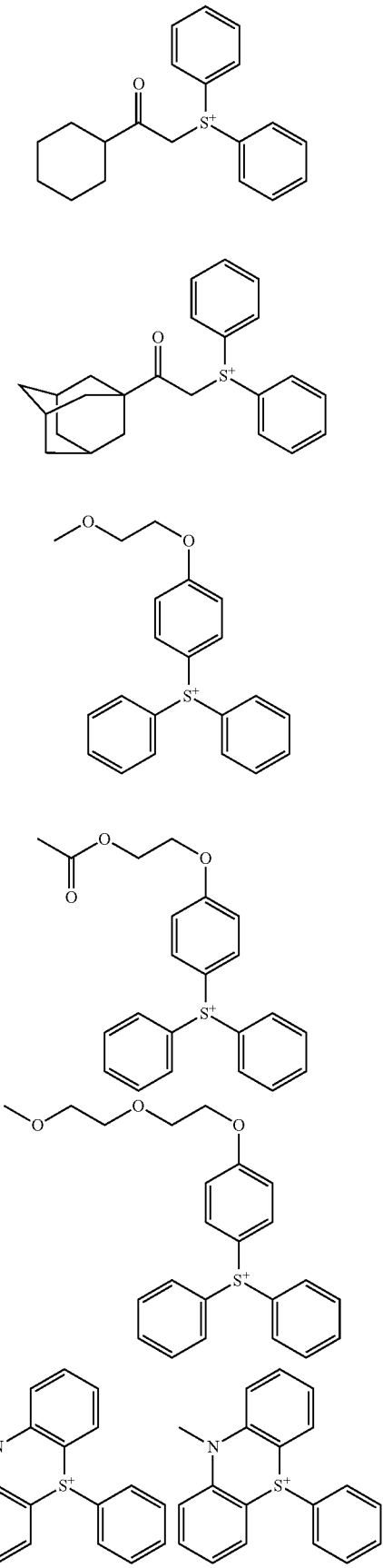

-continued
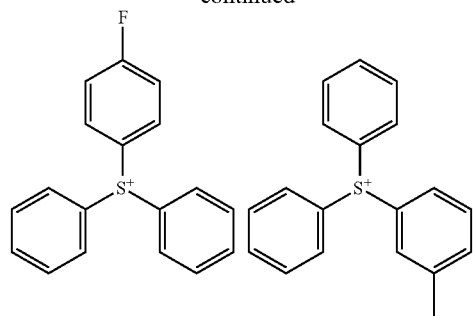
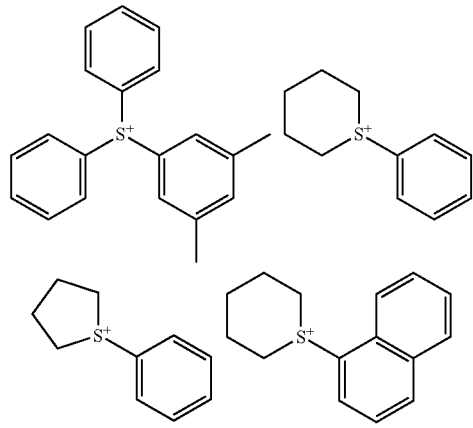
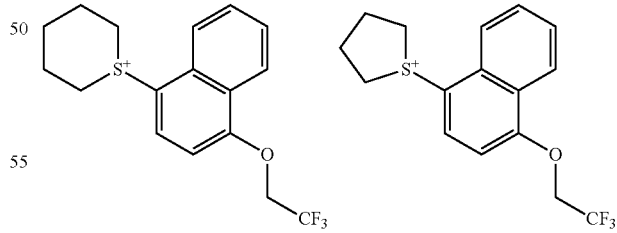
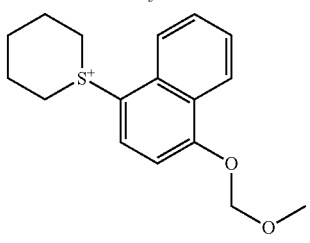
-continued
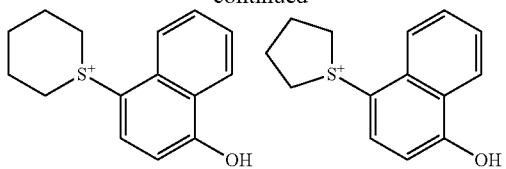
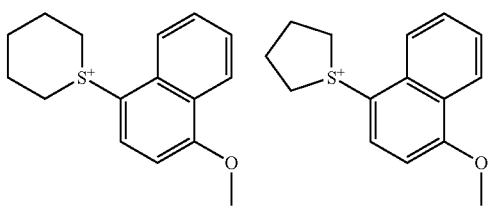
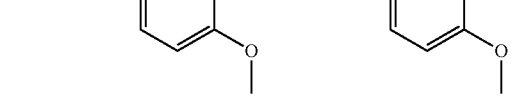
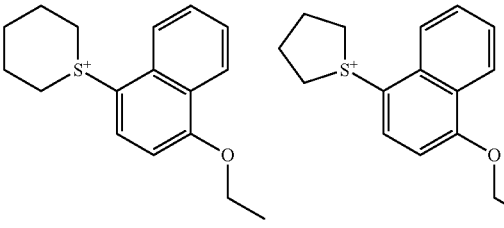
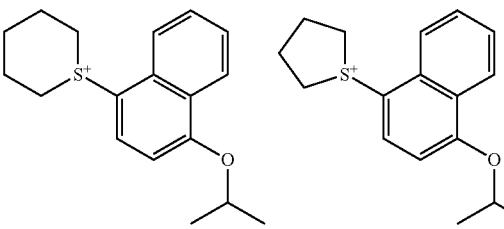
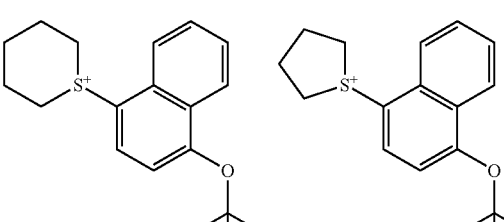

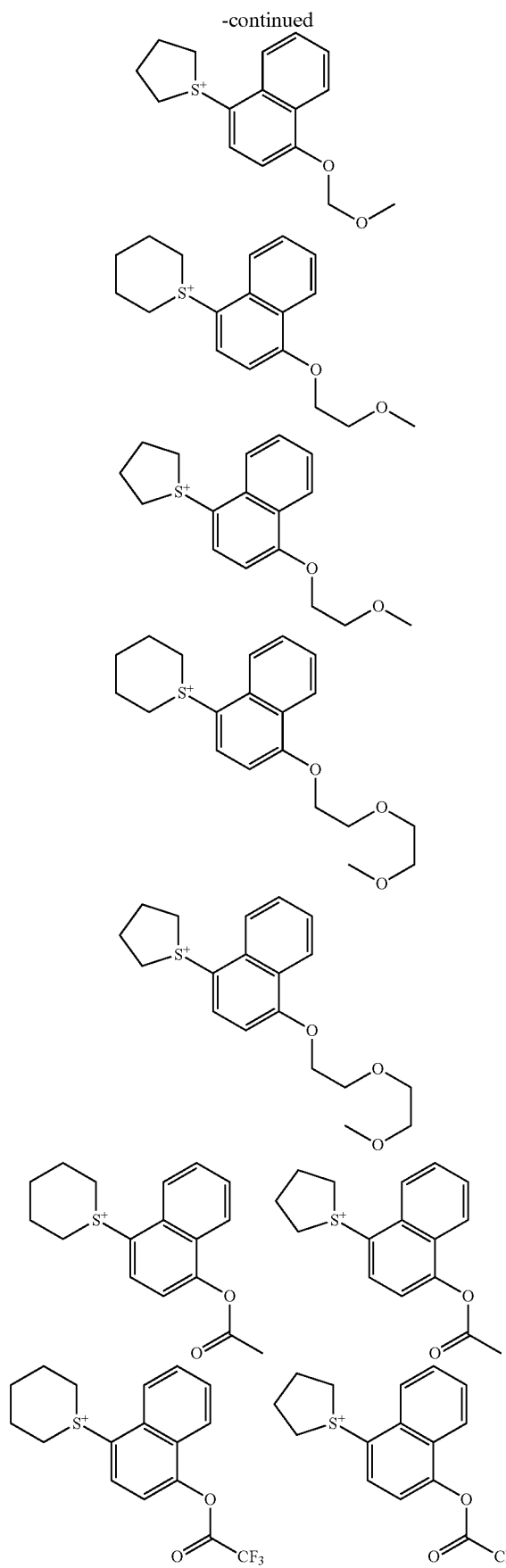

53
-continued
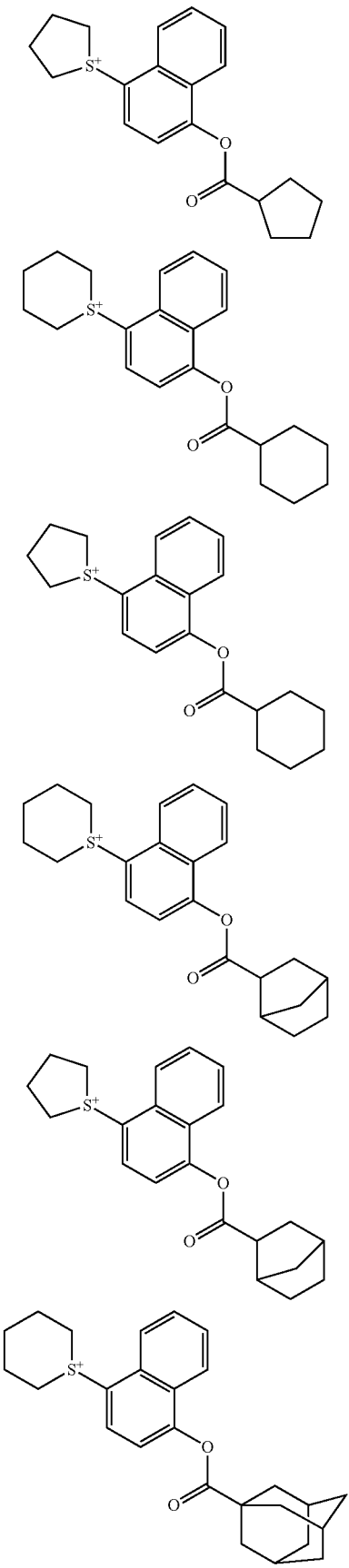
54
-continued
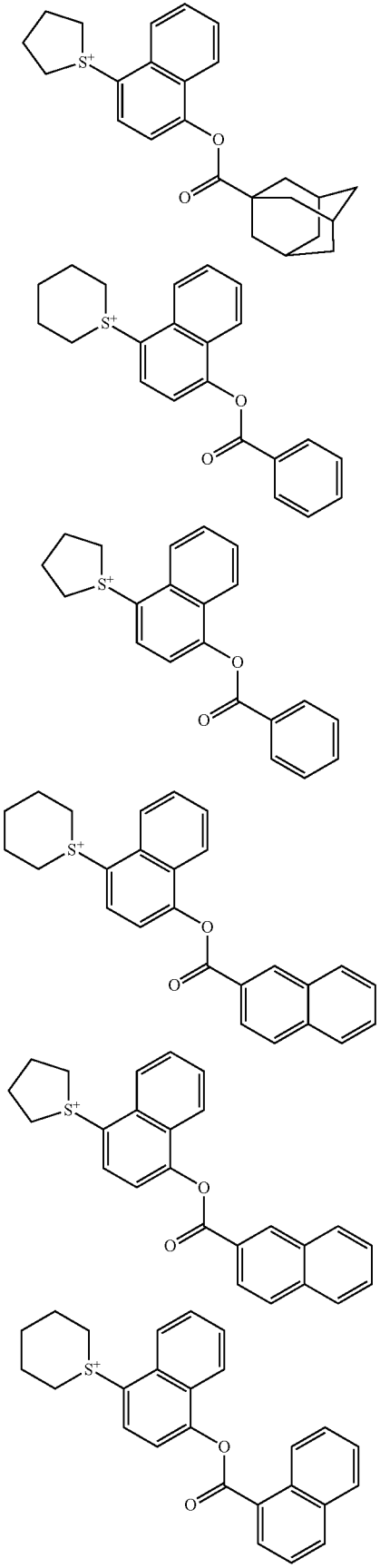

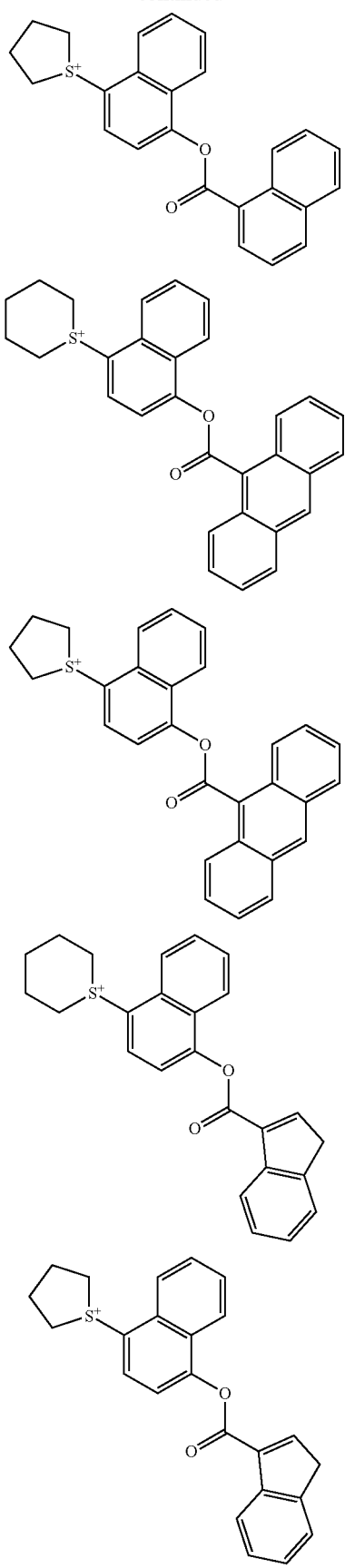

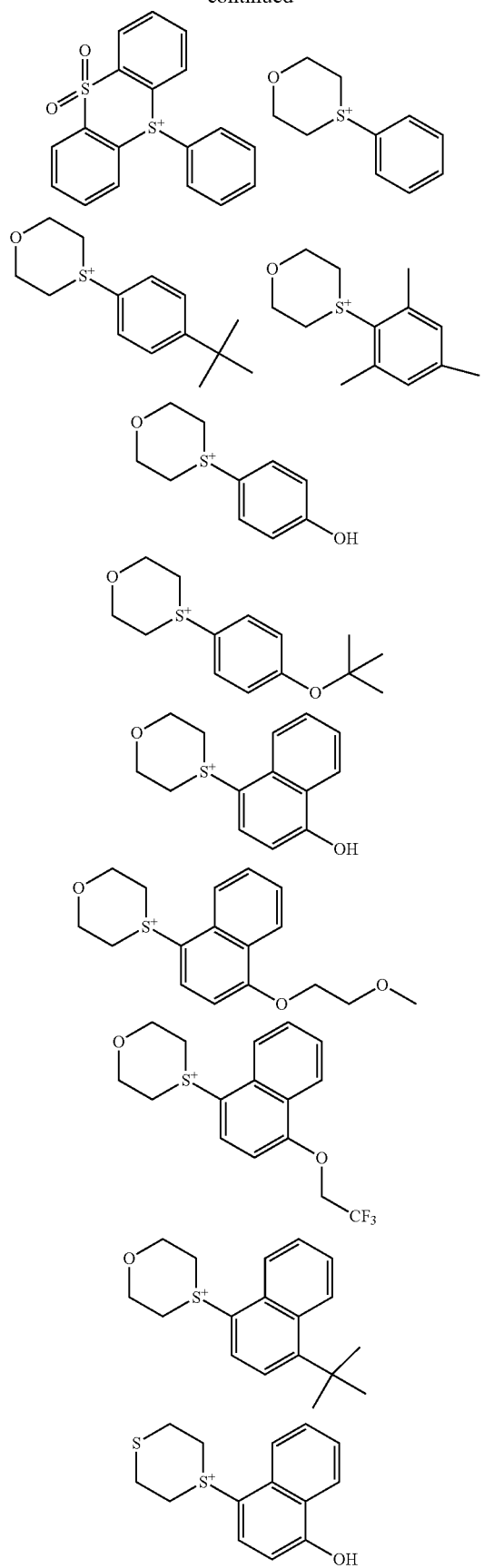
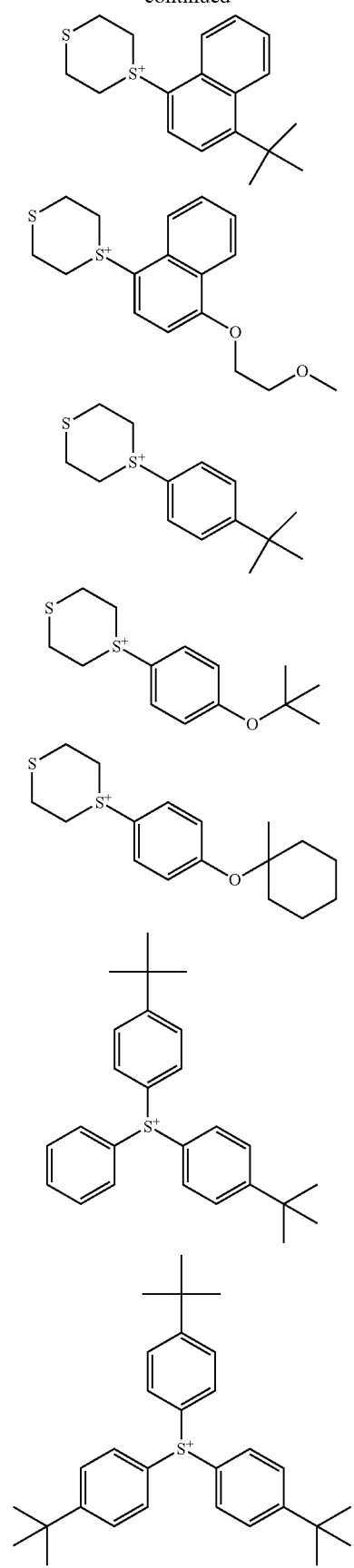

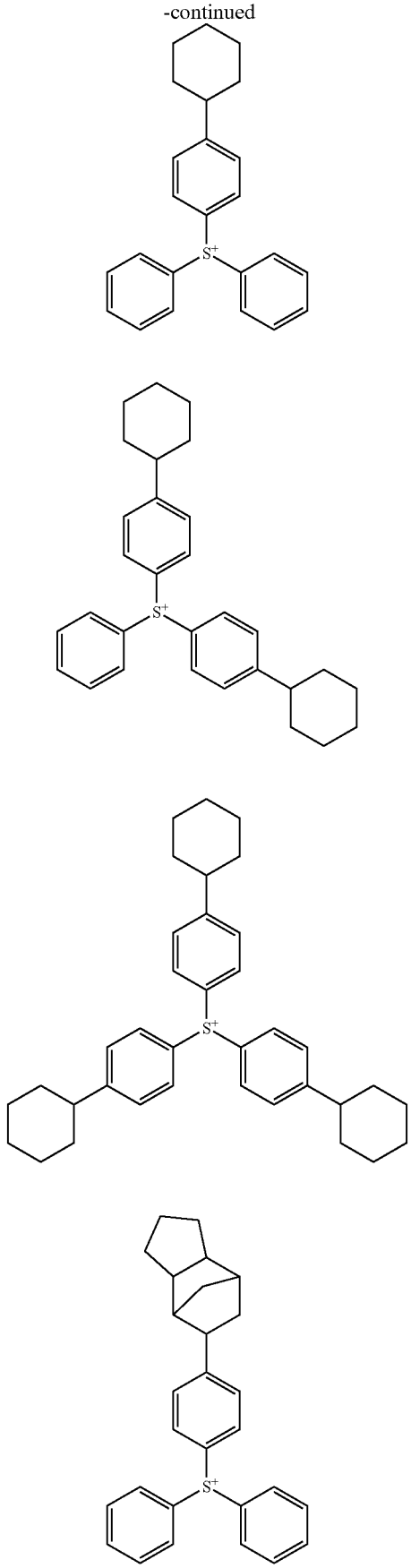
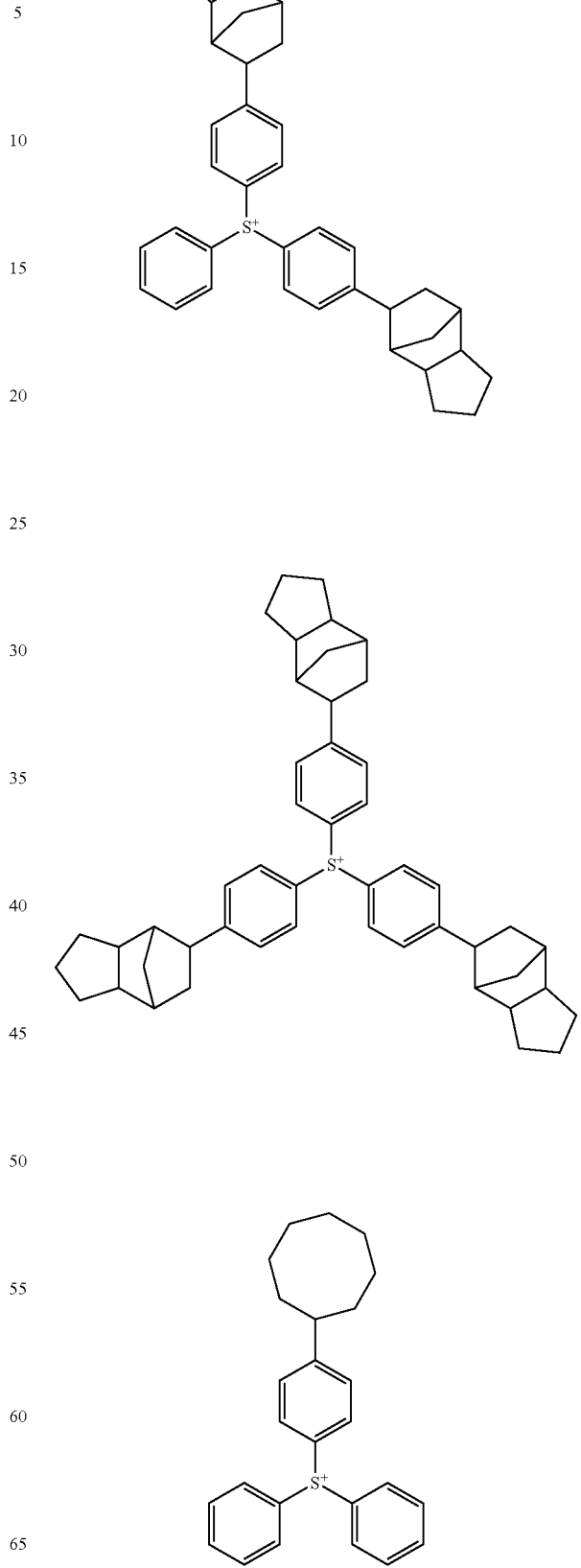

61
-continued
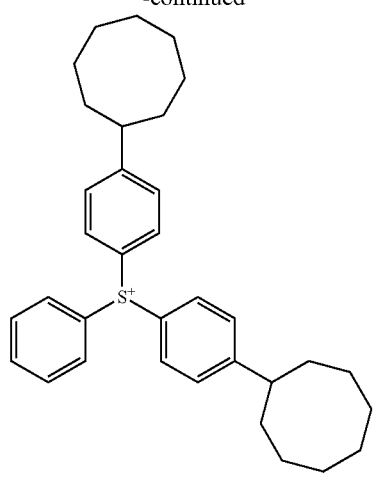
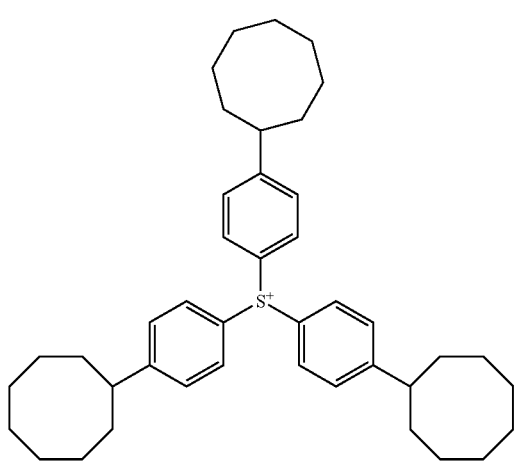
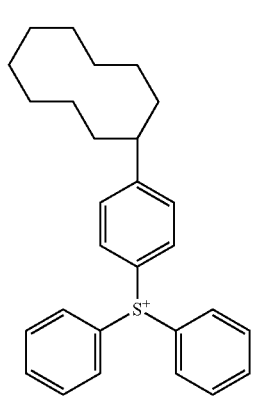
62
-continued
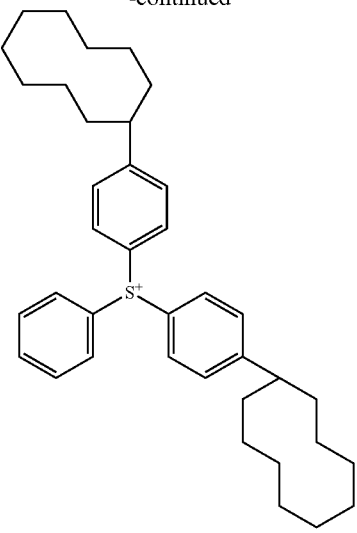

63
-continued
64
-continued
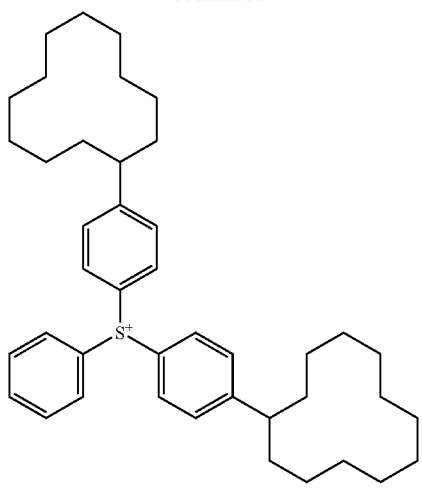
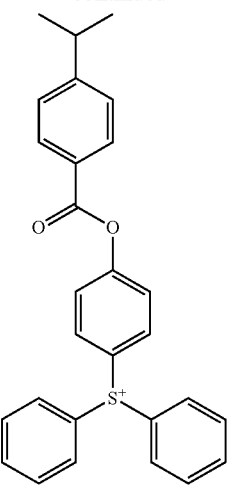
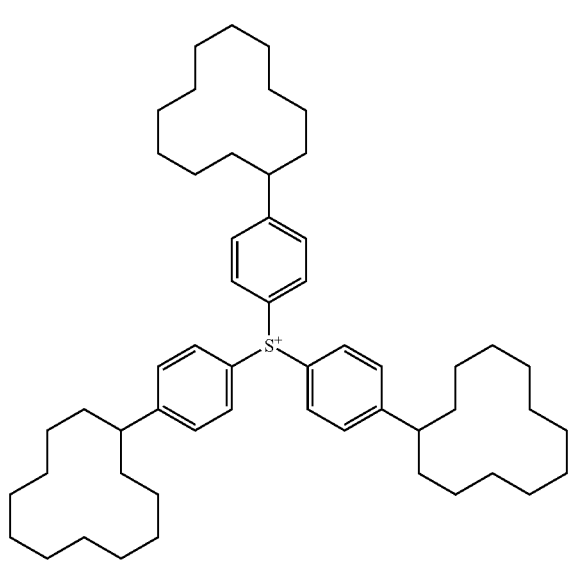
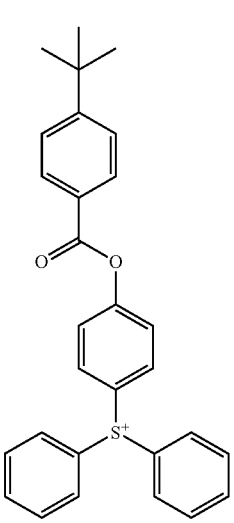
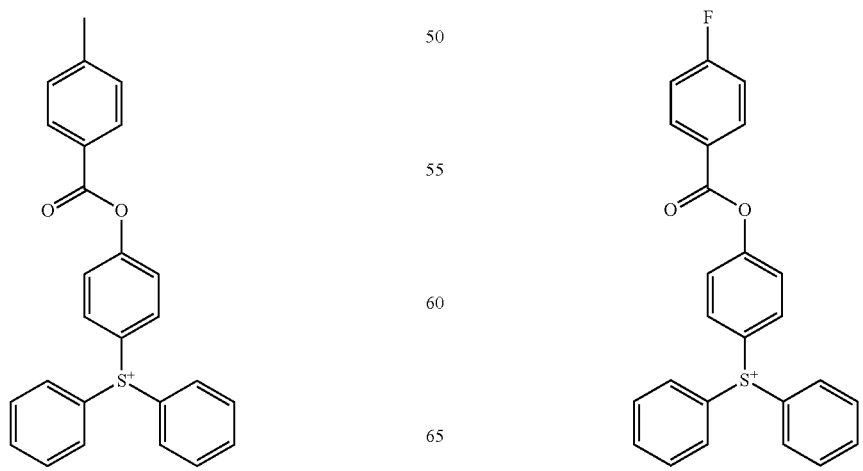

-continued
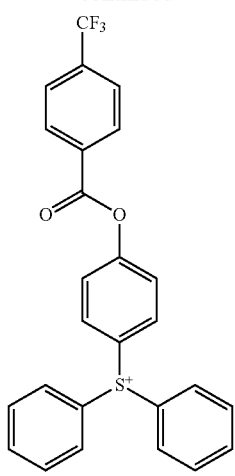
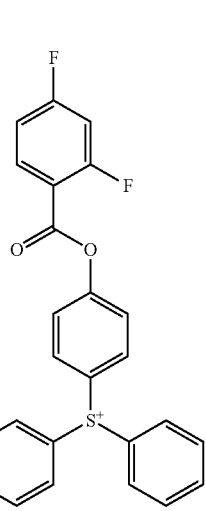
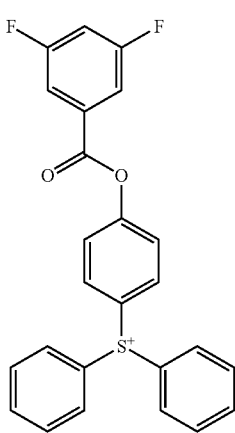
-continued
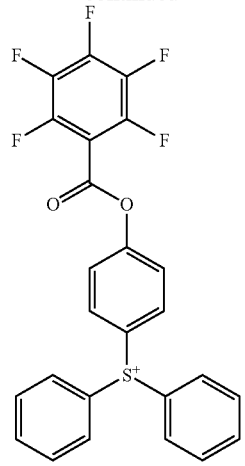
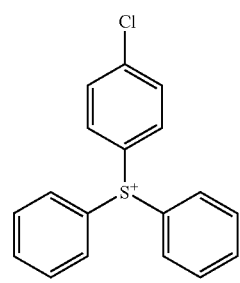
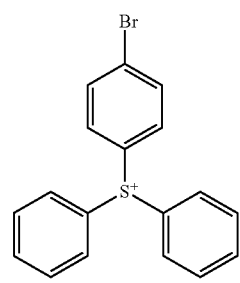
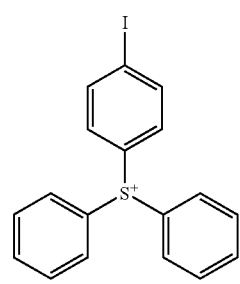
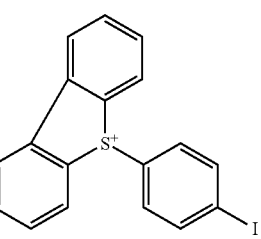

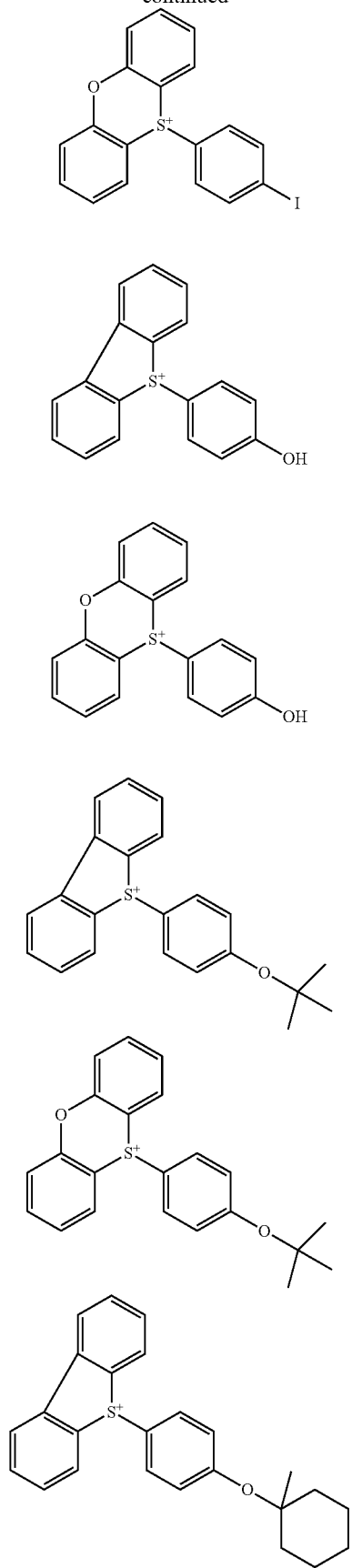

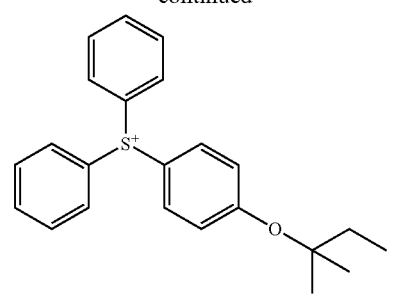

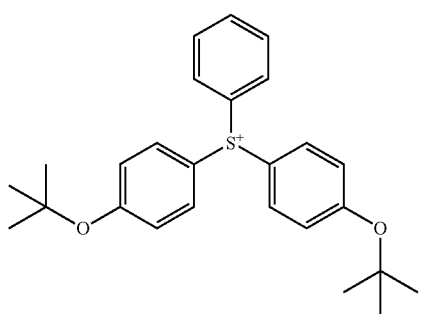

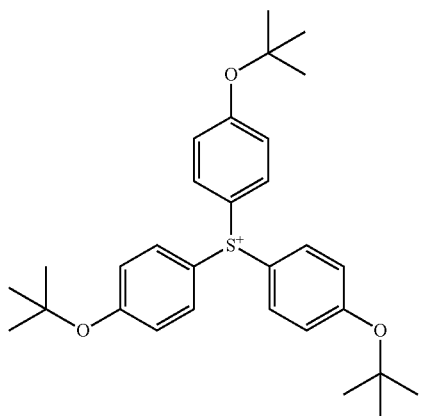

Examples of the cation moiety of the iodonium salt shown by the formula (A-2) include ones shown below, but are not limited thereto.

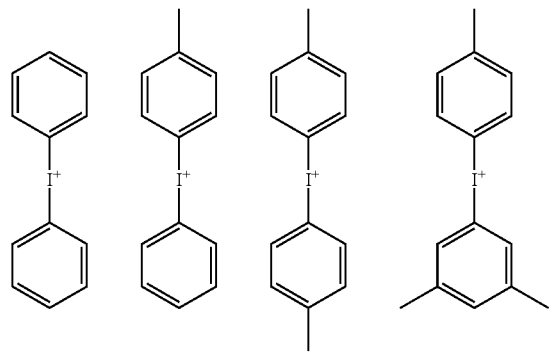

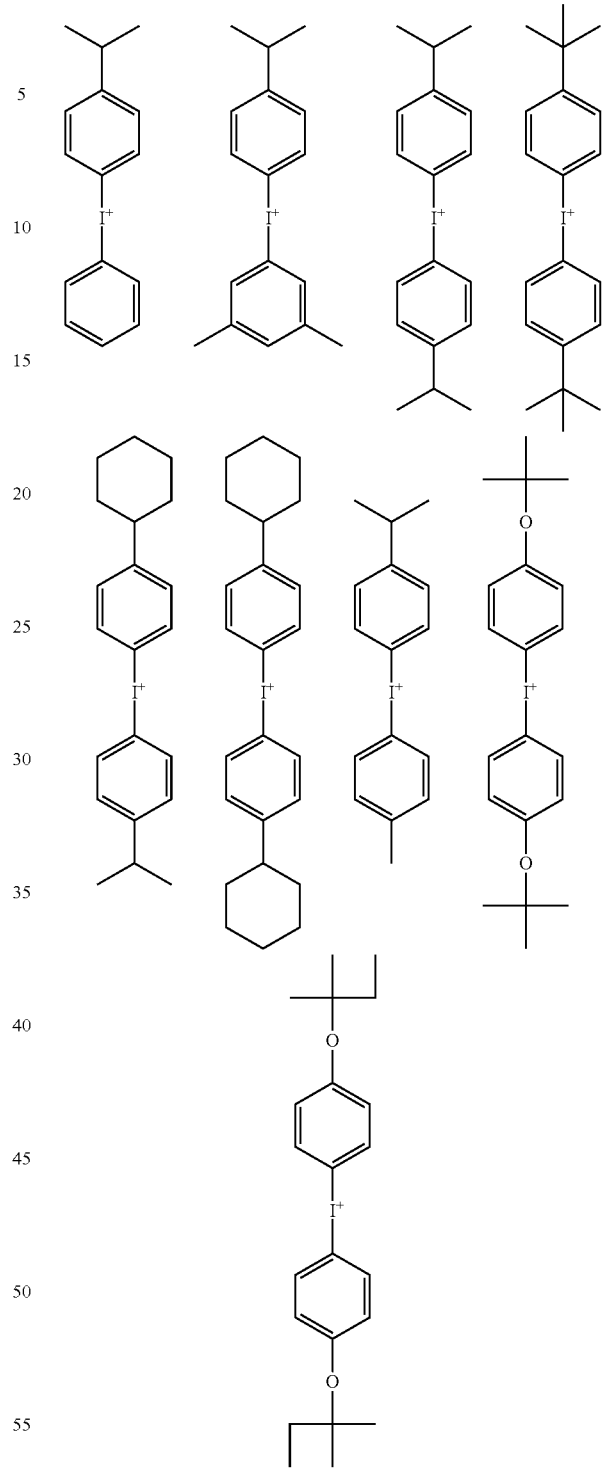

As an example of methods for synthesizing the sulfonium salt shown by the formula (A-1) and the iodonium salt shown by the formula (A-2), there is a method involving ion exchange with a sulfonium salt or iodonium salt of a weaker acid than the iodinated benzoyloxy group-containing fluorinated sulfonic acid. Examples of the weaker acid than the iodinated benzoyloxy group-containing fluorinated sulfonic acid include carbonic acid and the like. Alternatively, the synthesis is also possible through ion exchange between a sodium salt or ammonium salt of the iodinated benzoyloxy group-containing fluorinated sulfonic acid and a sulfonium chloride salt or an iodonium chloride salt.

The inventive resist composition contains the sulfonium salt shown by the formula (A-1) and/or the iodonium salt shown by the formula (A-2) in an amount of preferably 0.01 to 100 parts by mass, more preferably 0.05 to 50 parts by mass, based on 100 parts by mass of the base polymer described below, from the viewpoints of sensitivity and the effect of suppressing acid diffusion.

[(B) Base Polymer]

The base polymer (B) contained in the inventive negative resist composition is a polymer (hereinafter also referred to as polymer B) containing a repeating unit shown by the following formula (B1) (hereinafter also referred to as repeating unit B1) and a repeating unit shown by the following formula (B2) (hereinafter also referred to as repeating unit B2). The repeating unit B1 is a repeating unit which imparts etching durability, adhesion to a substrate, and solubility to an alkaline developer. The repeating unit B2 is a repeating unit in which the acid-eliminable group leaves (elimination reaction) by action of an acid generated from the acid generator upon irradiation with high energy beam, thereby inducing alkali insolubilization and crosslinking reaction between polymers. By the action of the repeating unit B2, the negative reaction can more efficiently proceed, thus making it possible to improve the resolution.

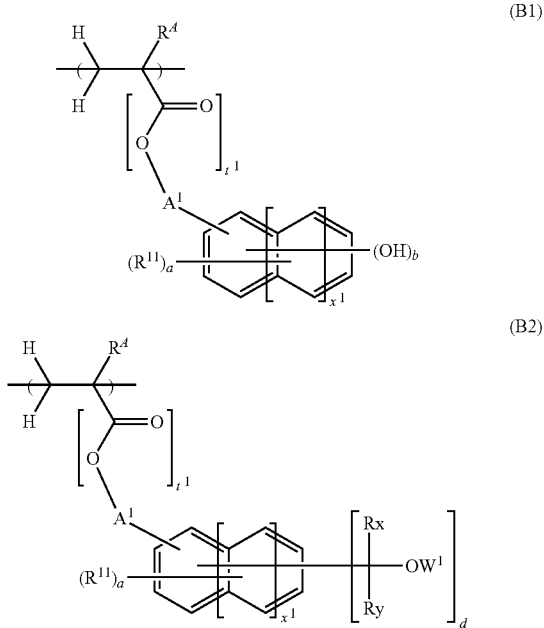

In the formulae, $R^A$ represents a hydrogen atom, a fluorine atom, a methyl group, or a trifluoromethyl group. $R^{11}$'s each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted. $R^{12}$'s each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted.

$A^1$ represents a single bond or a linear, branched, or cyclic alkylene group having 1 to 10 carbon atoms and optionally having an ether bond interposed in a carbon-carbon bond. $W^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond. Rx and Ry each independently represent a hydrogen atom, an alkyl group having 1 to 15 carbon atoms optionally substituted with a hydroxy group or an alkoxy group, or a monovalent aromatic group optionally having a substituent. Nevertheless, not both of Rx and Ry are hydrogen atoms simultaneously. Alternatively, Rx and Ry optionally bond with each other to form a ring with a carbon atom bonded to Rx and Ry. $t^1$ represents 0 or 1. $x^1$ represents an integer of 0 to 2. "a" represents an integer satisfying $0 \leq a \leq 5+2x^1-b$. "c" represents an integer satisfying $0 \leq c \leq 5+2x^1-d$. "b" and "d" each represent an integer of 1 to 3.

Examples of the alkylene group represented by $A^1$ include a methylene group, an ethylene group, a propylene group, a butylene group, a pentylene group, a hexylene group, structural isomers with carbon skeleton having a branched or cyclic structure, and the like. When the alkylene group contains an ether bond and $t^1$ in the formula (B1) is 1, the ether bond may be at any position except for positions between α-carbon and β-carbon with respect to the ester oxygen. Meanwhile, when $t^1$ is 0, the atom bonded to the main chain is the ether oxygen, and a second ether bond may be inserted at any position except for positions between α-carbon and β-carbon with respect to the ether oxygen. Note that the number of carbon atoms of the alkylene group is preferably 10 or less because sufficient solubility to an alkaline developer can be obtained.

Preferable examples of hydrocarbon portions of the acyloxy group, the alkyl group, and the alkoxy group represented by $R^{11}$ and $R^{12}$ include a methyl group, an ethyl group, a propyl group, an isopropyl group, a butyl group, a pentyl group, a hexyl group, structural isomers with carbon skeleton having a branched or cyclic structure, and the like. When the number of carbon atoms in $R^{11}$ and $R^{12}$ is the aforementioned upper limits or less, the solubility to an alkaline developer is favorable.

In the formula (B1), $x^1$ represents an integer of 0 to 2. More specifically, the formula (B1) shows a benzene skeleton when $x^1$ is 0, a naphthalene skeleton when $x^1$ is 1, and an anthracene skeleton when $x^1$ is 2. "a" is an integer satisfying $0 \leq a \leq 5+2x^1-b$; when $x^1$ is 0, it is preferable that "a" be an integer of 0 to 3 and "b" be an integer of 1 to 3; and when $x^1$ is 1 or 2, it is preferable that "a" be an integer of 0 to 4 and "b" be an integer of 1 to 3.

In order to obtain high resolution by establishing a high contrast between a portion turned negative by irradiation with high energy beam and a portion not irradiated therewith (portion not turned negative), the lower limit of the content of the repeating unit B1 in all the repeating units constituting the polymer B is preferably 40 mol %, more preferably 50 mol %, while the upper limit is preferably 90 mol %, more preferably 80 mol %.

When $t^1$ is 0 and $A^1$ is a single bond, that is, when the aromatic ring is directly bonded to the main chain of the polymer compound (i.e., no linker), preferable examples of the repeating unit B1 include units derived from 3-hydroxystyrene, 4-hydroxystyrene, 5-hydroxy-2-vinylnaphthalene, 6-hydroxy-2-vinylnaphthalene, and the like. Above all, a repeating unit shown by the following formula (B5), for example, is more preferable:

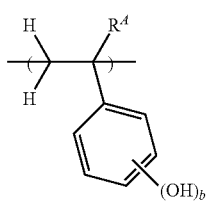 (B5)

where R^A and "b" are as defined above.

Meanwhile, when $t^1$ is 1, in other words, when the repeating unit B1 has an ester skeleton as the linker, preferable examples of the repeating unit B1 include ones shown below, but are not limited thereto. Incidentally, the preferable examples of the repeating unit B1 mentioned in the preceding paragraph are also shown, but are not limited to the following.

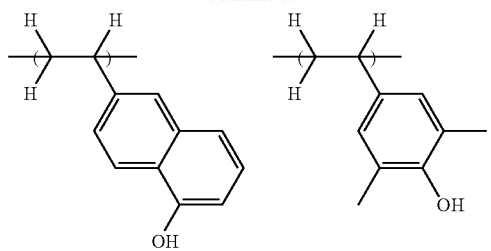

-continued

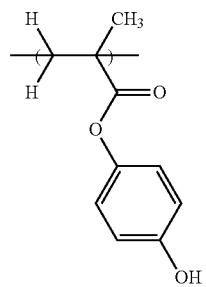
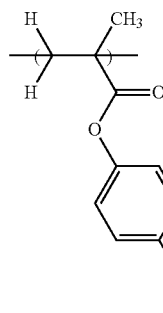
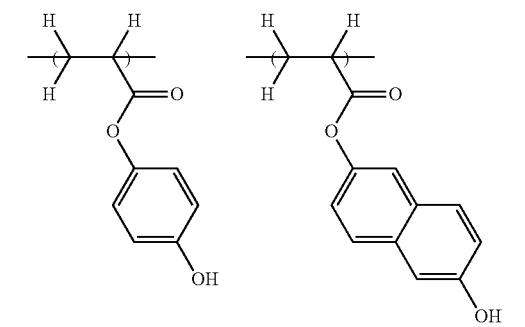
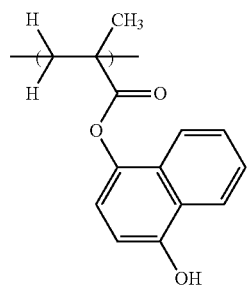
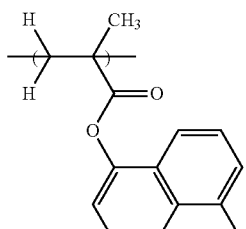
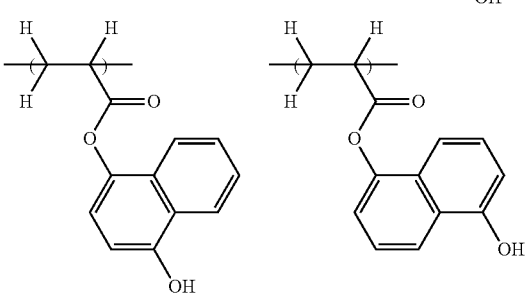
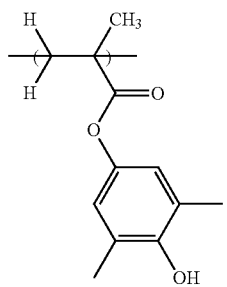
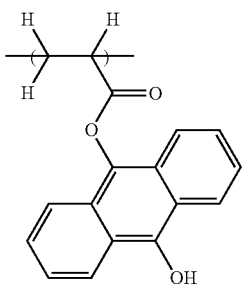
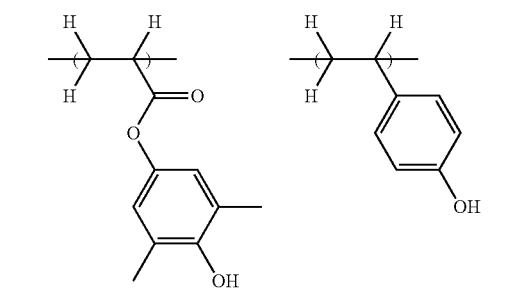
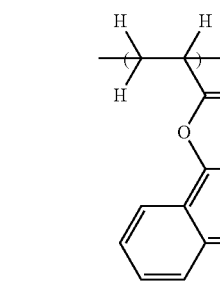
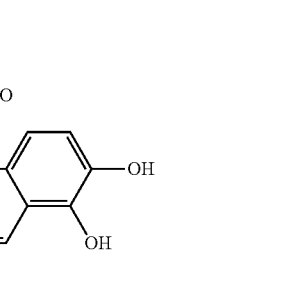
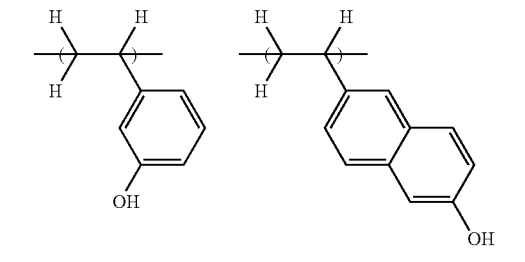
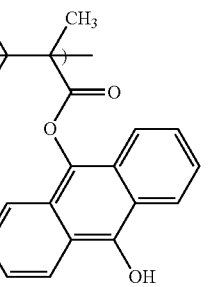
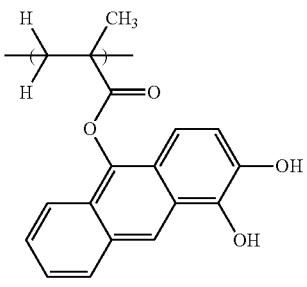

-continued

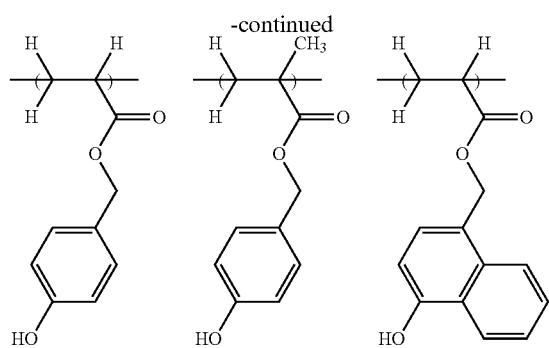

When the repeating unit B2 is irradiated with a high energy beam, the acid-eliminable group undergoes elimination reaction by action of an acid generated from the acid generator, so that the repeating unit B2 induces alkali insolubilization and crosslinking reaction between polymers. Since the repeating unit B2 functions to enable the negative reaction to more efficiently progress, the resolution can be improved.

Examples of the monovalent aromatic group or the aliphatic monovalent hydrocarbon group represented by $W^1$ include a methyl group, an ethyl group, a propyl group, an isopropyl group, a cyclopentyl group, a cyclohexyl group, an adamantyl group, a methylcarbonyl group, a phenyl group, and the like.

Preferable examples of Rx or Ry include a methyl group, an ethyl group, a propyl group, a butyl group, structural isomers thereof, and these groups having some hydrogen atoms substituted with a hydroxy group or an alkoxy group.

$x^1$ represents an integer of 0 to 2. More specifically, the formula (B2) shows a benzene ring when $x^1$ is 0, a naphthalene ring when $x^1$ is 1, and an anthracene ring when $x^1$ is 2.

Examples of the alkylene group represented by $A^1$ include a methylene group, an ethylene group, a propylene group, a butylene group, a pentylene group, a hexylene group, structural isomers with carbon skeleton having a branched or cyclic structure, and the like. When the alkylene group contains an ether bond and $t^1$ in the formula (B2) is 1, the ether bond may be at any position except for positions between α-carbon and β-carbon with respect to the ester oxygen. Meanwhile, when $t^1$ is 0, the atom bonded to the main chain is the ether oxygen, and a second ether bond may be inserted at any position except for positions between α-carbon and β-carbon with respect to the ether oxygen.

The repeating unit B2 is preferably a repeating unit shown by the following formula (B6):

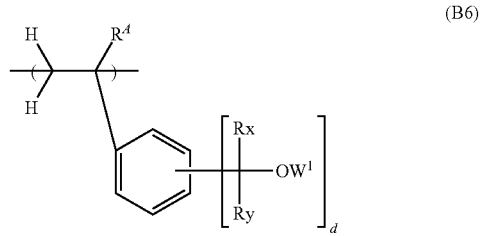

(B6)

where $R^A$, Rx, Ry, $W^1$ and "d" are as defined above.

Preferable examples of the repeating unit B2 also include ones shown below, but are not limited thereto. Note that, in the following examples, Me represents a methyl group, and Ac represents an acetyl group.

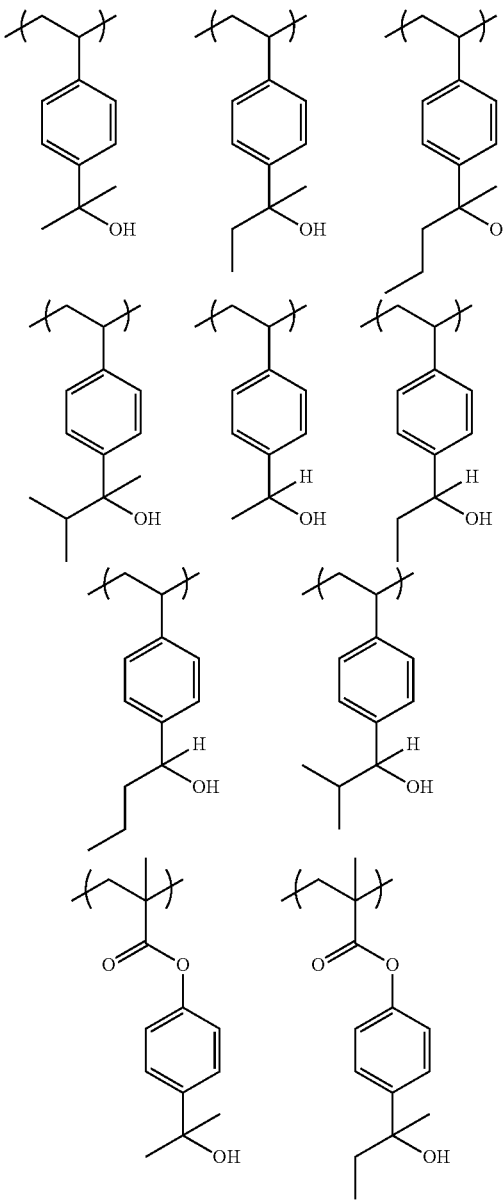

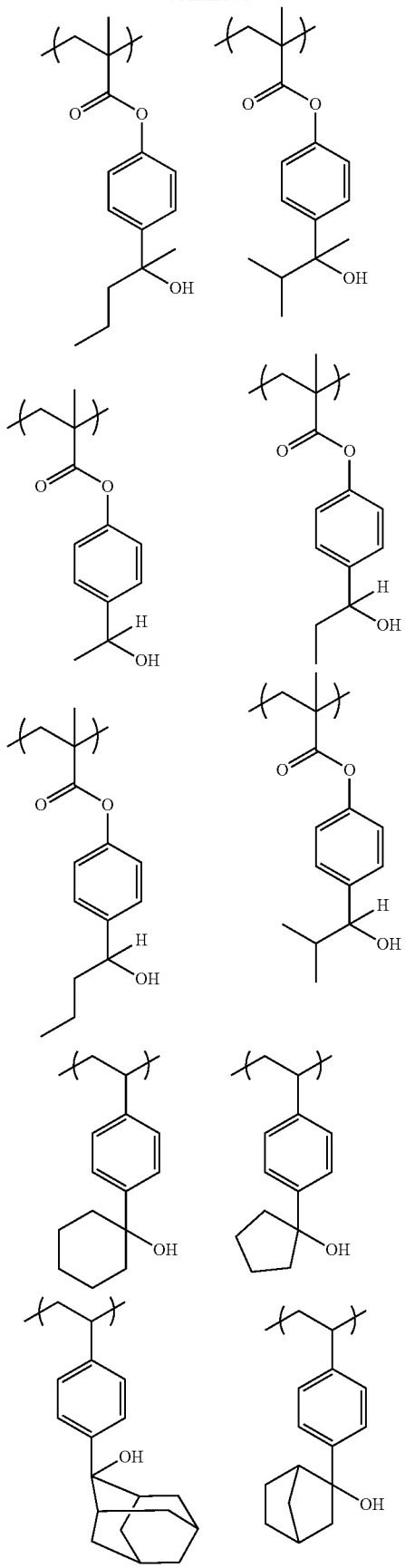
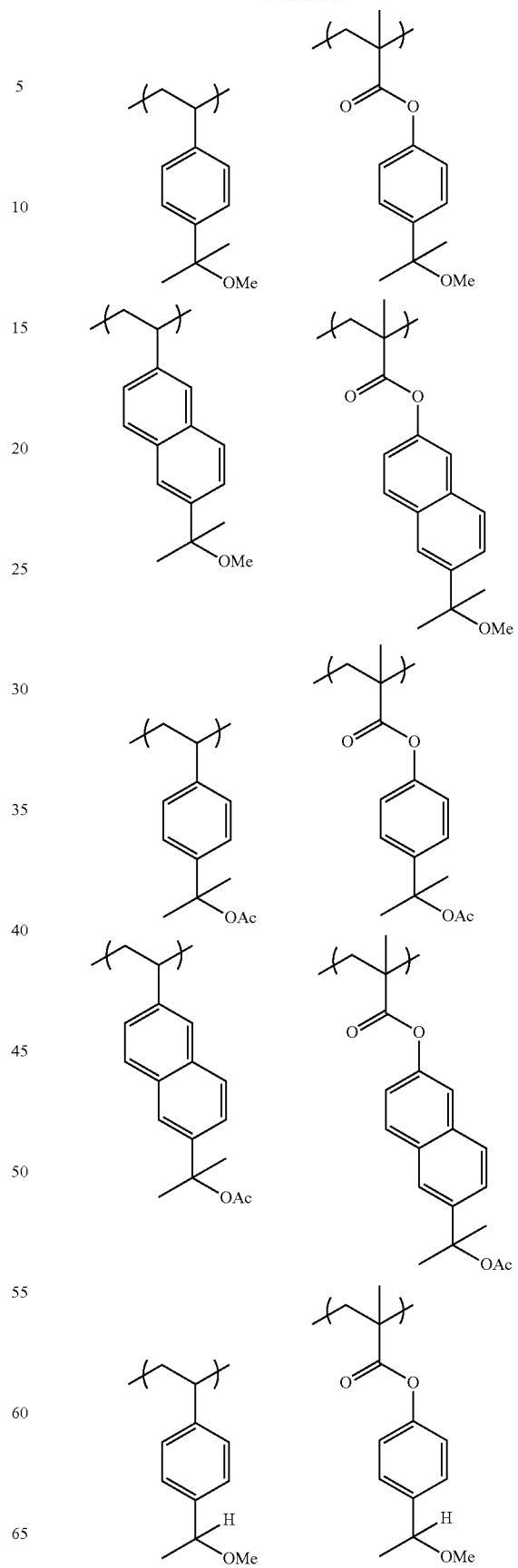

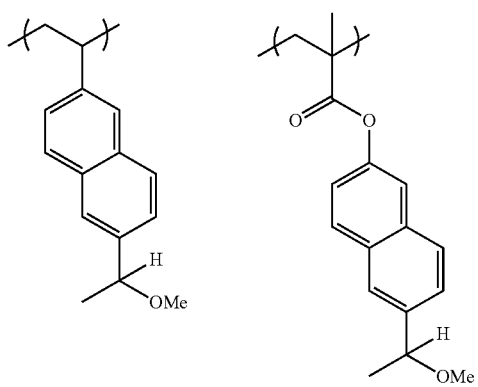
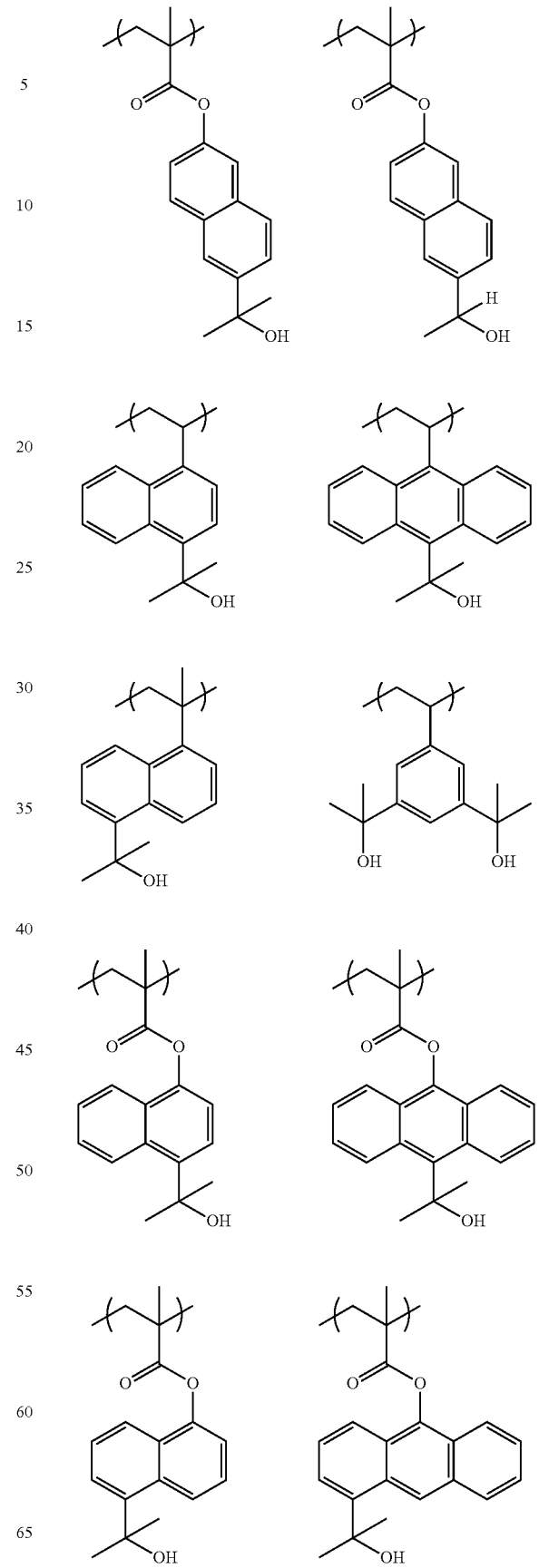

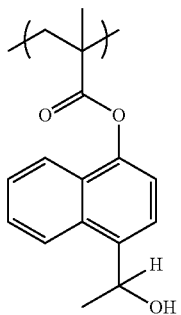 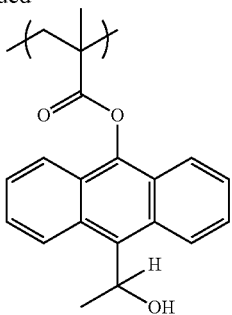 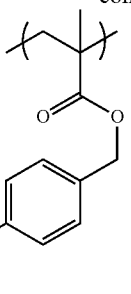 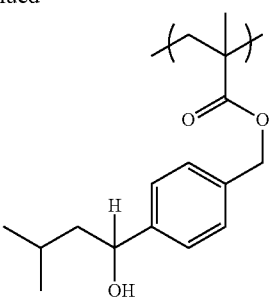
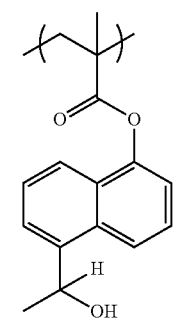 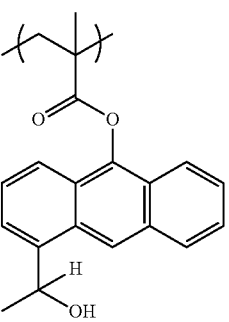 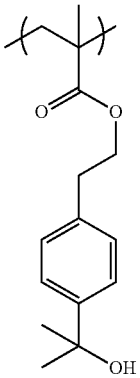 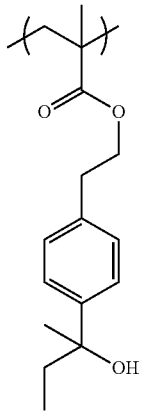
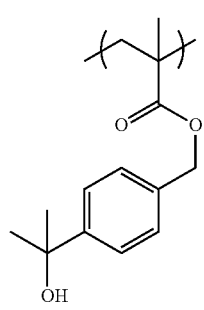 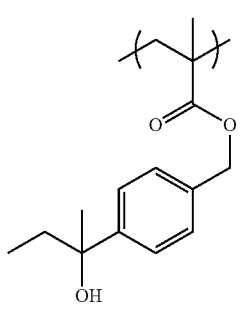 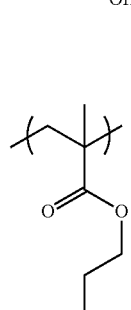 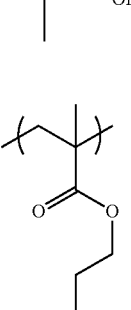
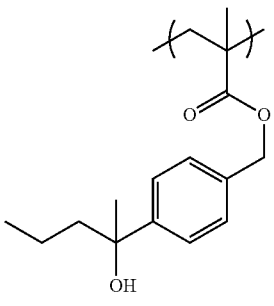 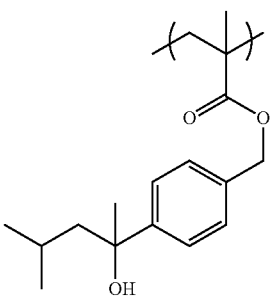 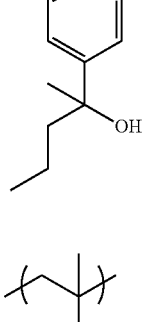 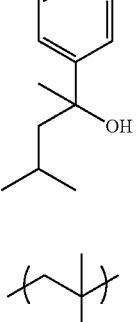
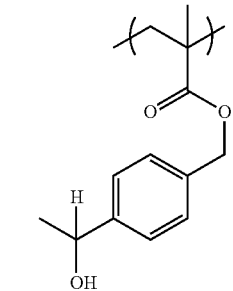 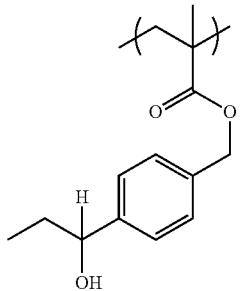 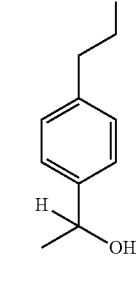 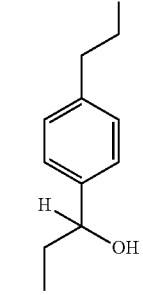

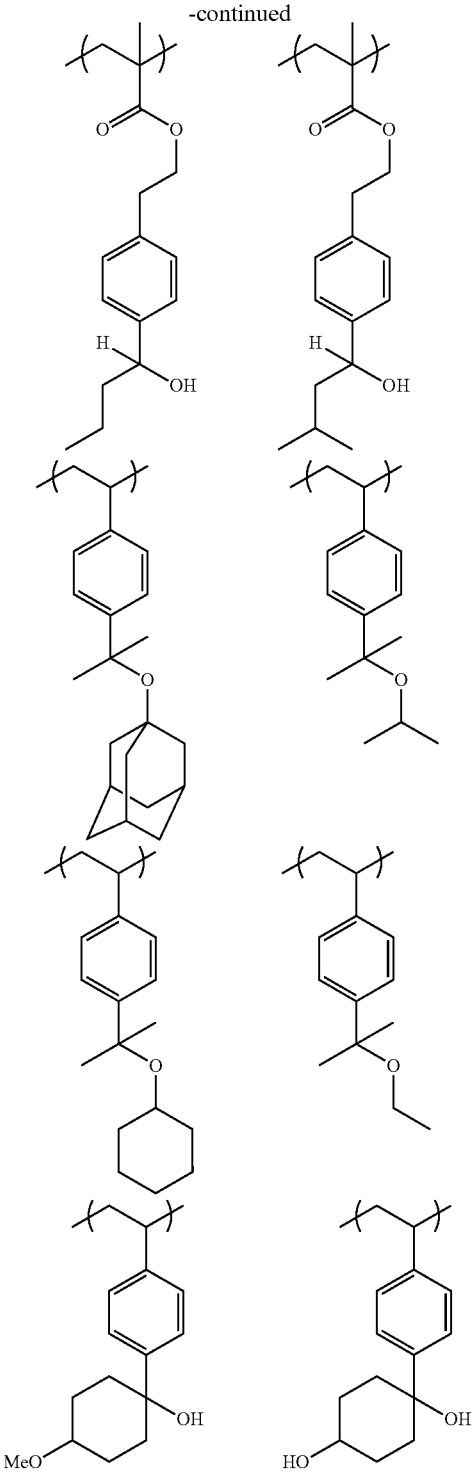

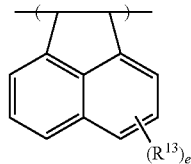

(B3)

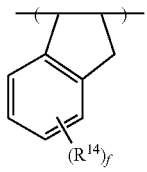

(B4)

reaction can progress more efficiently by the action of the repeating unit B6. Thus, the resolution can be further improved.

To improve the etching durability, the base polymer B may further contain at least one repeating unit selected from a repeating unit shown by the following formula (B3) (hereinafter also referred to as repeating unit B3) and a repeating unit shown by the following formula (B4) (hereinafter also referred to as repeating unit B4).

In the formulae, $R^{13}$ and $R^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted. "e" and "f" each independently represent an integer of 0 to 4.

When at least one of the repeating units B3 and B4 is used as a constitutional unit, the etching durability is obtained by the aromatic ring(s), and also the effect of improving the durability to electron beam irradiation in etching and pattern inspection is obtained because of the cyclic structure(s) added to the main chain.

One kind of each of the repeating units B3 and B4 may be used alone, or two or more kinds thereof may be used in combination. To obtain the effect of improving the etching durability, the lower limit of the content of the repeating units B3 and B4 in all the repeating units constituting the polymer B is preferably 2 mol %, more preferably 5 mol %, while the upper limit is preferably 30 mol %, more preferably 20 mol %.

[(C) Crosslinking Agent]

In the present invention, a crosslinking agent may be blended. In the case of negative resist compositions, adding a crosslinking agent reduces the dissolution rate of an exposed portion, so that a negative pattern can be obtained.

Specific examples of the crosslinking agent usable in the present invention include: epoxy compounds, melamine compounds, guanamine compounds, glycoluril compounds, urea compounds, isocyanate compounds, and azide compounds all of which are optionally substituted with at least one group selected from a methylol group, an alkoxymethyl group, and an acyloxymethyl group; compounds containing a double bond such as an alkenyl ether group; and the like. These may be used as an additive, or introduced into a The lower limit of the content of the repeating unit B2 in all the repeating units constituting the polymer B is preferably 5 mol %, more preferably 10 mol %, while the upper limit is preferably 70 mol %, more preferably 60 mol %.

Particularly, when the polymer B contains the repeating unit B5 and the repeating unit B6, the etching durability is further improved and the adhesion to a substrate and the solubility to an alkaline developer are also improved by the action of the repeating unit B5. Moreover, the negative polymer side chain as a pendant group. Additionally, compounds containing a hydroxy group can also be used as a crosslinking agent.

Among these crosslinking agents, examples of the epoxy compounds include tris(2,3-epoxypropyl)isocyanurate, trimethylolmethane triglycidyl ether, trimethylolpropane triglycidyl ether, triethylolethane triglycidyl ether, and the like.

Examples of the melamine compounds include hexamethylolmelamine, hexamethoxymethylmelamine, such compounds as hexamethylolmelamine having 1 to 6 methylol groups methoxymethylated, and mixtures thereof; and hexamethoxyethylmelamine, hexaacyloxymethylmelamine, such compounds as hexamethylolmelamine having 1 to 6 methylol groups acyloxymethylated, and mixtures thereof.

Examples of the guanamine compounds include tetramethylolguanamine, tetramethoxymethylguanamine, such compounds as tetramethylolguanamine having 1 to 4 methylol groups methoxymethylated, and mixtures thereof; and tetramethoxyethylguanamine, tetraacyloxyguanamine, such compounds as tetramethylolguanamine having 1 to 4 methylol groups acyloxymethylated, and mixtures thereof.

Examples of the glycoluril compounds include tetramethylolglycoluril, tetramethoxyglycoluril, tetramethoxymethylglycoluril, such compounds as tetramethylolglycoluril having 1 to 4 methylol groups methoxymethylated, and mixtures thereof; and such compounds as tetramethylolglycoluril having 1 to 4 methylol groups acyloxymethylated, and mixtures thereof.

Examples of the urea compounds include tetramethylol urea, tetramethoxymethyl urea, tetramethoxyethyl urea, such compounds as tetramethylol urea having 1 to 4 methylol groups methoxymethylated, mixtures thereof, and the like.

Examples of the isocyanate compounds include tolylene diisocyanate, diphenylmethane diisocyanate, hexamethylene diisocyanate, cyclohexane diisocyanate, and the like.

Examples of the azide compounds include 1,1'-biphenyl-4,4'-bisazide, 4,4'-methylidene bisazide, 4,4'-oxybisazide, and the like.

Examples of the compounds containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and the like.

The crosslinking agent (C) is blended in an amount of preferably 2 to 50 parts by mass, more preferably 5 to 30 parts by mass, based on 100 parts by mass of the base polymer. Within these ranges, there is a low risk of pattern merging and resolution reduction. One kind of the crosslinking agent (C) can be used alone, or two or more kinds thereof can be used in combination.

[Other Components]

The inventive chemically-amplified negative resist composition can be blended in an appropriate combination with, other than the above-described components, a quencher, an organic solvent, a surfactant, and the like as necessary besides the crosslinking agent. Constituting the negative resist composition in this manner makes it possible to reduce the solubility to an alkaline developer in comparison with negative patterns formed by using conventional negative resist compositions, and to form a favorable pattern profile with little top loss. Further, the resist film has high dissolution contrast and resolution, exposure latitude, excellent process adaptability, and favorable pattern profile after the exposure. Furthermore, since the acid diffusion can be particularly suppressed, the difference in dimension between dense and sparse patterns is small. From these, the inventive chemically-amplified negative resist composition is highly practical and usable as a quite effective resist material for very large scale integration (VLSI).

Quencher

The inventive resist composition may be blended with a quencher. Examples of the quencher include conventional basic compounds. Examples of the conventional basic compounds include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, and the like. Particularly preferable are primary, secondary, and tertiary amine compounds disclosed in paragraphs [0146] to [0164] of Japanese Unexamined Patent Application Publication No. 2008-111103, especially amine compounds having a hydroxy group, an ether group, an ester group, lactone ring, a cyano group, or a sulfonic acid ester group; or compounds having a carbamate group disclosed in Japanese Patent No. 3790649, etc. Adding such a basic compound can, for example, further suppress the diffusion rate of acid in the resist film and correct the shape.

Other examples of the quencher include onium salts such as sulfonium salts, iodonium salts, and ammonium salts of carboxylic acids not fluorinated at a position disclosed in Japanese Unexamined Patent Application Publication No. 2008-158339. While α-fluorinated sulfonic acid, imide acid, or methide acid is necessary to deprotect the acid labile group, the carboxylic acid not fluorinated at α position is released by salt exchange with the onium salt not fluorinated at α position. The carboxylic acid not fluorinated at α position hardly induces deprotection reaction, and thus functions as a quencher.

Another example of the quencher includes a polymeric quencher disclosed in Japanese Unexamined Patent Application Publication No. 2008-239918. This quencher is oriented on the resist surface after coating, and enhances the rectangularity of the resist after patterning. The polymeric quencher also has effects of preventing rounding of pattern top and film thickness loss of pattern when a top coat for immersion lithography is applied.

The inventive resist composition contains the quencher in an amount of preferably 0 to 5 parts by mass, more preferably 0 to 4 parts by mass, based on 100 parts by mass of the base polymer.

Organic Solvent

The inventive negative resist composition may contain an organic solvent as an optional component. The organic solvent is not particularly limited, as long as it is capable of dissolving the above-described components. Examples of such an organic solvent include those disclosed in paragraphs [0144] to [0145] of Japanese Unexamined Patent Application Publication No. 2008-111103: ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-t-butyl ether acetate; lactones such as γ-butyrolactone; and mixed solvents thereof. When an acetal-based acid labile group is used, a high-boiling-point alcohol-based solvent, specifically, diethylene glycol, propylene glycol, glycerin, 1,4-butanediol, 1,3-butanediol, etc., may be added in order to accelerate deprotection reaction of the acetal.

Among these organic solvents, 1-ethoxy-2-propanol, propylene glycol monomethyl ether acetate, cyclohexanone, γ-butyrolactone, and mixed solvents thereof are preferable because of particularly excellent solubility of the component (A) as a photo-acid generator.

The organic solvent is used in an amount of preferably 200 to 12,000 parts by mass, more preferably 400 to 10000 parts by mass, based on 100 parts by mass of the base resin (B).

Surfactant

A surfactant conventionally used to improve the coating property onto a substrate to be processed may be added to the inventive resist composition. When a surfactant is used, there are many known surfactants including PF-636 (manufactured by OMNOVA SOLUTIONS Inc.) and FC-4430 (manufactured by 3M) as described in Japanese Unexamined Patent Application Publication No. 2004-115630, which can be referred to as option. The content of the surfactant is preferably 0 to 5 parts by mass based on 100 parts by mass of the base polymer (B).

[Resist Patterning Process]

The inventive resist patterning process includes steps of:

forming a resist film by using the above-described inventive chemically-amplified negative resist composition on a substrate to be processed;

irradiating the resist film with a high energy beam to form a pattern (exposing the resist film to KrF excimer laser beam, EB, EUV, or the like); and developing the exposed resist film by using an alkaline developer.

As the substrate, it is possible to use, for example, a substrate for manufacturing an integrated circuit (such as Si, $SiO_2$, SiN, SiON, TiN, WSi, BPSG, SOG, organic antireflective film), or a substrate for manufacturing a mask circuit (such as Cr, CrO, CrON, $MoSi_2$, $SiO_2$). The resist composition is applied onto these substrates by a technique such as spin coating to a film thickness of 0.03 to 2 µm. The resulting film is prebaked on a hot plate preferably at 60 to 150° C. for 1 to 20 minutes, more preferably at 80 to 140° C. for 1 to 10 minutes. In this manner, a resist film is formed.

When KrF excimer laser beam or EUV is employed, the resist film can be exposed using a mask for forming a target pattern by irradiation with an exposure dose of preferably 1 to 200 mJ/cm², more preferably 10 to 100 mJ/cm². When EB is employed, the irradiation can be performed with an exposure dose of preferably 1 to 300 µC/cm², more preferably 10 to 200 µC/cm², to directly form a target pattern.

Then, the resultant is subjected to post exposure bake (PEB) on a hot plate preferably at 60 to 150° C. for 1 to 20 minutes, more preferably at 80 to 140° C. for 1 to 10 minutes. Further, development is carried out using a developer of 0.1 to 5 mass %, preferably 2 to 3 mass %, alkaline aqueous solution such as tetramethylammonium hydroxide (TMAH) for preferably 0.1 to 3 minutes, more preferably 0.5 to 2 minutes, by a conventional technique such as dip, puddle, or spray. In this way, a target pattern is formed on the substrate.

As means in the patterning process after the resist film formation, rinsing with pure water (post-soaking) may be performed to extract the acid generator or the like from the film surface or to wash away particles. After the exposure, rinsing (post-soaking) may be performed to remove water left on the film.

EXAMPLE

Hereinafter, the present invention will be specifically described with reference to Synthesis Examples, Examples, and Comparative Examples, but the present invention is not limited to the following Examples.

The structures of acid generators PAG-1 to PAG-17 which are sulfonium salts or iodonium salts used in resist compositions are shown below. PAG-1 to PAG-17 were each synthesized by ion exchange between an ammonium salt of iodinated benzoyloxy group-containing fluorinated sulfonic acid for providing the following anions and sulfonium chloride or iodonium chloride for providing the following cations.

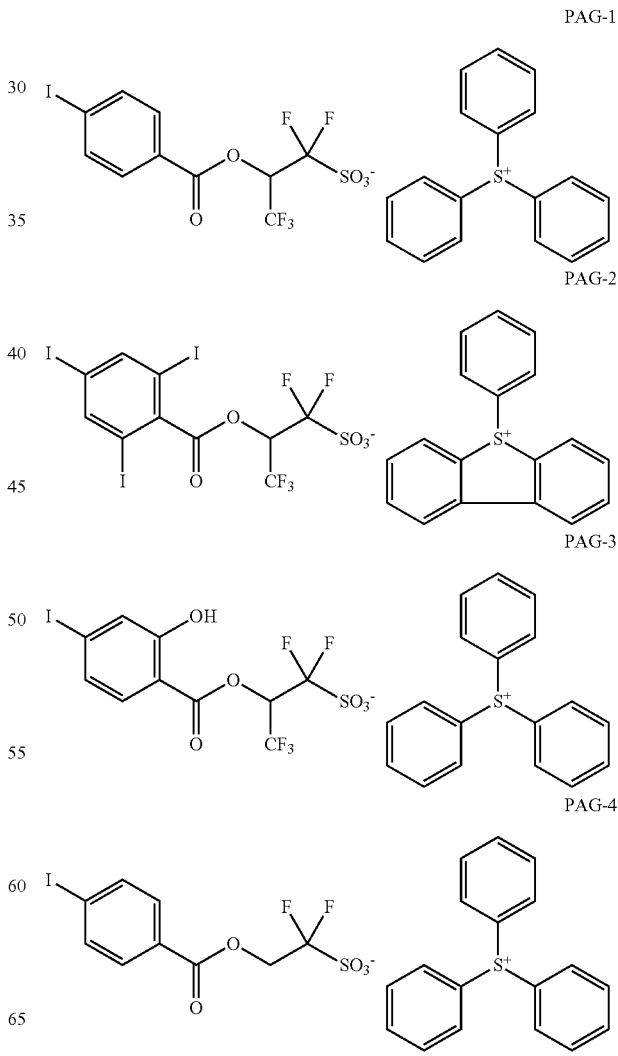

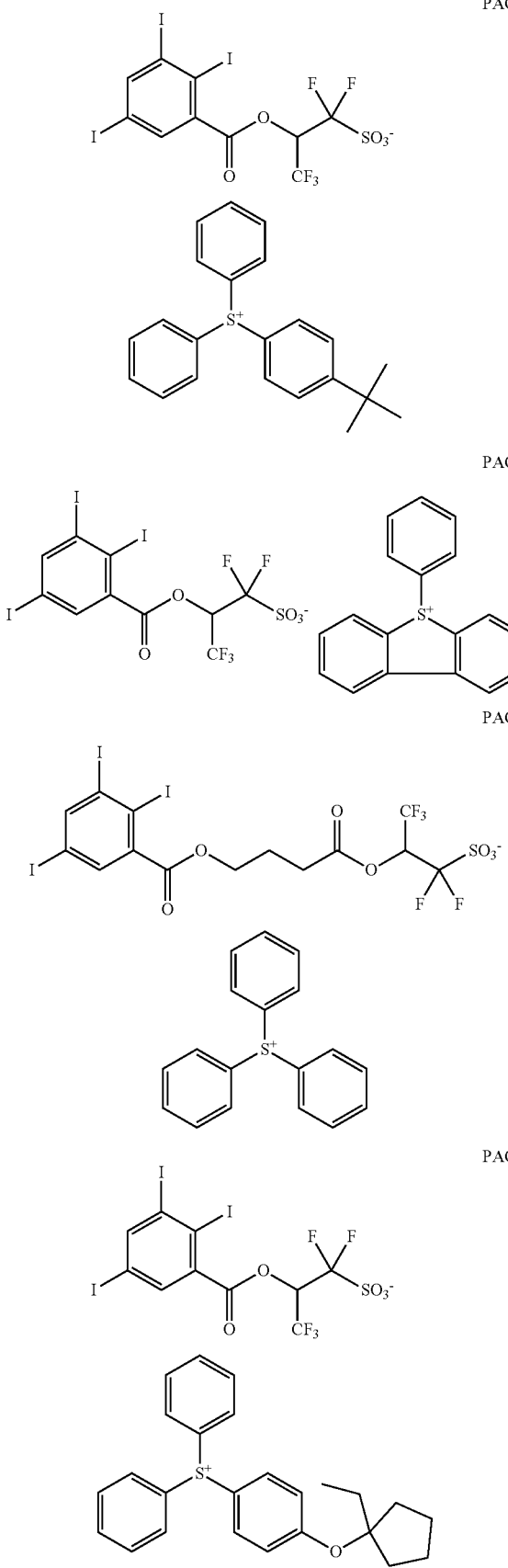
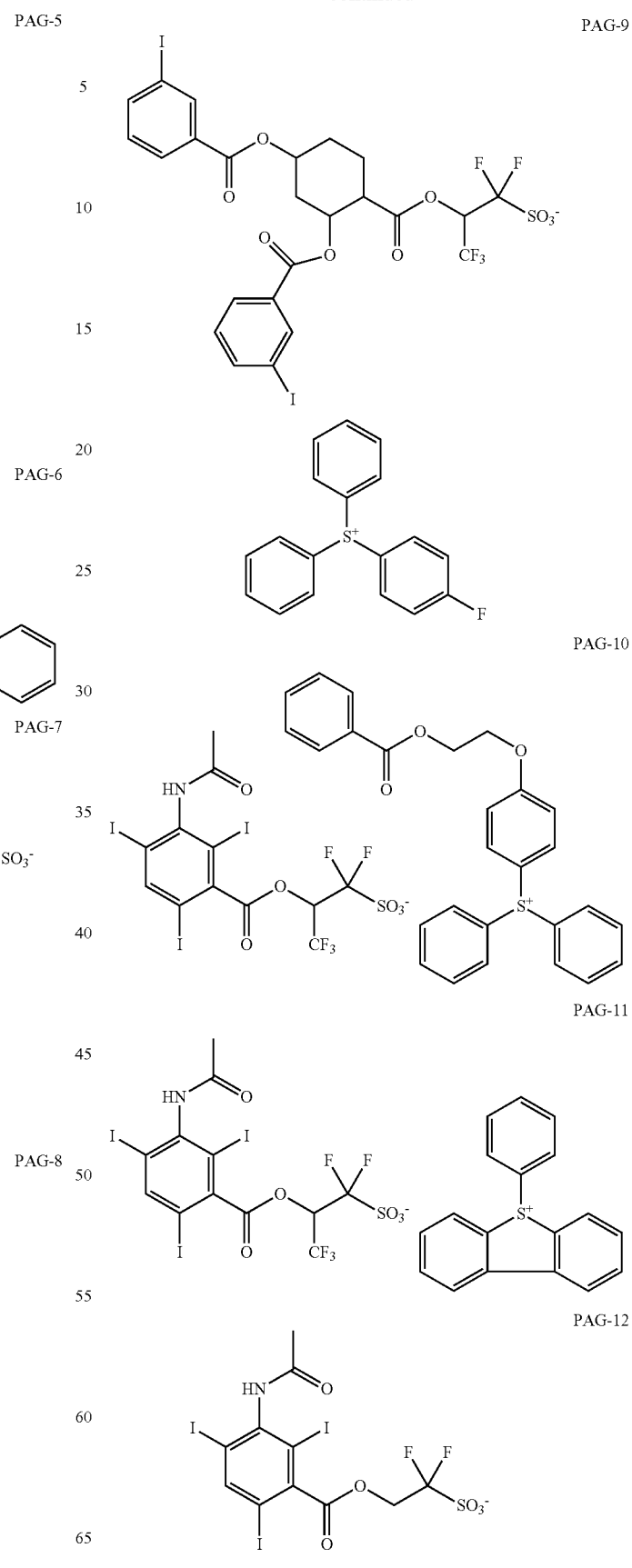

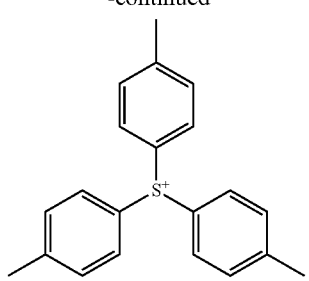
PAG-13
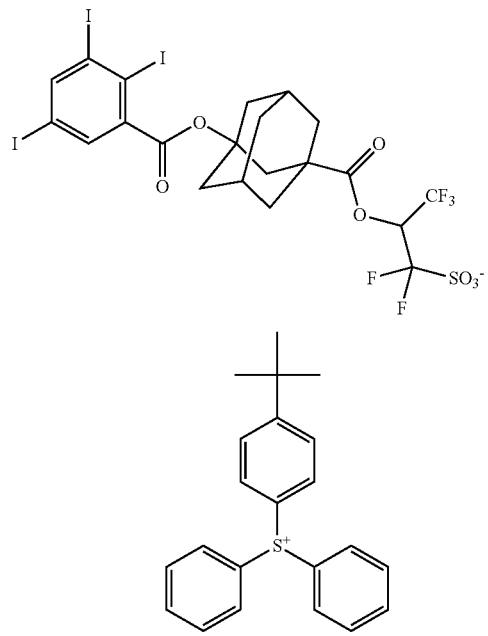
PAG-14
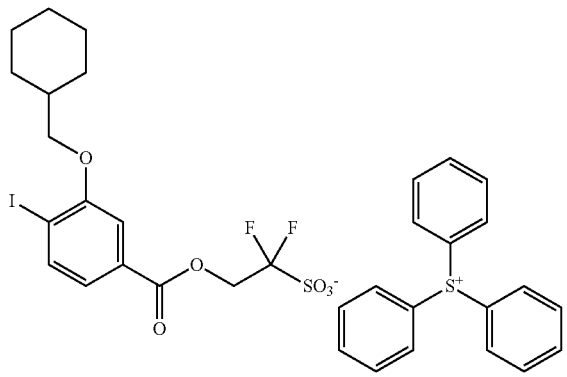
PAG-15
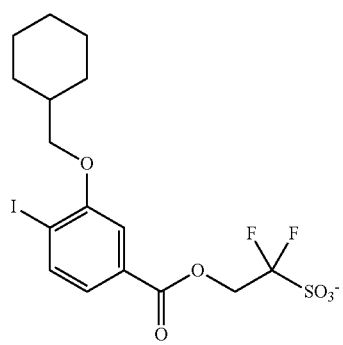
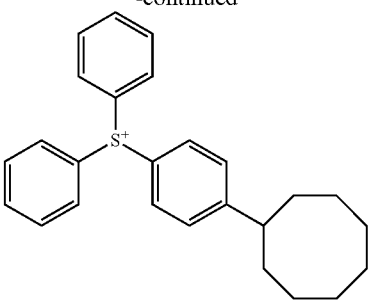
PAG-16
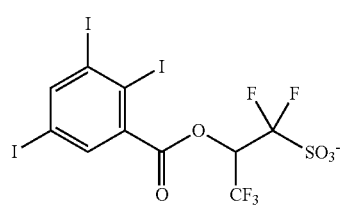
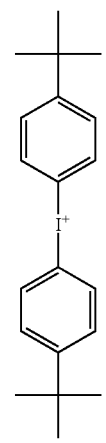
PAG-17
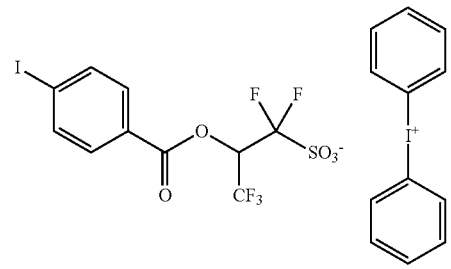
Likewise, comparative acid generators, Comparative PAG-1 to Comparative PAG-4, were synthesized and the structures are shown below.
Comparative PAG-1
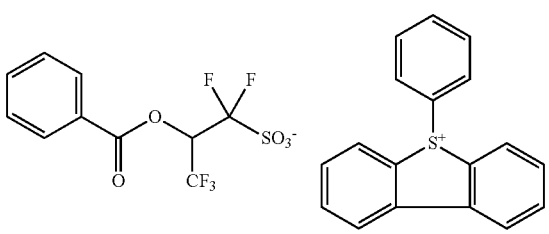

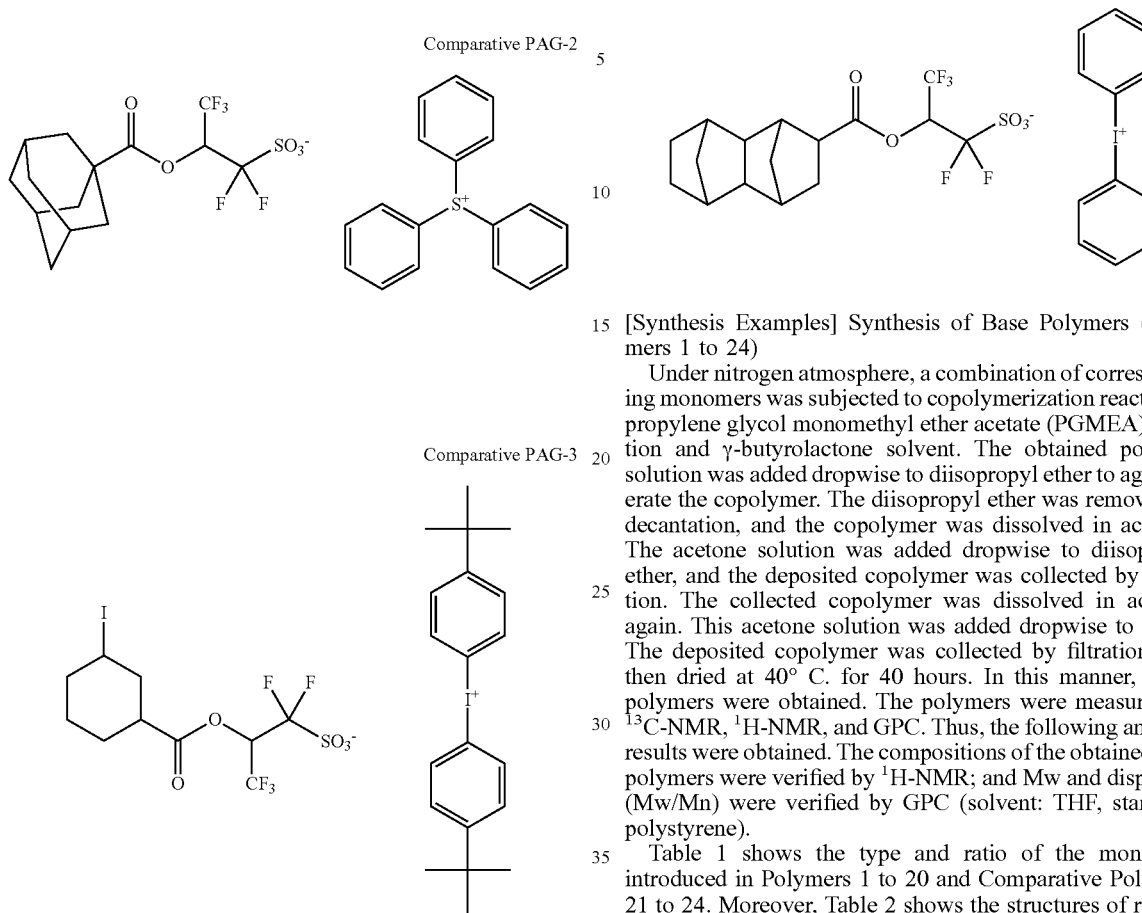

[Synthesis Examples] Synthesis of Base Polymers (Polymers 1 to 24)

Under nitrogen atmosphere, a combination of corresponding monomers was subjected to copolymerization reaction in propylene glycol monomethyl ether acetate (PGMEA) solution and γ-butyrolactone solvent. The obtained polymer solution was added dropwise to diisopropyl ether to agglomerate the copolymer. The diisopropyl ether was removed by decantation, and the copolymer was dissolved in acetone. The acetone solution was added dropwise to diisopropyl ether, and the deposited copolymer was collected by filtration. The collected copolymer was dissolved in acetone again. This acetone solution was added dropwise to water. The deposited copolymer was collected by filtration, and then dried at 40° C. for 40 hours. In this manner, white polymers were obtained. The polymers were measured by $^{13}$C-NMR, $^1$H-NMR, and GPC. Thus, the following analysis results were obtained. The compositions of the obtained base polymers were verified by $^1$H-NMR; and Mw and dispersity (Mw/Mn) were verified by GPC (solvent: THF, standard: polystyrene).

Table 1 shows the type and ratio of the monomers introduced in Polymers 1 to 20 and Comparative Polymers 21 to 24. Moreover, Table 2 shows the structures of repeating units introduced into the polymers.

TABLE 1

|  | Unit 1 | Ratio (mol %) | Unit 2 | Ratio (mol %) | Unit 3 | Ratio (mol %) | Unit 4 | Ratio (mol %) | Mw | Mw/Mn |
|---|---|---|---|---|---|---|---|---|---|---|
| Polymer 1 | B1-1 | 60 | B2-1 | 40 |  |  |  |  | 4200 | 1.62 |
| Polymer 2 | B1-1 | 50 | B2-1 | 50 |  |  |  |  | 3900 | 1.65 |
| Polymer 3 | B1-1 | 65 | B2-2 | 35 |  |  |  |  | 4100 | 1.66 |
| Polymer 4 | B1-1 | 50 | B2-3 | 50 |  |  |  |  | 5500 | 1.6 |
| Polymer 5 | B1-1 | 40 | B2-4 | 50 | B3-1 | 10 |  |  | 4300 | 1.59 |
| Polymer 6 | B1-1 | 40 | B2-5 | 50 | B3-1 | 10 |  |  | 4400 | 1.65 |
| Polymer 7 | B1-2 | 60 | B2-1 | 40 |  |  |  |  | 4000 | 1.68 |
| Polymer 8 | B1-2 | 50 | B2-1 | 50 |  |  |  |  | 4700 | 1.67 |
| Polymer 9 | B1-2 | 55 | B2-2 | 45 |  |  |  |  | 4400 | 1.67 |
| Polymer 10 | B1-3 | 65 | B2-1 | 35 |  |  |  |  | 4300 | 1.59 |
| Polymer 11 | B1-3 | 75 | B2-1 | 25 |  |  |  |  | 5000 | 1.61 |
| Polymer 12 | B1-3 | 75 | B2-3 | 25 |  |  |  |  | 4200 | 1.66 |
| Polymer 13 | B1-3 | 60 | B2-4 | 35 | B3-1 | 5 |  |  | 5200 | 1.7 |
| Polymer 14 | B1-3 | 60 | B2-1 | 35 | B3-1 | 5 |  |  | 5500 | 1.56 |
| Polymer 15 | B1-3 | 60 | B2-1 | 35 | B4-1 | 5 |  |  | 4300 | 1.55 |
| Polymer 16 | B1-1 | 35 | B1-3 | 35 | B2-1 | 30 |  |  | 3900 | 1.61 |
| Polymer 17 | B1-1 | 30 | B1-3 | 40 | B2-1 | 25 | B3-1 | 5 | 4600 | 1.58 |
| Polymer 18 | B1-4 | 70 | B2-1 | 30 |  |  |  |  | 4900 | 1.68 |
| Polymer 19 | B1-1 | 50 | B1-4 | 20 | B2-1 | 30 |  |  | 5000 | 1.64 |
| Polymer 20 | B1-1 | 40 | B1-4 | 20 | B2-1 | 30 | B4-1 | 10 | 4500 | 1.63 |
| Comparative Polymer 21 | B1-5 | 60 | B2-1 | 40 |  |  |  |  | 4300 | 1.67 |
| Comparative Polymer 22 | B1-3 | 60 | B2-6 | 40 |  |  |  |  | 4600 | 1.71 |
| Comparative Polymer 23 | B1-3 | 70 | B2-7 | 30 |  |  |  |  | 4800 | 1.67 |
| Comparative Polymer 24 | B1-5 | 60 | B2-6 | 40 |  |  |  |  | 5100 | 1.7 |

TABLE 2
B1-1
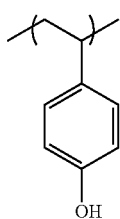
B1-2
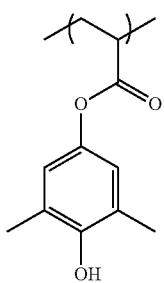
B1-3
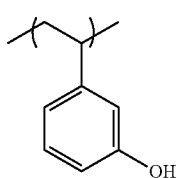
B1-4
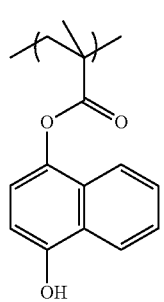
B1-5
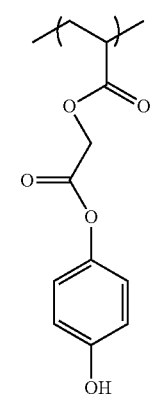
B2-1
TABLE 2-continued
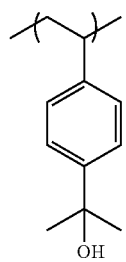
B2-2
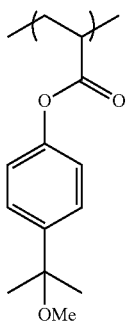
B2-3
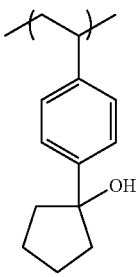
B2-4
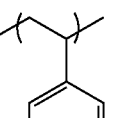
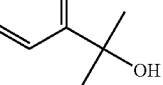
B2-5
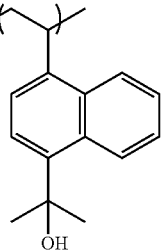
B2-6

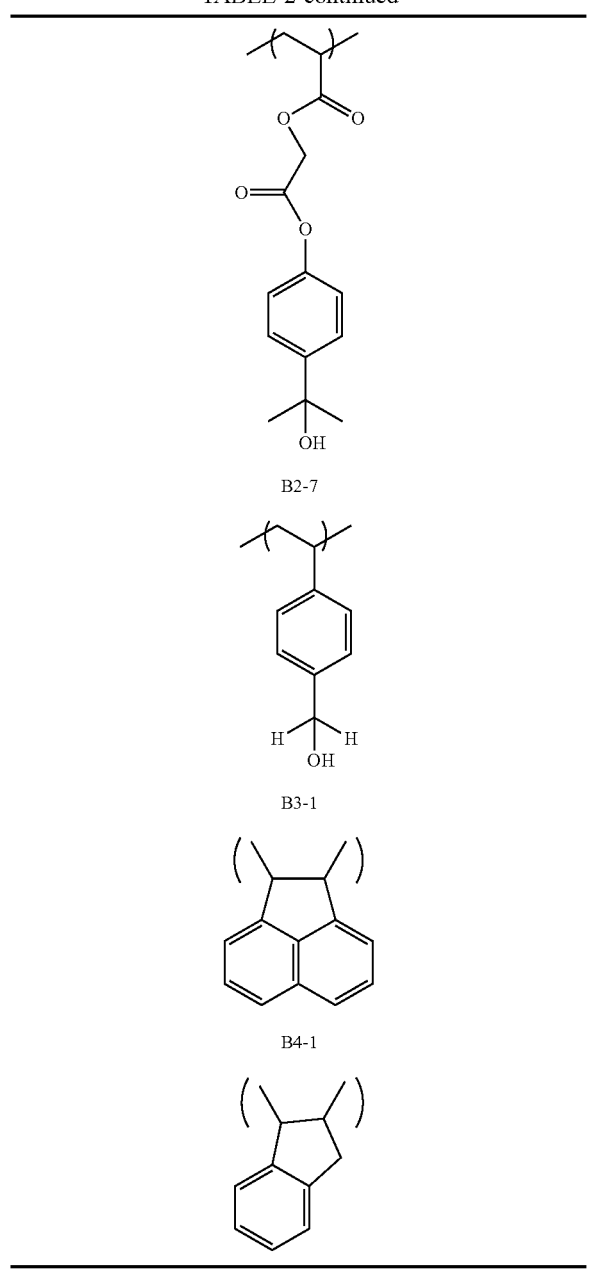

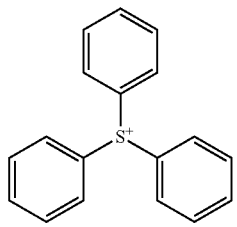

Q-1

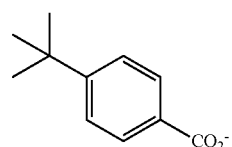

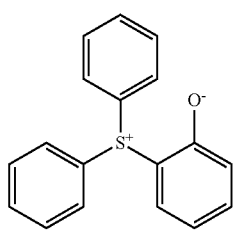

Q-2

Q-3

[Resist Composition Evaluation: Electron Beam (EB) Drawing Evaluation]

Examples 1-1 to 1-17, Comparative Examples 1-1 to 1-3

[Preparations of Negative Resist Compositions]

The base polymers (Polymers 1 to 20, Comparative Polymers 21 to 24), the acid generators (PAG-1 to PAG-17, Comparative PAG-1 to Comparative PAG-4), quenchers (Q-1 to Q-3), a crosslinking agent (tetramethoxymethylglycoluril (TMGU)), and a surfactant (PF-636, manufactured by OMNOVA SOLUTIONS Inc.) were dissolved in organic solvents to prepare solutions according to compositions shown in Tables 3 to 5 below. Each of the obtained solutions was filtered through a UPE filter and/or nylon filter with 0.02 μm size. Thus, negative resist compositions (resist materials) were prepared. As the organic solvents for the resist materials (resist compositions) in Tables 3 to 5, a mixed solvent of propylene glycol monomethyl ether acetate (PGMEA) and γ-butyrolactone (GBL) or diacetone alcohol (DAA) was used. Note that the structures of the quenchers Q1 to Q3 are as follows.

A silicon substrate was coated with an antireflective film solution (manufactured by Nissan Chemical Co., Ltd., DUV-42) and baked at 200° C. for 60 seconds to prepare an antireflective film (film thickness: 61 nm) on the substrate. This substrate was spin-coated with one of the resist compositions, and baked using a hot plate at 100° C. for 60 seconds. In this manner, 45-nm resist films were prepared. On the resultant, a dot pattern with an on-wafer size of 26 nm and a pitch of 52 nm was drawn using an electron beam writing system (ELS-F125, accelerating voltage: 125 kV) manufactured by Elionix Inc., while the exposure dose was changed from 50 μC/cm$^2$ with a step of 1 μC/cm$^2$ After the exposure, the film was baked at a temperature shown in Table 3 for 60 seconds (PEB). Then, puddle development was performed with a 2.38 mass % TMAH aqueous solution for 30 seconds, followed by rinsing with pure water and spin drying. Thus, negative type patterns were obtained. The dot patterns after the development were observed with CD-SEM (S9380) manufactured by Hitachi High-Technologies Corporation. The sensitivity, exposure latitude, and CDU were evaluated according to the following methods. Table 3 shows the results.

[Sensitivity Evaluation]

As the sensitivity, an optimum exposure dose $E_{op}$ ($\mu C/cm^2$) was determined at which a dot pattern with a size of 26 nm and a pitch of 52 nm was obtained in [Electron Beam (EB) Drawing Evaluation]. The smaller the value, the higher the sensitivity.

[Exposure Latitude (EL) Evaluation]

In the EL evaluation, EL (unit: %) was determined according to the following equation from exposure doses forming the dot patterns which were obtained in [Electron Beam (EB) Drawing Evaluation] to have a size within a range of 26 nm±10% (23 nm to 29 nm). The larger the value, the more favorable.

$$EL\ (\%) = (|E_1 - E_2|/E_{op}) \times 100$$

$E_1$: optimum exposure dose providing a dot pattern with a size of 23 nm and a pitch of 52 nm $E_2$: optimum exposure dose providing a dot pattern with a size of 29 nm and a pitch of 52 nm $E_{op}$: optimum exposure dose providing a dot pattern with a size of 26 nm and a pitch of 52 nm

[Critical Dimension Uniformity (CDU) Evaluation]

The size of the dot pattern obtained in [Electron Beam (EB) Drawing Evaluation] by the irradiation at the optimum exposure dose in the sensitivity evaluation was measured at ten positions (nine CH patterns per position) in the single exposure-dose shot. Based on this result, the triple value (3σ) of the standard deviation (σ) was determined as critical dimension uniformity (CDU). The smaller the value, the more excellent the critical dimension uniformity of the dot pattern.

Table 3 shows the results.

TABLE 3

| Resist material | Polymer (parts by mass) | Acid generator (parts by mass) | Quencher (parts by mass) | Cross-linker (parts by mass) | Surfactant (parts by mass) | Organic solvent (parts by mass) | | | PEB (°C.) | Sensitivity ($\mu C/cm^2$) | EL (%) | CDU (nm) |
|---|---|---|---|---|---|---|---|---|---|---|---|---|
| Example 1-1 | R-1 | Polymer 1 (100) | PAG-1(14) | Q-1(5) | — | PF636 (0.08) | PGMEA (4400) | GBL (1100) | | 130 | 172 | 14.2 | 3.5 |
| Example 1-2 | R-2 | Polymer 2 (100) | PAG-1(14) | Q-1(5) | — | PF636 (0.08) | PGMEA (4400) | GBL (1100) | | 130 | 160 | 15.5 | 3.7 |
| Example 1-3 | R-3 | Polymer 3 (100) | PAG-1(14) | Q-1(5) | — | PF636 (0.08) | PGMEA (4400) | GBL (1100) | | 130 | 177 | 14.9 | 3.6 |
| Example 1-4 | R-4 | Polymer 4 (100) | PAG-2(14) | Q-1(5) | — | PF636 (0.08) | PGMEA (4400) | GBL (1100) | | 130 | 169 | 13.3 | 3.9 |
| Example 1-5 | R-5 | Polymer 5 (100) | PAG-3(14) | Q-1(5) | — | PF636 (0.08) | PGMEA (4400) | GBL (1100) | | 130 | 171 | 16.7 | 3.8 |
| Example 1-6 | R-6 | Polymer 6 (100) | PAG-4(14) | Q-1(5) | — | PF636 (0.08) | PGMEA (4400) | GBL (1100) | | 130 | 165 | 15 | 3.8 |
| Example 1-7 | R-7 | Polymer 7 (100) | PAG-4(14) | Q-1(5) | — | PF636 (0.08) | PGMEA (4400) | GBL (1100) | | 130 | 164 | 16.6 | 3.4 |
| Example 1-8 | R-8 | Polymer 8 (100) | PAG-5(14) | Q-1(5) | — | PF636 (0.08) | PGMEA (4400) | GBL (1100) | | 130 | 153 | 14.9 | 3.4 |
| Example 1-9 | R-9 | Polymer 9 (100) | PAG-5(14) | Q-1(5) | — | PF636 (0.08) | PGMEA (4400) | GBL (1100) | | 130 | 157 | 15.5 | 3.8 |
| Example 1-10 | R-10 | Polymer 10 (100) | PAG-5(14) | Q-2(5) | — | PF636 (0.08) | PGMEA (4400) | GBL (1100) | | 130 | 155 | 18.2 | 3.7 |
| Example 1-11 | R-11 | Polymer 11 (100) | PAG-6(14) | Q-2(5) | — | PF636 (0.08) | PGMEA (4400) | GBL (1100) | | 130 | 150 | 18.6 | 3.4 |
| Example 1-12 | R-12 | Polymer 11 (100) | PAG-6(14) | Q-2(5) | TMGU (4) | PF636 (0.08) | PGMEA (4400) | GBL (1100) | | 130 | 156 | 20.2 | 3.3 |
| Example 1-13 | R-13 | Polymer 11 (100) | PAG-7(14) | Q-3(6) | — | PF636 (0.08) | PGMEA (4400) | GBL (1100) | | 130 | 149 | 16.5 | 3.4 |
| Example 1-14 | R-14 | Polymer 12 (100) | PAG-7(14) | Q-3(6) | — | PF636 (0.08) | PGMEA (4400) | GBL (1100) | | 130 | 147 | 17.1 | 3.3 |
| Example 1-15 | R-15 | Polymer 13 (100) | PAG-8(14) | Q-3(5) | — | PF636 (0.08) | PGMEA (4400) | GBL (1100) | | 130 | 149 | 16.4 | 3.4 |
| Example 1-16 | R-16 | Polymer 13 (100) | PAG-8(14) | Q-3(5) | TMGU (4) | PF636 (0.08) | PGMEA (4400) | GBL (1100) | | 130 | 144 | 17.4 | 3.2 |
| Example 1-17 | R-17 | Polymer 14 (100) | PAG-9(14) | Q-3(5) | — | PF636 (0.08) | PGMEA (4400) | GBL (1100) | | 130 | 142 | 16.1 | 3.4 |
| Comparative Example 1-1 | R-18 | Polymer 1 (100) | Comparative PAG-1(14) | Q-1(5) | — | PF636 (0.08) | PGMEA (4400) | GBL (1100) | | 130 | 225 | 9.1 | 4.4 |
| Comparative Example 1-2 | R-19 | Comparative Polymer 21 (100) | PAG-1(14) | Q-2(5) | — | PF636 (0.08) | PGMEA (4400) | GBL (1100) | | 130 | 203 | 8.3 | 4.5 |
| Comparative Example 1-3 | R-20 | Comparative Polymer 22 (100) | Comparative PAG-2(14) | Q-1(5) | — | PF636 (0.08) | PGMEA (4400) | GBL (1100) | | 130 | 221 | 8.1 | 4.7 |

The results shown in Table 3 revealed that the inventive resist compositions (resist materials) containing the specific base polymer and the sulfonium salt or iodonium salt of iodinated benzoyloxy group-containing fluorinated sulfonic acid as an acid generator have high sensitivity and favorable EL and CDU.

[EUV Exposure Evaluation]

Examples 2-1 to 2-18, Comparative Examples 2-1 to 2-5

A Si substrate with a silicon-containing spin-on hard mask SHB-A940 (silicon content: 43 mass %) formed to have a film thickness of 20 nm was spin-coated with a resist material shown in Table 4, and prebaked using a hot plate at 105° C. for 60 seconds to prepare a resist film having a film thickness of 50 nm. The resultant was exposed using an EUV scanner NXE3300 (manufactured by ASML, NA: 0.33, sigma: 0.9/0.5, quadrupole illumination), followed by PEB on a hot plate at a temperature shown in Table 4 for 60 seconds, and development with a 2.38 mass % TMAH aqueous solution for 30 seconds to form a negative resist pattern. Consequently, the unexposed portion was dissolved in a developer, and an LS pattern having a space width of 23 nm and a pitch of 46 nm was obtained. The resist patterns obtained in this manner were evaluated as follows. Table 4 shows the results.

[Sensitivity Evaluation]

The LS patterns were observed with an electron microscope, and an optimum exposure dose $E_{op}$ (mJ/cm$^2$) was determined at which an LS pattern with a space width of 23 nm and a pitch of 46 nm was obtained.

[LWR Evaluation]

Using CD-SEM (CG-5000) manufactured by Hitachi High-Technologies Corporation, the size of the LS pattern obtained by the irradiation at the optimum exposure dose was measured at ten positions in a longitudinal direction of the space width. Based on this result, the triple value (3σ) of the standard deviation (σ) was determined as LWR. The smaller the value, the smaller the roughness and the more uniform the space width of the obtained pattern.

[Profile Evaluation]

The pattern profiles at the optimum exposure doses were compared, and the property was judged according to the following criteria.

good: pattern having a rectangular shape with side walls extending quite vertically.

poor: pattern having a tapered shape with side walls inclining greatly or with rounded top due to top loss.

TABLE 4

| | Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Sensitivity (mJ/cm$^2$) | LWR (nm) | Profile |
|---|---|---|---|---|---|---|---|---|---|---|---|---|---|
| Example 2-1 | R-21 | Polymer 10 (100) | PAG-5(26) | Q-1(6) | — | PF636 (0.08) | PGMEA (4400) | DAA (1100) | 130 | 24 | 4.4 | good |
| Example 2-2 | R-22 | Polymer 11 (100) | PAG-6(26) | Q-1(6) | — | PF636 (0.08) | PGMEA (4400) | DAA (1100) | 130 | 27 | 4.3 | good |
| Example 2-3 | R-23 | Polymer 11 (100) | PAG-6(26) | Q-1(7) | — | PF636 (0.08) | PGMEA (4400) | DAA (1100) | 130 | 23 | 3.9 | good |
| Example 2-4 | R-24 | Polymer 12 (100) | PAG-7(26) | Q-1(6) | — | PF636 (0.08) | PGMEA (4400) | DAA (1100) | 130 | 28 | 4.3 | good |
| Example 2-5 | R-25 | Polymer 12 (100) | PAG-7(26) | Q-1(6) | TMGU (4) | PF636 (0.08) | PGMEA (4400) | DAA (1100) | 130 | 26 | 4.0 | good |
| Example 2-6 | R-26 | Polymer 13 (100) | PAG-8(26) | Q-1(6) | — | PF636 (0.08) | PGMEA (4400) | DAA (1100) | 130 | 24 | 4.5 | good |
| Example 2-7 | R-27 | Polymer 14 (100) | PAG-9(26) | Q-1(6) | — | PF636 (0.08) | PGMEA (4400) | DAA (1100) | 130 | 28 | 4.3 | good |
| Example 2-8 | R-28 | Polymer 15 (100) | PAG-10(26) | Q-1(6) | — | PF636 (0.08) | PGMEA (4400) | DAA (1100) | 130 | 23 | 4.2 | good |
| Example 2-9 | R-29 | Polymer 16 (100) | PAG-11(26) | Q-1(6) | — | PF636 (0.08) | PGMEA (4400) | DAA (1100) | 130 | 26 | 4.4 | good |
| Example 2-10 | R-30 | Polymer 17 (100) | PAG-12(26) | Q-2(6) | — | PF636 (0.08) | PGMEA (4400) | DAA (1100) | 130 | 25 | 4.5 | good |
| Example 2-11 | R-31 | Polymer 18 (100) | PAG-13(26) | Q-2(6) | — | PF636 (0.08) | PGMEA (4400) | DAA (1100) | 130 | 27 | 4.2 | good |
| Example 2-12 | R-32 | Polymer 18 (100) | PAG-13(26) | Q-2(6) | TMGU (4) | PF636 (0.08) | PGMEA (4400) | DAA (1100) | 130 | 24 | 4.0 | good |
| Example 2-13 | R-33 | Polymer 19 (100) | PAG-14(26) | Q-2(6) | — | PF636 (0.08) | PGMEA (4400) | DAA (1100) | 130 | 29 | 4.3 | good |
| Example 2-14 | R-34 | Polymer 19 (100) | PAG-15(26) | Q-3(6) | — | PF636 (0.08) | PGMEA (4400) | DAA (1100) | 130 | 25 | 3.9 | good |
| Example 2-15 | R-35 | Polymer 20 (100) | PAG-16(26) | Q-3(6) | — | PF636 (0.08) | PGMEA (4400) | DAA (1100) | 130 | 23 | 3.7 | good |
| Example 2-16 | R-36 | Polymer 20 (100) | PAG-17(26) | Q-3(6) | — | PF636 (0.08) | PGMEA (4400) | DAA (1100) | 130 | 24 | 3.9 | good |
| Example 2-17 | R-37 | Polymer 20 (100) | PAG-6(13) PAG-16(13) | Q-3(6) | — | PF636 (0.08) | PGMEA (4400) | DAA (1100) | 130 | 21 | 3.6 | good |
| Example 2-18 | R-38 | Polymer 20 (100) | PAG-7(13) PAG-17(13) | Q-3(6) | — | PF636 (0.08) | PGMEA (4400) | DAA (1100) | 130 | 23 | 3.7 | good |
| Comparative Example 2-1 | R-39 | Polymer 20 (100) | Comparative PAG-3(26) | Q-2(6) | — | PF636 (0.08) | PGMEA (4400) | DAA (1100) | 130 | 37 | 5.1 | poor |

TABLE 4-continued

| | Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Sensitivity (mJ/cm$^2$) | LWR (nm) | Profile |
|---|---|---|---|---|---|---|---|---|---|---|---|---|---|
| Comparative Example 2-2 | R-40 | Polymer 18 (100) | Comparative PAG-4(26) | Q-2(6) | — | PF636 (0.08) | PGMEA (4400) | DAA (1100) | | 130 | 34 | 5.2 | poor |
| Comparative Example 2-3 | R-41 | Comparative Polymer 23 (100) | PAG-16(26) | Q-2(6) | — | PF636 (0.08) | PGMEA (4400) | DAA (1100) | | 130 | — | — | poor |
| Comparative Example 2-4 | R-42 | Comparative Polymer 24 (100) | PAG-16(26) | Q-2(6) | — | PF636 (0.08) | PGMEA (4400) | DAA (1100) | | 130 | 33 | 5.8 | poor |
| Comparative Example 2-5 | R-43 | Comparative Polymer 24 (100) | Comparative PAG-4(26) | Q-2(6) | — | PF636 (0.08) | PGMEA (4400) | DAA (1100) | | 130 | 32 | 5.4 | poor |

The results shown in Table 4 revealed that the inventive resist compositions (resist materials) containing (A) the sulfonium salt or iodonium salt of iodinated benzoyloxy group-containing fluorinated sulfonic acid as an acid generator and (B) the specific base polymer have high sensitivity and favorable LWR. Moreover, it was revealed that even when the onium salt shown by the formula (A-1) and the onium salt shown by the formula (A-2) were used in combination as in Examples 2-17 and 2-18, the sensitivity was high and the LWR was favorable. Thus, the present invention had favorable profiles. Meanwhile, the resist compositions of Comparative Examples not having both of the component (A) (acid generator) and the component (B) (base polymer) according to the present invention were found to have poor profiles due to top loss. Particularly, in Comparative Example 2-3, the pattern profile was significantly degraded, and it was impossible to measure the sensitivity and LWR. Moreover, in Comparative Example 2-1 using the acid generator (Comparative PAG-3) containing no iodinated benzoyloxy group, poor profile was found. This suggests that the pattern profile is not improved by merely having iodine at the anion moiety (fluorinated sulfonic acid) of the component (A), and that it is essential for the onium salt to have the structure shown by the formula (A-1) or the formula (A-2).

[Film Remaining Evaluation at Exposed Portion]

Examples 3-1 to 3-7, Comparative Examples 3-1 to 3-3

A Si substrate with a silicon-containing spin-on hard mask SHB-A940 (silicon content: 43 mass %) formed to have a film thickness of 20 nm was spin-coated with a resist material shown in Table 5, and prebaked using a hot plate at 105° C. for 60 seconds to prepare a resist film having a film thickness of 50 nm. The resultant was exposed using a KrF scanner S206D (manufactured by Nikon Corporation, NA: 0.82, Conventional illumination), while the exposure dose was changed. The film was subjected to PEB on a hot plate at a temperature shown in Table 5 for 60 seconds, and development with a 2.38 mass % TMAH aqueous solution for 30 seconds. At the positions exposed with various exposure doses, the film thicknesses were measured with a film thickness measurement system RE-3100 manufactured by SCREEN Semiconductor Solutions Co., Ltd. Ratios relative to the film thickness after the resist coating were calculated according to the following equation, and defined as film remaining percentages. FIG. 1 shows a graph plotted such that the horizontal axis represents the exposure doses and the vertical axis represents the film remaining percentages. Since the present invention is an alkali-negative resist composition, the higher the exposure dose, the higher the film remaining percentage of the resist as shown in FIG. 1. The film remaining percentage eventually reaches a plateau, and Table 5 shows that the film remaining percentage at the plateau is indicated as plateaued film remaining percentage (i.e., value A in FIG. 1). A larger value of the plateaued film remaining percentage means that the solubility of the exposed portion into an alkaline developer is suppressed and excellent.

Film remaining percentage (%)={Film thickness at each exposure dose (nm)/Film thickness immediately after coating (50 nm)}×100

TABLE 5

| | Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Plateaued film remaining percentage (%) |
|---|---|---|---|---|---|---|---|---|---|---|---|
| Example 3-1 | R-44 | Polymer 2 (100) | PAG-1(26) | Q-1(6) | — | PF636 (0.08) | PGMEA (4400) | DAA (1100) | | 130 | 83 |
| Example 3-2 | R-45 | Polymer 2 (100) | PAG-1(26) | Q-2(6) | — | PF636 (0.08) | PGMEA (4400) | DAA (1100) | | 130 | 81 |
| Example 3-3 | R-46 | Polymer 2 (100) | PAG-1(26) | Q-3(6) | — | PF636 (0.08) | PGMEA (4400) | DAA (1100) | | 130 | 84 |

TABLE 5-continued

| Resist material | Polymer (parts by mass) | Acid generator (parts by mass) | Quencher (parts by mass) | Cross-linker (parts by mass) | Surfactant (parts by mass) | Organic solvent (parts by mass) | | | PEB (° C.) | Plateaued film remaining percentage (%) |
|---|---|---|---|---|---|---|---|---|---|---|
| Example 3-4 | R-47 | Polymer 2 (100) | PAG-6(26) | Q-1(6) | — | PF636 (0.08) | PGMEA (4400) | DAA (1100) | | 130 | 85 |
| Example 3-5 | R-48 | Polymer 2 (100) | PAG-9(26) | Q-1(6) | — | PF636 (0.08) | PGMEA (4400) | DAA (1100) | | 130 | 85 |
| Example 3-6 | R-49 | Polymer 2 (100) | PAG-13(26) | Q-1(6) | — | PF636 (0.08) | PGMEA (4400) | DAA (1100) | | 130 | 90 |
| Example 3-7 | R-50 | Polymer 2 (100) | PAG-1(13) PAG-16(26) | Q-2(6) | — | PF636 (0.08) | PGMEA (4400) | DAA (1100) | | 130 | 84 |
| Comparative Example 3-1 | R-51 | Polymer 2 (100) | Comparative PAG-1(26) | Q-1(6) | — | PF636 (0.08) | PGMEA (4400) | DAA (1100) | | 130 | 71 |
| Comparative Example 3-2 | R-52 | Polymer 2 (100) | Comparative PAG-2(26) | Q-1(6) | — | PF636 (0.08) | PGMEA (4400) | DAA (1100) | | 130 | 73 |
| Comparative Example 3-3 | R-53 | Comparative Polymer 23 (100) | PAG-1(26) | Q-1(6) | — | PF636 (0.08) | PGMEA (4400) | DAA (1100) | | 130 | 63 |

The result in Table 5 shows that the plateaued film remaining percentage of the inventive resist compositions (resist materials) containing (A) the sulfonium salt or iodonium salt of iodinated benzoyloxy group-containing fluorinated sulfonic acid as an acid generator and (B) the specific base polymer is high and favorable. Moreover, it is shown that even when the onium salt shown by the formula (A-1) and the onium salt shown by the formula (A-2) are used in combination as in Example 3-7, the plateaued film remaining percentage is high and favorable. In contrast, the resist compositions of Comparative Examples not having both of the component (A) and the component (B) according to the present invention had low plateaued film remaining percentages.

Tables 3, 4 revealed that the inventive negative type compositions are excellent in sensitivity, LWR, CDU, and pattern profile in the EB and EUV lithographies. Further, Table 5 revealed that the inventive negative type compositions are excellent in plateaued film remaining percentage in the KrF lithography, that is, the solubility of the exposed portion to an alkaline developer is suppressed. Both of (A) the sulfonium salt or iodonium salt of iodinated benzoyloxy group-containing fluorinated sulfonic acid and (B) the specific base polymer have to be incorporated in the inventive resist composition, and apparently the performance improvements are not demonstrated by incorporating only one of (A) and (B).

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A chemically-amplified negative resist composition comprising:
(A) an acid generator containing an onium salt(s) shown by the following formula(e) (A-1) and/or (A-2); and
(B) a base polymer containing repeating units shown by the following formulae (B1) and (B2),

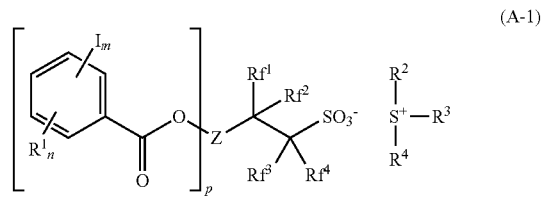

(A-1)

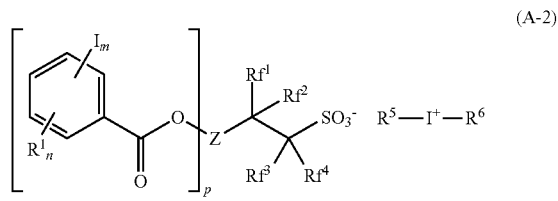

(A-2)

wherein $R^1$ represents a hydrogen atom, a fluorine atom, a chlorine atom, a bromine atom, a hydroxy group, an amino group, a linear, branched, or cyclic alkyl group having 1 to 20 carbon atoms optionally containing a fluorine atom, a chlorine atom, a bromine atom, a hydroxy group, an amino group, or an alkoxy group, an alkoxy group having 1 to 20 carbon atoms, an acyloxy group having 2 to 20 carbon atoms, $-NR^7-C(=O)-R^8$, or $-NR^7-C(=O)-O-R^8$; $R^7$ represents a hydrogen atom or a linear, branched, or cyclic alkyl group having 1 to 6 carbon atoms optionally containing a halogen atom, a hydroxy group, an alkoxy group, an acyl group, or an acyloxy group; $R^8$ represents a linear, branched, or cyclic alkyl group having 1 to 16 carbon atoms or alkenyl group having 2 to 16 carbon atoms, an aryl group having 6 to 12 carbon atoms, or an aralkyl group having 7 to 12 carbon atoms, and optionally contains a halogen atom, a hydroxy group, an alkoxy group, an acyl group, or an acyloxy group; Z represents a single bond or a divalent linking group having 1 to 20 carbon atoms when "p" is 1, or a trivalent or tetravalent linking group having 1 to 20 carbon atoms when "p" is 2 or 3, the linking groups optionally containing an oxygen atom, a sulfur atom, or a nitrogen atom; $Rf^1$ to $Rf^4$ each independently represent a hydrogen atom, a fluorine atom, or a trifluoromethyl group, at least one of $Rf^1$ to $Rf^4$ is a fluorine atom or a trifluoromethyl group, and $Rf^1$ and $Rf^2$ optionally bond with each other to form a carbonyl group; $R^2$, $R^3$, $R^4$, $R^5$ and $R^6$ each independently represent a linear, branched, or cyclic alkyl group or oxoalkyl group having 1 to 12 carbon atoms, a linear, branched, or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, and some or all of hydrogen atoms of these groups are optionally substituted with a hydroxy group, a carboxyl group, a halogen atom, a cyano group, an amide group, a nitro group, a sultone group, a sulfone group, or a sulfonium salt-containing group, and carbon atoms of these groups are optionally interposed by an ether group, an ester group, a carbonyl group, a carbonate group, or a sulfonic acid ester group; $R^2$ and $R^3$ optionally bond with each other to form a ring with a sulfur atom bonded to $R^2$ and $R^3$; "m" represents an integer of 1 to 5; "n" represents an integer of 0 to 3; and "p" represents an integer of 1 to 3,

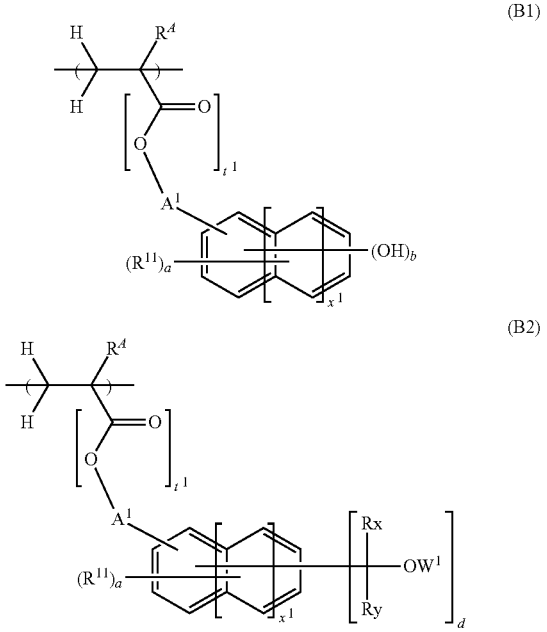

wherein $R^A$ represents a hydrogen atom, a fluorine atom, a methyl group, or a trifluoromethyl group; $R^{11}$ and $R^{12}$ each independently represent a halogen atom, an acyloxy group having 2 to 8 carbon atoms optionally halogen-substituted, an alkyl group having 1 to 6 carbon atoms optionally halogen-substituted, or an alkoxy group having 1 to 6 carbon atoms optionally halogen-substituted; $A^1$ represents a single bond or a linear, branched, or cyclic alkylene group having 1 to 10 carbon atoms and optionally having an ether bond interposed in a carbon-carbon bond; $W^1$ represents a hydrogen atom, a monovalent aromatic group optionally having a substituent, or an aliphatic monovalent hydrocarbon group having 1 to 10 carbon atoms optionally having an ether bond, a carbonyl group, or a carbonyloxy group interposed in a carbon-carbon bond; Rx and Ry each independently represent a hydrogen atom, an alkyl group having 1 to 15 carbon atoms optionally substituted with a hydroxy group or an alkoxy group, or a monovalent aromatic group optionally having a substituent, given that not both of Rx and Ry are hydrogen atoms simultaneously, and Rx and Ry optionally bond with each other to form a ring with a carbon atom bonded to Rx and Ry; $t^1$ represents 0 or 1; $x^1$ represents an integer of 0 to 2; "a" represents an integer satisfying $0 \leq a \leq 5+2x^1-b$; "c" represents an integer satisfying $0 \leq c \leq 5+2x^1-d$; and "b" and "d" each represent an integer of 1 to 3.

2. The chemically-amplified negative resist composition according to claim 1, wherein the base polymer further contains at least one repeating unit selected from a repeating unit shown by the following formula (B3) and a repeating unit shown by the following formula (B4):

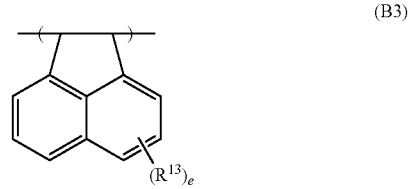

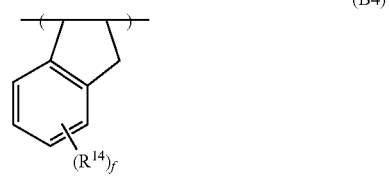

wherein $R^{13}$ and $R^{14}$ each independently represent a hydroxy group, a halogen atom, an acetoxy group, an alkyl group having 1 to 8 carbon atoms optionally halogen-substituted, a primary alkoxy group having 1 to 8 carbon atoms optionally halogen-substituted, a secondary alkoxy group having 2 to 8 carbon atoms, an acyloxy group having 2 to 8 carbon atoms optionally halogen-substituted, or an alkylcarbonyloxy group having 2 to 8 carbon atoms optionally halogen-substituted; and "e" and "f" each independently represent an integer of 0 to 4.

3. The chemically-amplified negative resist composition according to claim 2, wherein the base polymer contains a repeating unit shown by the following formula (B5) and a repeating unit shown by the following formula (B6):

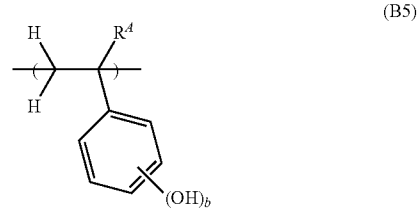

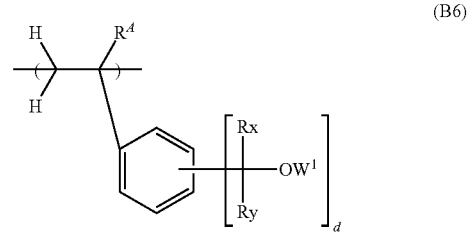

wherein $R^A$, Rx, Ry, $W^1$, "b", and "d" are as defined above. a crosslinking agent.

4. The chemically-amplified negative resist composition according to claim 3, further comprising (C) a crosslinking agent.

5. A resist patterning process using the chemically-amplified negative resist composition according to claim 4, comprising steps of:
- forming a resist film by using the chemically-amplified negative resist composition on a substrate to be processed;
- irradiating the resist film with a high energy beam to form a pattern; and
- developing the resist film by using an alkaline developer.

6. A resist patterning process using the chemically-amplified negative resist composition according to claim 3, comprising steps of:
- forming a resist film by using the chemically-amplified negative resist composition on a substrate to be processed;
- irradiating the resist film with a high energy beam to form a pattern; and
- developing the resist film by using an alkaline developer.

7. The chemically-amplified negative resist composition according to claim 2, further comprising (C) a crosslinking agent.

8. A resist patterning process using the chemically-amplified negative resist composition according to claim 7, comprising steps of:
- forming a resist film by using the chemically-amplified negative resist composition on a substrate to be processed;
- irradiating the resist film with a high energy beam to form a pattern; and
- developing the resist film by using an alkaline developer.

9. A resist patterning process using the chemically-amplified negative resist composition according to claim 2, comprising steps of:
- forming a resist film by using the chemically-amplified negative resist composition on a substrate to be processed;
- irradiating the resist film with a high energy beam to form a pattern; and
- developing the resist film by using an alkaline developer.

10. The resist patterning process according to claim 9, wherein the high energy beam is an electron beam or an extreme ultraviolet ray with a wavelength of 3 to 15 nm.

11. The chemically-amplified negative resist composition according to claim 1, wherein the base polymer contains a repeating unit shown by the following formula (B5) and a repeating unit shown by the following formula (B6):

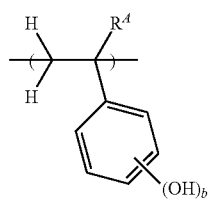
(B5)

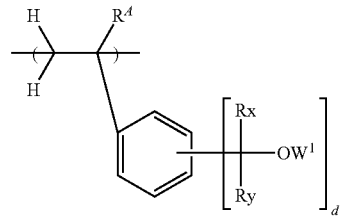
(B6)

wherein $R^A$, Rx, Ry, $W^1$, "b", and "d" are as defined above.

12. The chemically-amplified negative resist composition according to claim 11, further comprising (C) a crosslinking agent.

13. A resist patterning process using the chemically-amplified negative resist composition according to claim 12, comprising steps of:
- forming a resist film by using the chemically-amplified negative resist composition on a substrate to be processed;
- irradiating the resist film with a high energy beam to form a pattern; and
- developing the resist film by using an alkaline developer.

14. A resist patterning process using the chemically-amplified negative resist composition according to claim 11, comprising steps of:
- forming a resist film by using the chemically-amplified negative resist composition on a substrate to be processed;
- irradiating the resist film with a high energy beam to form a pattern; and
- developing the resist film by using an alkaline developer.

15. The resist patterning process according to claim 14, wherein the high energy beam is an electron beam or an extreme ultraviolet ray with a wavelength of 3 to 15 nm.

16. The chemically-amplified negative resist composition according to claim 1, further comprising (C) a crosslinking agent.

17. A resist patterning process using the chemically-amplified negative resist composition according to claim 16, comprising steps of:
- forming a resist film by using the chemically-amplified negative resist composition on a substrate to be processed;
- irradiating the resist film with a high energy beam to form a pattern; and
- developing the resist film by using an alkaline developer.

18. The resist patterning process according to claim 17, wherein the high energy beam is an electron beam or an extreme ultraviolet ray with a wavelength of 3 to 15 nm.

19. A resist patterning process using the chemically-amplified negative resist composition according to claim 1, comprising steps of:
- forming a resist film by using the chemically-amplified negative resist composition on a substrate to be processed;
- irradiating the resist film with a high energy beam to form a pattern; and
- developing the resist film by using an alkaline developer.

20. The resist patterning process according to claim 19, wherein the high energy beam is an electron beam or an extreme ultraviolet ray with a wavelength of 3 to 15 nm.

* * * * *